United States Patent
Ryu et al.

(10) Patent No.: US 7,190,000 B2
(45) Date of Patent: Mar. 13, 2007

(54) THIN FILM TRANSISTOR ARRAY PANEL AND MANUFACTURING METHOD THEREOF

(75) Inventors: Hye-Young Ryu, Seoul (KR); Young-Hoon Yoo, Suwon-si (KR); Jang-Soo Kim, Suwon-si (KR); Sung-Man Kim, Seoul (KR); Kyung-Wook Kim, Seoul (KR); Hyang-Shik Kong, Suwon-si (KR); Young-Goo Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 139 days.

(21) Appl. No.: 10/915,958

(22) Filed: Aug. 11, 2004

(65) Prior Publication Data
US 2005/0110019 A1 May 26, 2005

(30) Foreign Application Priority Data
Aug. 11, 2003 (KR) .................. 10-2003-0055419
Aug. 11, 2003 (KR) .................. 10-2003-0055420

(51) Int. Cl.
H01L 29/04 (2006.01)
(52) U.S. Cl. .................................................... 257/72
(58) Field of Classification Search .................. 257/72, 257/59, 359, 343
See application file for complete search history.

(56) References Cited

U.S. PATENT DOCUMENTS

| | | | | |
|---|---|---|---|---|
| 6,710,372 | B2* | 3/2004 | Kim ............................ | 257/72 |
| 6,778,232 | B2* | 8/2004 | Nakata et al. ............... | 349/43 |
| 2003/0197181 | A1* | 10/2003 | Yun ............................ | 257/72 |
| 2004/0036073 | A1* | 2/2004 | Hong et al. .................. | 257/72 |
| 2005/0092999 | A1* | 5/2005 | Fujikawa et al. ............. | 257/72 |

* cited by examiner

*Primary Examiner*—Nathan W. Ha

(74) *Attorney, Agent, or Firm*—F. Chau & Associates, LLC

(57) ABSTRACT

A thin film transistor array panel is provided, which includes: a gate line, a gate insulating layer, and a semiconductor layer sequentially formed on a substrate; a data line and a drain electrode formed at least on the semiconductor layer; a first passivation layer formed on the data line and the drain electrode and having a first contact hole exposing the drain electrode at least in part; a second passivation layer formed on the first passivation layer and having a second contact hole that is disposed on the first contact hole and has a first bottom edge placed outside the first contact hole and a second bottom edge placed inside the first contact hole; and a pixel electrode formed on the second passivation layer and connected to the drain electrode through the first and the second contact holes.

28 Claims, 59 Drawing Sheets

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a manufacturing method thereof.

(b) Description of the Related Art

Liquid crystal displays (LCDs) are one of the most widely used flat panel displays. An LCD includes two panels provided with field-generating electrodes and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

Among LCDs including field-generating electrodes on respective panels, a kind of LCDs provides a plurality of pixel electrodes arranged in a matrix at one panel and a common electrode covering an entire surface of the other panel. The image display of the LCD is accomplished by applying individual voltages to the respective pixel electrodes. For the application of the individual voltages, a plurality of three-terminal thin film transistors (TFTs) are connected to the respective pixel electrodes, and a plurality of gate lines transmitting signals for controlling the TFTs and a plurality of data lines transmitting voltages to be applied to the pixel electrodes are provided on the panel.

The panel for an LCD has a layered structure including several conductive layers and several insulating layers. The gate lines, the data lines, and the pixel electrodes are made from different conductive layers (referred to as "gate conductor," "data conductor," and "pixel conductor" hereinafter) preferably deposited in sequence and separated by insulating layers. A TFT includes three electrodes: a gate electrode made from the gate conductor and source and drain electrodes made from the data conductor. The source electrode and the drain electrode are connected by a semiconductor usually located thereunder, and the drain electrode is connected to the pixel electrode through a hole in an insulating layer.

In order to increase the aperture ratio, the pixel electrodes overlap adjacent signal lines such as the gate lines and the data lines and the parasitic capacitance between the pixel electrodes and the signal lines can be reduced by interposing a low dielectric organic insulator therebetween. The organic insulator is usually used along an inorganic insulator provided thereunder and the insulators have contact holes for connection between the drain electrodes and the pixel electrodes. The contact holes may have undercuts that the lower inorganic insulator is over-etched to the edges of the lower insulator is disposed under the upper insulator.

In the meantime, storage electrode lines are provided on the TFT array panel for forming storage capacitors along with the pixel electrodes. Although the storage capacitor can be increased by increasing overlapping area of the pixel electrodes and the storage electrode lines, it may decrease the aperture ratio.

SUMMARY OF THE INVENTION

A thin film transistor array panel is provided, which includes: a gate line formed on a substrate; a gate insulating layer formed on the gate line; a semiconductor layer formed on the gate insulating layer; a data line formed at least on the semiconductor layer; a drain electrode formed at least on the semiconductor layer and spaced apart from the data line; a first passivation layer formed on the data line and the drain electrode and having a first contact hole exposing the drain electrode at least in part; a second passivation layer formed on the first passivation layer and having a second contact hole that is disposed on the first contact hole and has a first bottom edge placed outside the first contact hole and a second bottom edge placed inside the first contact hole; and a pixel electrode formed on the second passivation layer and connected to the drain electrode through the first and the second contact holes.

The second contact hole may have an inclined sidewall to have top edges wider than the bottom edges and the second passivation layer may include organic material.

The drain electrode may include an expansion and a connection connected to the expansion, and the second bottom edge of the second contact hole is disposed opposite the connection.

The thin film transistor array panel may further include a storage electrode line overlapping the drain electrode. The storage electrode line may include an expansion overlapping the expansion of the drain electrode. The storage electrode line extends in a direction crossing the first bottom edge of the second contact hole.

The second contact hole may further have a third bottom edge placed inside the first contact hole. The second and the third bottom edges are located adjacent to each other or opposite each other. The second contact hole may further have a fourth bottom edge placed inside the first contact hole.

The second contact hole may have a rounded or chamfered corner.

The semiconductor layer may have substantially the same planar shape as the data line and the drain electrode except for a portion disposed between the data line and the drain electrode.

The thin film transistor array panel may further include a color filter disposed between the first passivation layer and the second passivation layer.

The color filter may have no portion of the second contact hole.

A thin film transistor array panel is provided, which includes: a gate line formed on a substrate; a gate insulating layer formed on the gate line; a semiconductor layer formed on the gate insulating layer; a data line formed at least on the semiconductor layer; a drain electrode formed at least on the semiconductor layer and spaced apart from the data line; a first passivation layer formed on the data line and the drain electrode and having a first contact hole exposing the drain electrode at least in part; a second passivation layer formed on the first passivation layer and having a second contact hole that is disposed on the first contact hole and has a first sidewall having a first slope and a second sidewall having a second slope slop steeper than the first slope; and a pixel electrode formed on the second passivation layer and connected to the drain electrode through the first and the second contact holes.

The second passivation layer may include organic material.

The drain electrode may include an expansion and a connection connected to the expansion, and the second sidewall of the second contact hole is disposed opposite the connection.

The first passivation layer may be undercut at the second sidewall of the second contact hole.

A thin film transistor array panel is provided, which includes: a gate line formed on a substrate; a gate insulating layer formed on the gate line; a semiconductor layer formed on the gate insulating layer; a data line formed at least on the semiconductor layer; a drain electrode formed at least on the semiconductor layer and spaced apart from the data line; a first passivation layer formed on the data line and the drain electrode and having a first contact hole exposing the drain electrode at least in part; a second passivation layer formed on the first passivation layer and having a second contact hole that is disposed on the first contact hole and has a first sidewall having a stepped profile and a second sidewall having an undercut; and a pixel electrode formed on the second passivation layer and connected to the drain electrode through the first and the second contact holes.

A method of manufacturing a thin film transistor array panel is provided, which includes: forming a gate line, a data line, and a thin film transistor on a substrate; depositing first and second passivation layers in sequence; patterning the second passivation layer using a photo mask having a light transmitting area, a light blocking area, and a slit area disposed partly surrounding the light transmitting area; patterning the first passivation layer; and forming a pixel electrode on the passivation layer.

The slit area may include first and second slits extending parallel to each other and the first slit is longer and closer to the light transmitting area than the second slit.

The thin film transistor may include a gate electrode connected to the gate lines, a source electrode connected to the data line, and a drain electrode connected to the pixel electrode, and the light transmitting area corresponds to a portion of the drain electrode.

The method may further include: forming a storage electrode line on the substrate, the storage electrode line overlapping the drain electrode.

A thin film transistor array panel is provided, which includes: a gate line formed on a substrate; a storage electrode formed on the substrate; a gate insulating layer including a first portion disposed on the gate line and a second portion formed on the storage electrode and having a thickness smaller than the first portion; a semiconductor layer formed on the gate insulating layer; a data line formed at least on the semiconductor layer; a drain electrode formed at least on the semiconductor layer and spaced apart from the data line; first and second passivation layers sequentially formed on the data line and the drain electrode; and a pixel electrode formed on the second passivation layer, connected to the drain electrode, and overlapping the storage electrode.

The drain electrode may overlap the storage electrode and may include an expansion overlapping the storage electrode.

The first and the second passivation layers may have a contact hole exposing the drain electrode and the pixel electrode may be connected to the drain electrode through the contact hole.

The contact hole may have a stepped sidewall.

The drain electrode may overlap the storage electrode and the contact hole may be disposed on the storage electrode.

The drain electrode may have an opening exposing the second portion of the gate insulating layer and the pixel electrode may contact the second portion of the gate insulating layer through the opening.

The first passivation layer may include inorganic insulator and the second passivation layer may include organic insulator.

A method of manufacturing a thin film transistor array panel is provided, which includes: forming a gate line and a storage electrode on a substrate; depositing a gate insulating layer on the gate line and the storage electrode; depositing a semiconductor layer on the gate insulating layer; patterning the semiconductor layer and the gate insulating layer using a photo mask including a slit area such that the gate insulating layer includes a first portion disposed on the gate line and a second portion disposed on the storage electrode and having a thickness smaller than the first portion; depositing first and second passivation layers in sequence; patterning the second and the first passivation layers to form a contact hole exposing at least a portion of the drain electrode; and forming a pixel electrode on the passivation layer, the pixel electrode connected to the drain electrode through the contact hole.

The photo mask may further include a light blocking area and a light transmitting area, and the patterning of the semiconductor layer and the gate insulating layer etches out a first portion of the semiconductor layer corresponding to the slit area and a second portion of the semiconductor layer corresponding to the light transmitting area and partly etches out a portion of the gate insulating layer corresponding to the light transmitting area.

A method of manufacturing a thin film transistor array panel is provided, which includes: forming a gate line and a storage electrode on a substrate; forming a gate insulating layer on the gate line and the storage electrode; forming a semiconductor layer on the gate insulating layer; forming a data line and a drain electrode having an opening exposing a portion of the gate insulating layer; depositing first and second passivation layers in sequence; patterning the second and the first passivation layers to form a first contact hole exposing at least the opening of the drain electrode; reducing a thickness of the exposed portion of the gate insulating layer through the opening; and forming a pixel electrode on the passivation layer, the pixel electrode connected to the drain electrode through the contact hole.

The patterning of the second and the first passivation layers and the reduction of the thickness may use a photo mask including a first slit area. The photo mask may further include a light blocking area, a light transmitting area, and a second slit area giving a light transmittance smaller than the first slit area. The first slit area may correspond to the opening of the drain electrode and the second slit area may correspond to the first contact hole except for the opening.

The method may further include: forming a second contact hole at the first and the second passivation layers and the gate insulating layer exposing a portion of the gate line, wherein the light transmitting area corresponds to the second contact hole.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
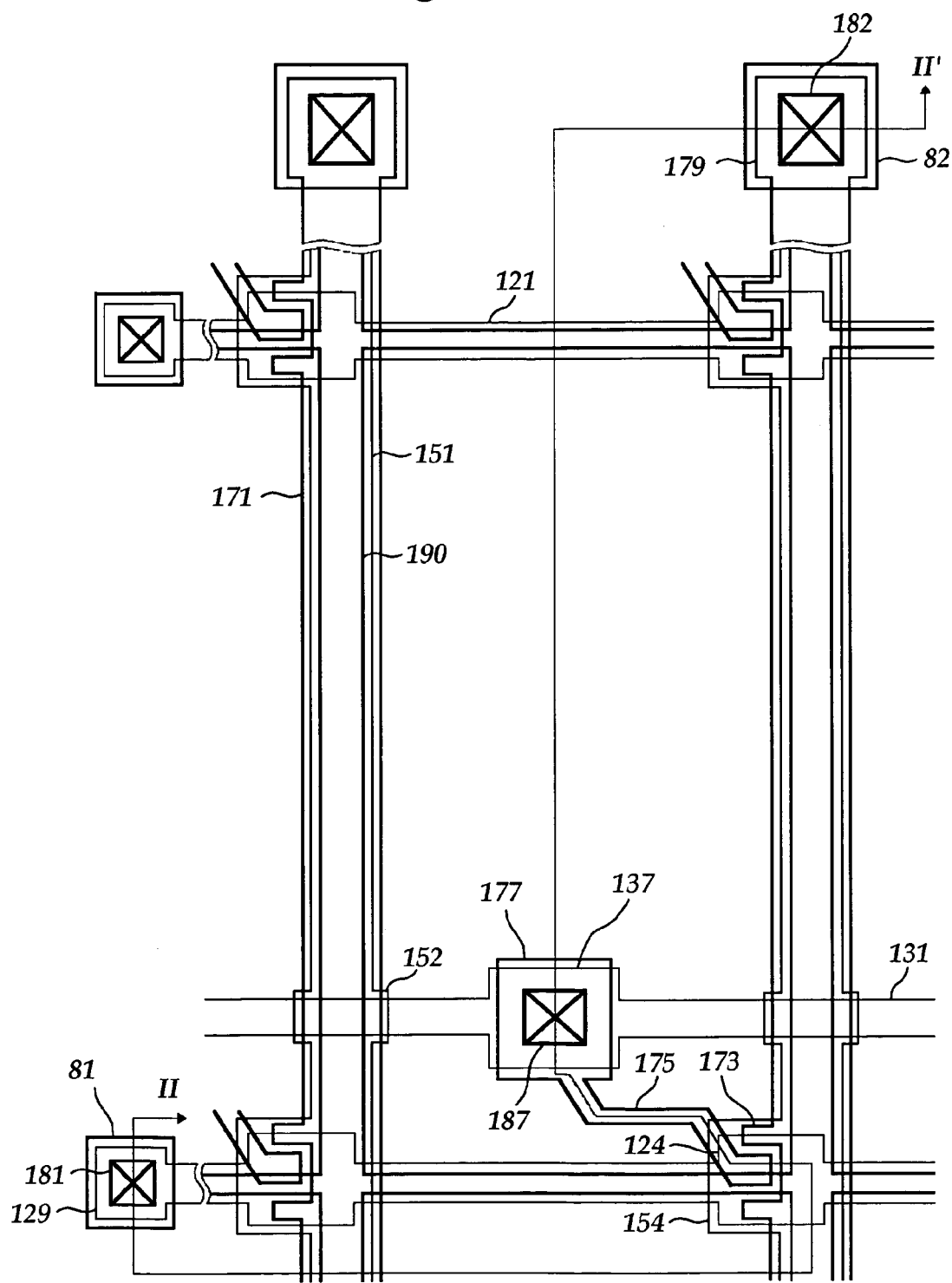
FIG. 1 is a layout view of a TFT array panel for an LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

Now, TFT array panels and manufacturing methods thereof according to embodiments of the present invention will be described with reference to the accompanying drawings.

A TFT array panel for an LCD will be described in detail with reference to FIGS. 1 and 2.

Figure 2:
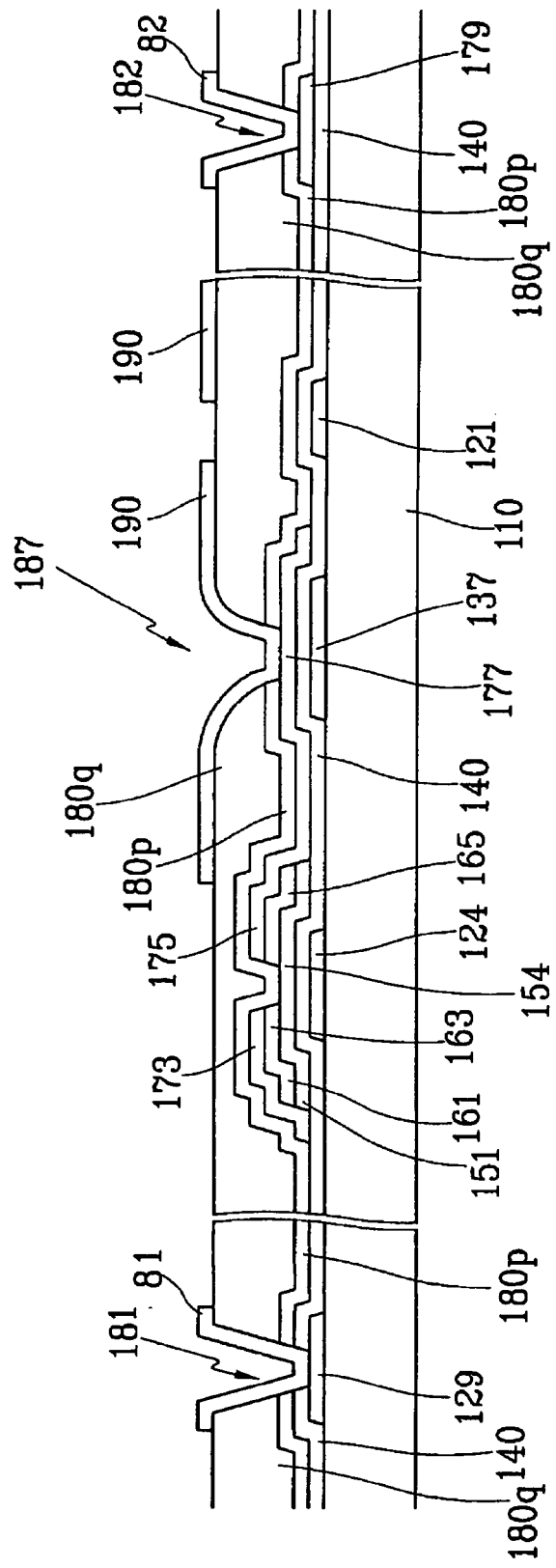
FIG. 2 is a sectional view of the TFT array panel shown in FIG. 1 taken along the line II–II'.

FIG. 1 is an exemplary layout view of a TFT array panel according to an embodiment of the present invention, and FIG. 2 is a sectional view of the TFT array panel shown in FIG. 1 taken along the lines II–II'.

A plurality of gate lines 121 and a plurality of storage electrode lines 131 are formed on an insulating substrate 110. The gate lines 121 and the storage electrode lines 131 are separated from each other and extend substantially in a transverse direction.

Each gate line 121 includes a plurality of portions projecting upward and downward to form a plurality of gate electrodes 124 and an expanded end portion 129 having a large area for contact with another layer or an external device.

Each storage electrode line 131 is supplied with a predetermined voltage such as a common voltage and it includes a plurality of expansions 137 protruding upward and downward.

The gate lines 121 and the storage electrode lines 131 may be made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. The gate lines 121 and the storage electrode lines 131 may have a multilayered structure including two films having different physical characteristics. One of the films is preferably made of low resistivity metal including Al containing metal for reducing signal delay or voltage drop in the gate lines 121, while the other film is preferably made of material such as Cr, Mo, Mo alloy such as MoW, Ta and Ti, which has good physical, chemical, and electrical contact characteristics with other materials such as indium tin oxide (ITO) and indium zinc oxide (IZO). Good examples of combination of the lower film material and the upper film material are a lower Cr film and an upper Al (or Al—Nd) film and a lower Al (or Al—Nd) film and an upper Mo film.

The lateral sides of the gate lines 121 are inclined relative to a surface of the substrate 110, and the inclination angle thereof ranges about 30–80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124 and a plurality of expansions 152 disposed on the storage electrode lines 131.

A plurality of ohmic contact stripes and islands 161 and 165 preferably made of silicide or n+hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range of about 30–80 degrees.

A plurality of data lines 171 and a plurality of drain electrodes 175 are formed on the ohmic contacts 161 and 165.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each drain electrode 175 includes one linear end portion disposed on a gate electrode 124 and partially enclosed by a source electrode 173 and the other expanded end portion 177 having a large area for contact with another layer and overlapping an expansion 137 of a storage electrode line 131. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 may be made of refractory metal such as Cr, Mo containing metal, Ti or Ta. However, they may also include a low resistivity film and a good contact film. Like the gate lines 121, the data lines 171 and the drain electrodes 175 have tapered lateral sides relative to the surface of the substrate 110, and the inclination angles thereof range about 30–80 degrees.

The ohmic contacts 161 and 165 are interposed only between the underlying semiconductor stripes 151 and the overlying data lines 171 and the overlying drain electrodes 175 thereon and reduce the contact resistance therebetween. Although the semiconductor stripes 151 are narrower than the data lines 171 at most places, the width of the semiconductor stripes 151 becomes large near the storage electrode lines 131 as described above, to smooth the profile of the surface, thereby preventing the disconnection of the data lines 171.

Lower and upper passivation layers 180$p$ and 180$q$ are sequentially formed on the data lines 171, the drain electrodes 175, and the exposed portions of the semiconductor stripes 151. The first passivation layer 180$p$ is relatively thin and preferably made of inorganic insulator such as silicon nitride, while the second passivation layer 180$q$ is relatively thick and preferably made of organic insulator. The first and the second passivation layers 180$p$ and 180$q$ have a plurality of contact holes 182 and 187 exposing the end portions 179 of the data lines 171 and the expanded end portions 177 of the drain electrodes 175, respectively. Furthermore, the first and the second passivation layers 180$p$ and 180$q$ and the gate insulating layer 140 have a plurality of contact holes 181 exposing the end portions 129 of the gate lines 121. The contact holes 181, 182 and 187 may have sidewalls making a smooth angle and in particular, the sidewalls of the contact holes 187 consisting of the second passivation 180$q$ make an angle of about 30–85 degrees with the surface of the substrate 110. The contact holes 181, 182 and 187 have a planar shape of rectangle, but they may have a shape of polygon or circle. Examples of detailed configurations of the contact holes 187 will be described later.

A plurality of pixel electrodes 190 and a plurality of contact assistants 81 and 82, which are preferably made of ITO or IZO, are formed on the passivation layer 180.

The pixel electrodes 190 are physically and electrically connected to the drain electrodes 175 through the contact holes 187 such that the pixel electrodes 190 receive the data voltages from the drain electrodes 175.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the storage electrode lines 131. The capacitances of the storage capacitors, i.e., the storage capacitances are increased by providing the expansions 137 at the storage electrode lines 137 for increasing overlapping areas and by extending the drain electrodes 175 to overlap the expansion 137 for decreasing the distance between the terminals of the storage capacitors. The storage capacitors may also be implemented by overlapping the pixel electrodes 190 and the gate lines 121 adjacent thereto (called "previous gate lines").

The pixel electrodes 190 overlap the gate lines 121 and the data lines 171 to increase aperture ratio.

The contact assistants 81/82 are connected to the exposed expansions 129/179 of the gate lines 121/ the data lines 171 through the contact holes 181/182. The contact assistants 81 and 82 protect the exposed portions 129 and 179 and complement the adhesion between the exposed portions 129 and 179 and external devices.

The pixel electrodes 190 may be made of ITO or transparent conductive polymer. For a reflective LCD, the pixel electrodes 190 are made of opaque reflective metal. In these cases, the contact assistants 81 and 82 may be made of material such as ITO or IZO different from the pixel electrodes 190.

An LCD according to an embodiment of the present invention include a TFT array panel shown in FIGS. 1 and 2, a common electrode panel (not shown), and a liquid crystal layer (not shown) interposed between the panels. Each panel may have an alignment layer (not shown) coated thereon.

Now, examples of detailed configurations of the contact holes 187 shown in FIGS. 1 and 2 will be described with reference to FIGS. 3A–3C, 4A–4C, 5A–5C, 6A–6C, and 7A–7C.

FIGS. 3A, 4A, 5A, 6A and 7A are expanded layout views of the contact holes exposing the expansions of the drain electrodes 175 shown in FIGS. 1 and 2, FIGS. 3B, 4B, 5B, 6B and 7B are sectional views of the contact holes shown in FIGS. 3A, 4A, 5A, 6A and 7A taken along the lines IIIB–IIIB', IVB–IVB', VB–VB', VIB–VIB', and VIIB–VIIB', and FIGS. 3C, 4C, 5C, 6C and 7C are sectional views of the contact holes shown in FIGS. 3A, 4A, 5A, 6A and 7A taken along the lines IIIC–IIIC', IVC–IVC', VC–VC', VIC–VIC', and VIIC–VIIC'.

FIGS. 3A–7C show a contact hole 187 disposed on an expanded end portion 177 of a drain electrode 175 and an expansion 137 of a storage electrode line 131 and covered by a pixel electrode 190. The contact hole 187 has sidewalls consisting of a lower passivation layer 180$p$ and an upper passivation layer 180q that is much thicker than the lower passivation layer 180p. Portion of the sidewalls formed by the upper passivation layer 180q make a smooth angle of about 30–85 degrees with a surface of a substrate 110 and thus the contact hole 187 has three dominant rectangular boundaries, i.e., a lower layer boundary 187p formed by a lower passivation layer 180p, a bottom boundary 187q formed by a bottom surface of an upper passivation layer 180q, and a top boundary 187r formed by a top surface of the upper passivation layer 188q. The lower layer boundary 187p has a pair of transverse edges defined by points C and D and having a width Wpt and a pair of longitudinal edges defined by points N and O and having a width Wpl. The bottom boundary 187q has a pair of transverse edges defined by points B and E and having a width Wqt and a pair of longitudinal edges defined by points M and P and having a width Wql. The top boundary 187r has a pair of transverse edges defined by points A and F and a pair of longitudinal edges defined by points L and Q. The distance between lower edges of the bottom and the top boundaries is denoted by Dd, the distance between upper edges of the bottom and the top boundaries is denoted by Du, the distance between left edges of the bottom and the top boundaries is denoted by Dl, and the distance between right edges of the bottom and the top boundaries is denoted by Dr.

Figure 3A:
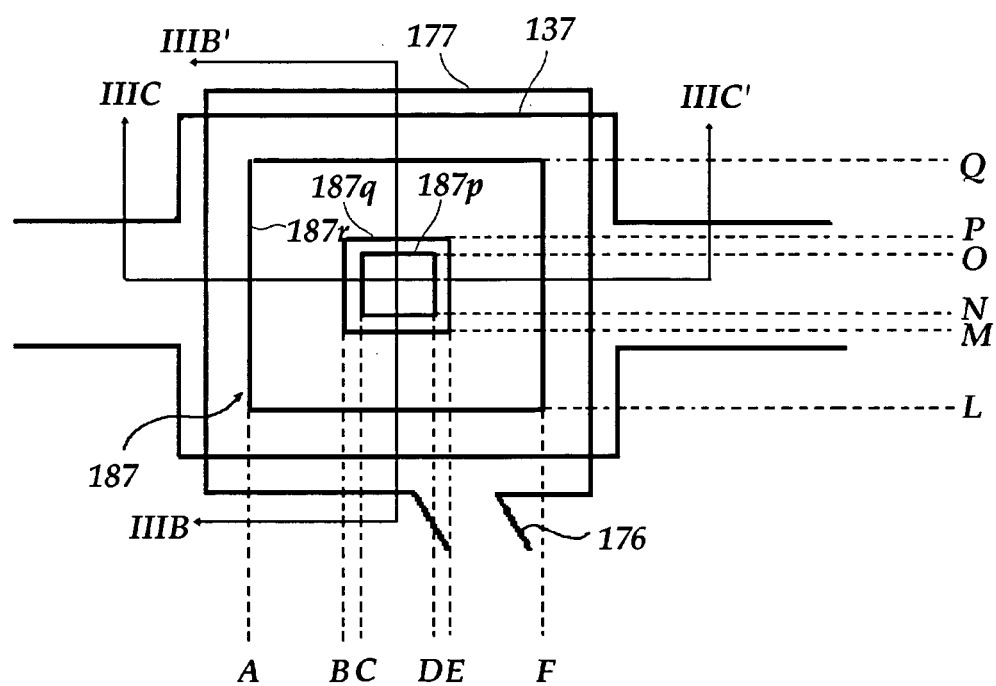
FIGS. 3A, 4A, 5A, 6A and 7A are expanded layout views of the contact holes exposing the expansions of the drain electrodes 175 shown in FIGS. 1 and 2.
Figure 3B:
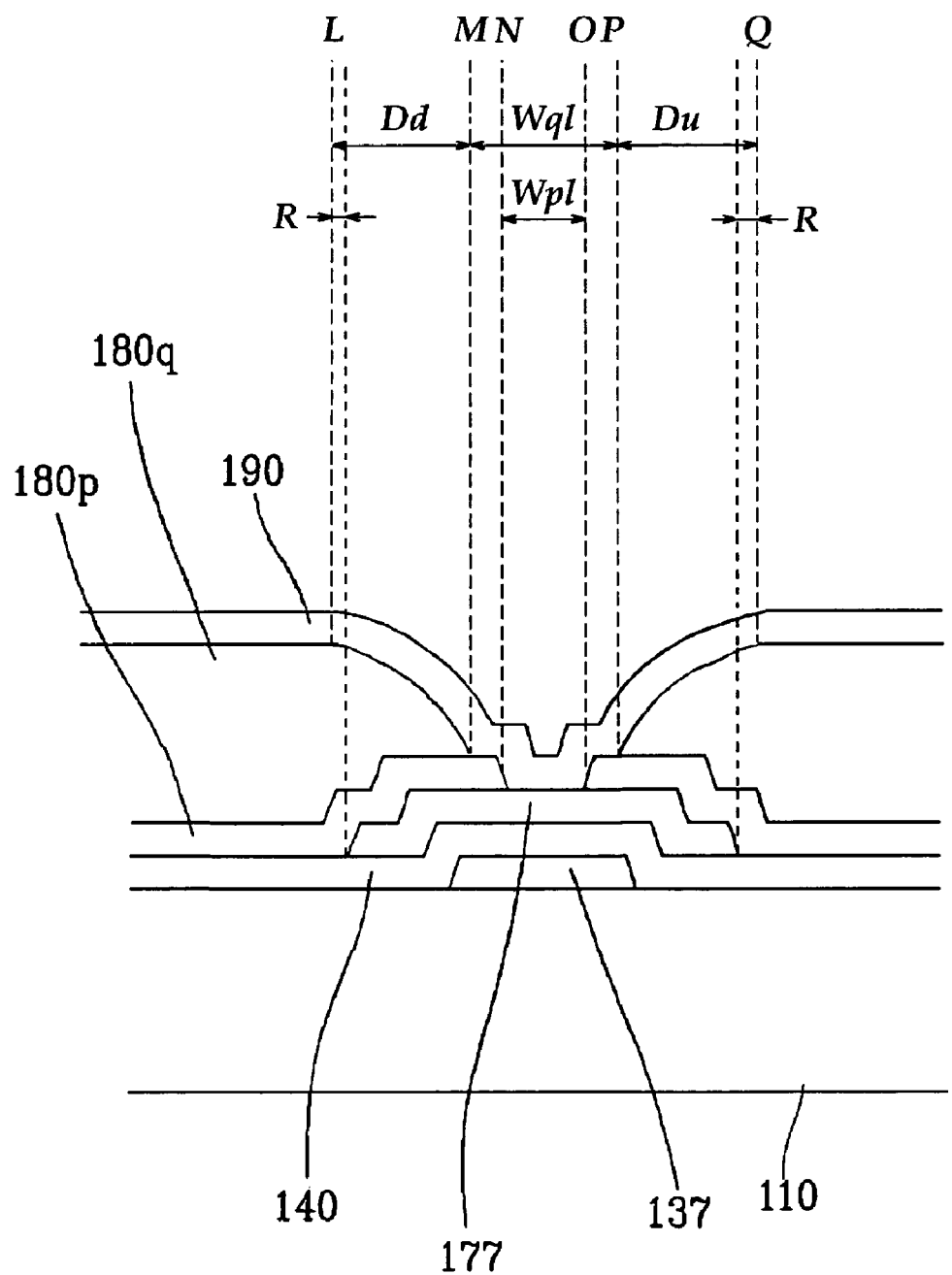
FIGS. 3B, 4B, 5B, 6B and 7B are sectional views of the contact holes shown in FIGS. 3A, 4A, 5A, 6A and 7A taken along the lines IIIB–IIIB', IVB–IVB', VB–VB', VIB–VIB', and VIIB–VIIB'.
Figure 3C:
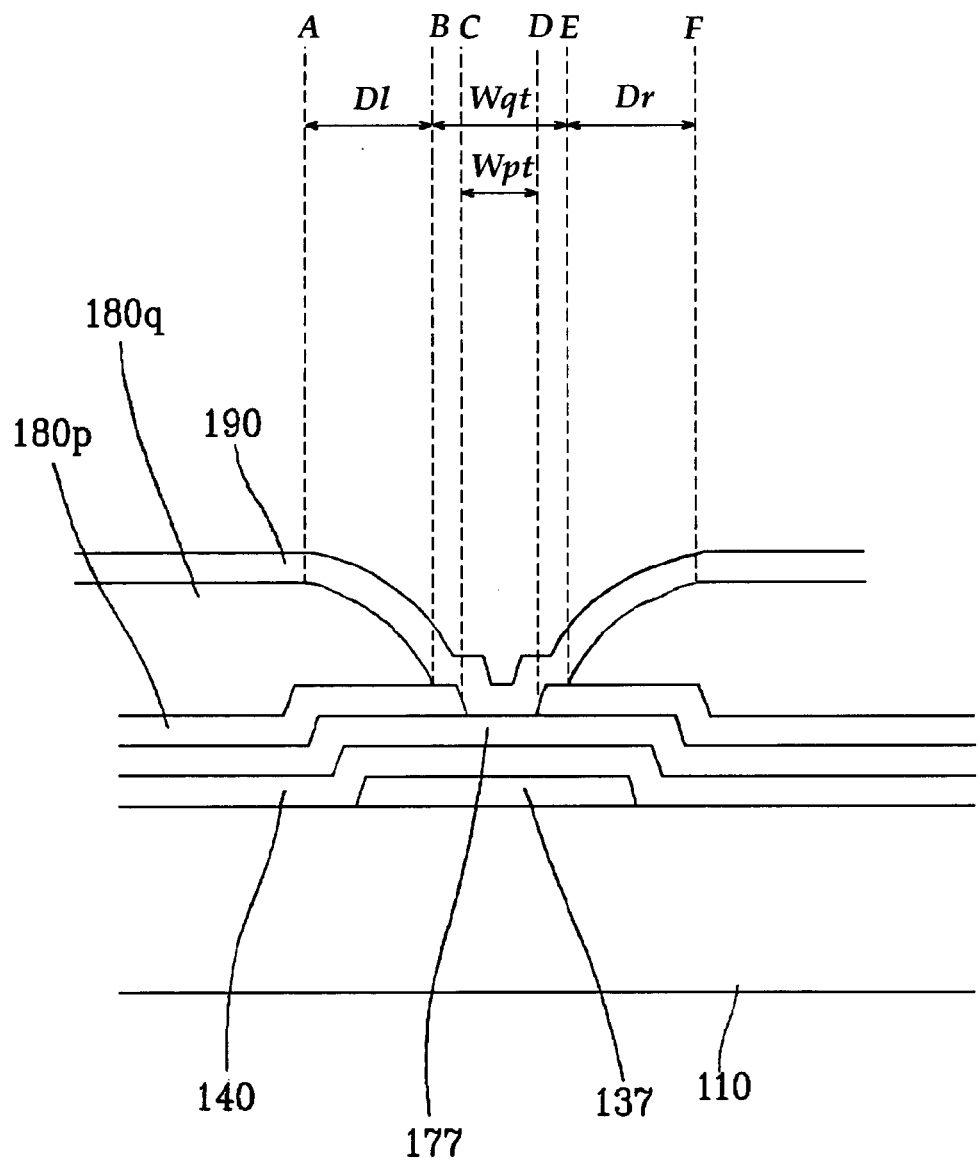
FIGS. 3C, 4C, 5C, 6C and 7C are sectional views of the contact holes shown in FIGS. 3A, 4A, 5A, 6A and 7A taken along the lines IIIC–IIIC', IVC–IVC', VC–VC', VIC–VIC', and VIIC–VIIC'.

Referring to FIGS. 3A–3C, the lower layer boundary 187p is disposed entirely within the bottom boundary 187q. Therefore, all portions of the top surface of the lower passivation layer 180p around the lower layer boundary 187p are exposed, and thus a stepped profile is formed at each edge of the contact hole 187, which ensures the reliability of the contact between the pixel electrode and the expansion 177. Furthermore, the distances between the adjacent edges of the bottom and the top boundaries 187q and 187r are substantially equal. FIG. 3B shows the lower and the upper edges of the top boundary 187r are disposed outside the expansion 177 as well as the expansion 137. In this case, an area R of the contact hole 187, which is disposed outside of the opaque expansions 137 and 177, may yield light leakage since the inclined sidewall varies a cell gap that is defined as a thickness of a liquid crystal layer (not shown) and refracts an incident light. Moreover, the inclined sidewalls obstructs uniform rubbing of an alignment layer (not shown) coated on the pixel electrode 190 and this may also cause light leakage. The light leakage is more severe at the upper edge of the contact hole 187 than at the lower edge since another portion 176 of the drain electrode 175, which is connected to the expansion 177, also blocks the light leakage. Since the above-described light leakage uniformly distributes over a TFT array panel, it may make no spot. However, the light leakage may increase the luminance of an LCD in a black state and thus it decreases the contrast ratio of the LCD and increases the variation of the contrast ratio between LCD products. Although the light leakage can be blocked by increasing the expansions 137 and 177, the increase of the expansions 137 and 177 decreases the aperture ratio and the luminance.

Referring to FIGS. 4A–7C, at least one of the edges of the lower layer boundary 187p is disposed outside of the bottom boundary 187q to form undercut, while the other edge(s) of the lower layer boundary 187p are disposed within the bottom boundary 187q to form stepped profiles of the sidewall(s). Hereinafter, the edge(s) forming the undercut is referred to as "reversely-stepped edge(s)" and the edge(s) forming the stepped profiles is referred to as "stepped edge(s)." Although the undercut at the reversely-stepped edge(s) may disconnect the pixel electrode 190, the connection between the pixel electrode 190 and the expansion 177 is still ensured by the stepped edge(s). Meanwhile, the distance(s) between the edges of the bottom and the top boundaries 187q and 187r at the reversely-stepped edge(s) is shorter than the distance(s) at between the edges of the bottom and the top boundaries 187q and 187r the stepped edge(s) and the slope of the sidewall of the contact hole 187 at the reversely-stepped edge(s) is steeper than at the stepped edge(s). Accordingly, the width of the contact hole 187 in direction(s) perpendicular to the reversely-stepped edge(s) is decreased 3C and thus it is easy to place the contact hole 187 within the expansion 177.

Figure 4A:
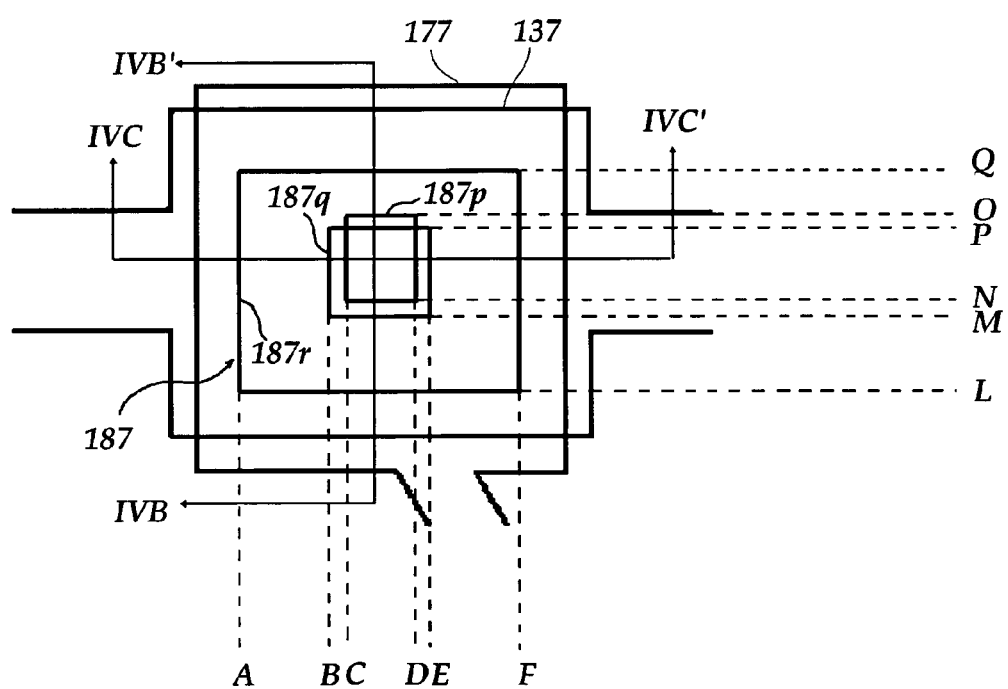
Figure 4B:
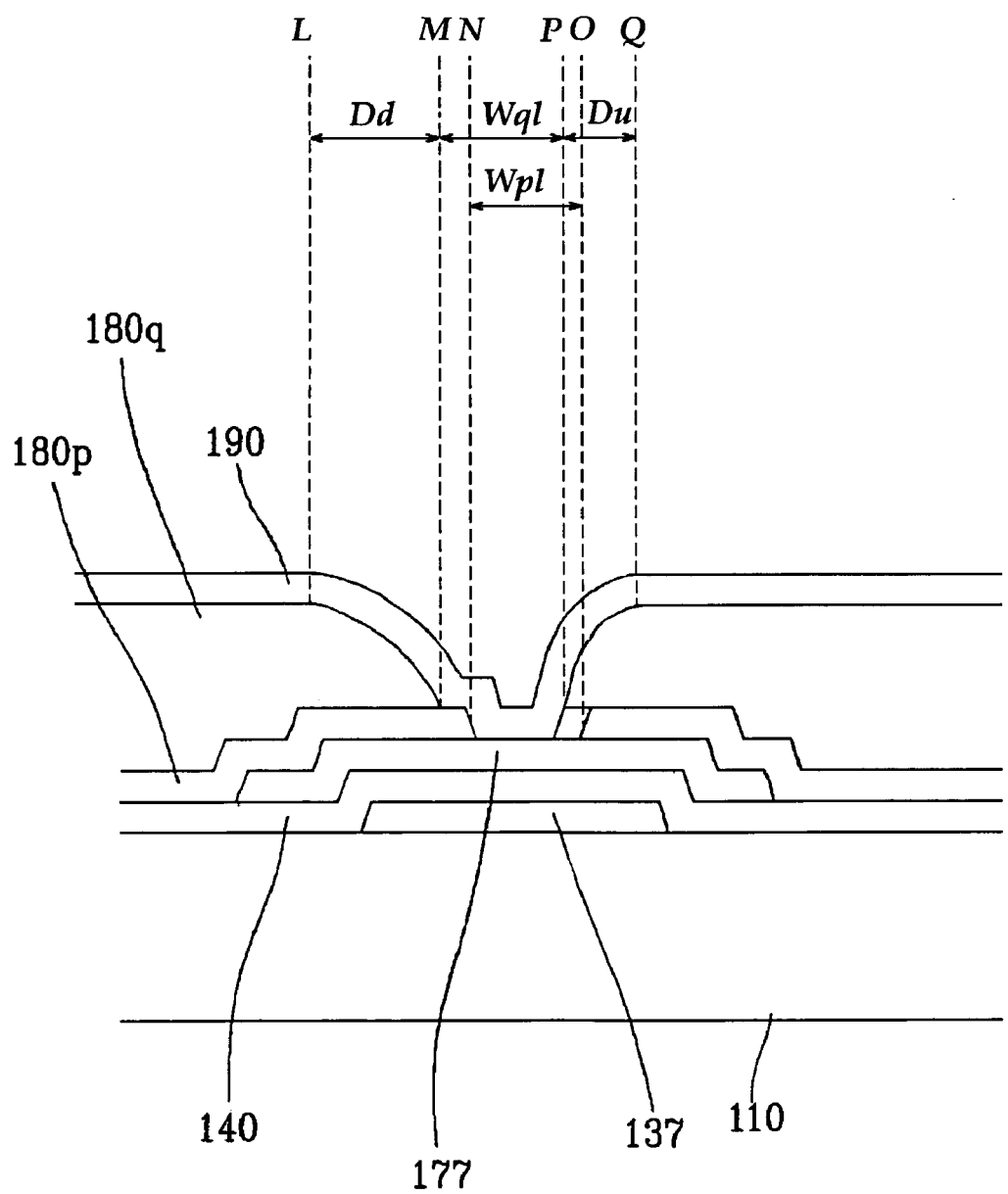
Figure 4C:
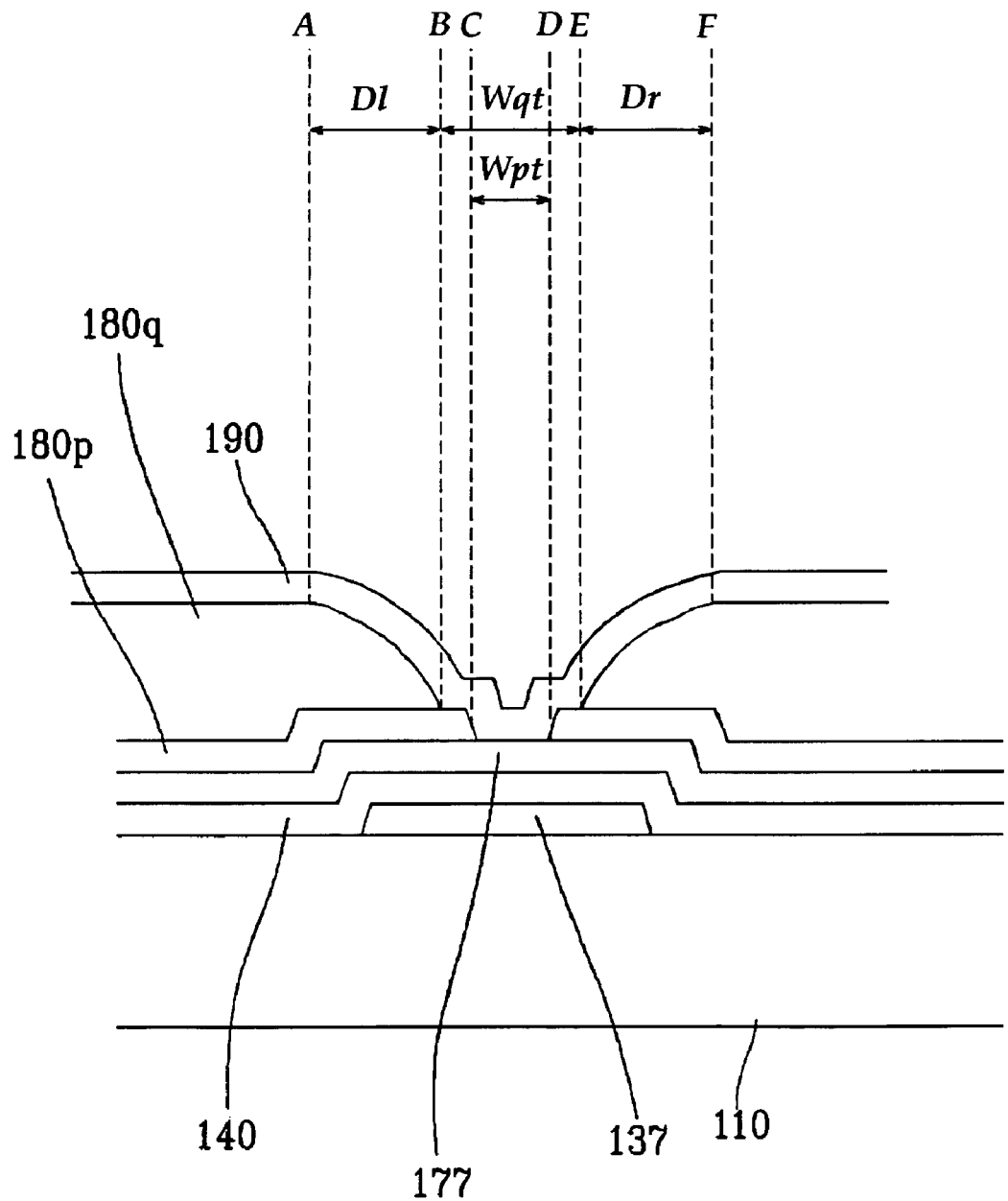

In detail, FIGS. 4A–4C show that the upper edge of the lower layer boundary 187p is disposed outside of the bottom boundary 187q, while the other edges of the lower layer boundary 187p are disposed within the bottom boundary 187q. The distance Du between the upper edges of the bottom and the top boundaries 187q and 187r is shorter than other distances Dd, Dl and Dr such that the longitudinal width of the contact hole 187 is decreased compared with the contact hole 187 shown in FIGS. 3A–3C to reduce the light leakage.

Figure 5A:
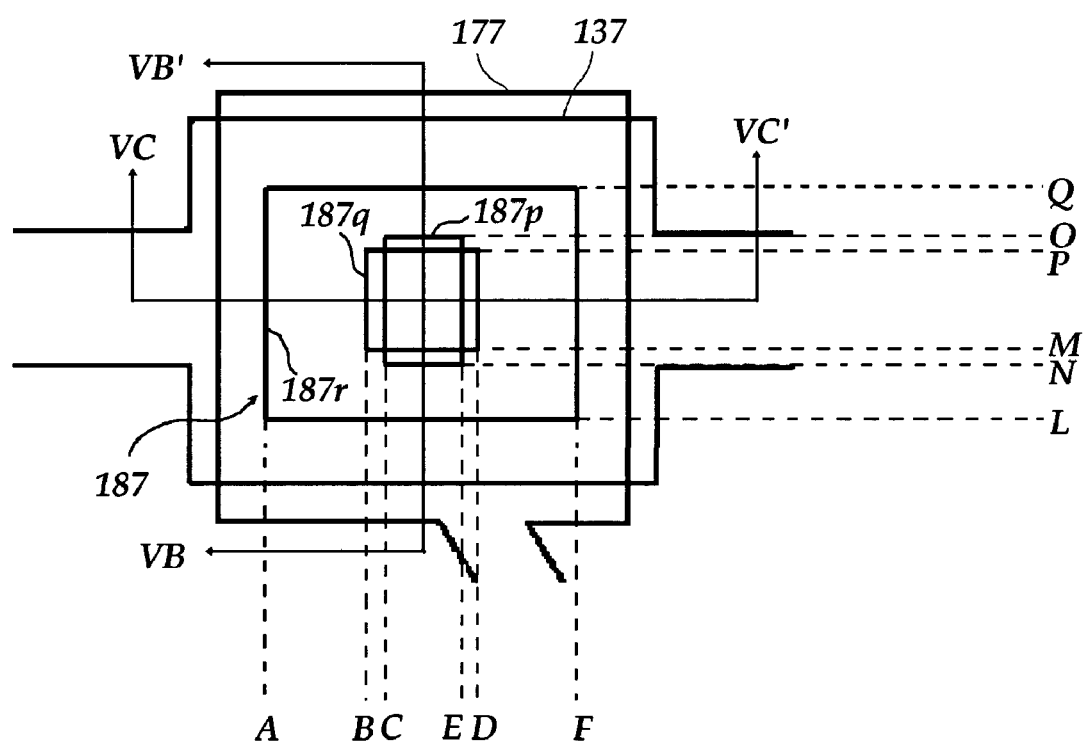
Figure 5B:
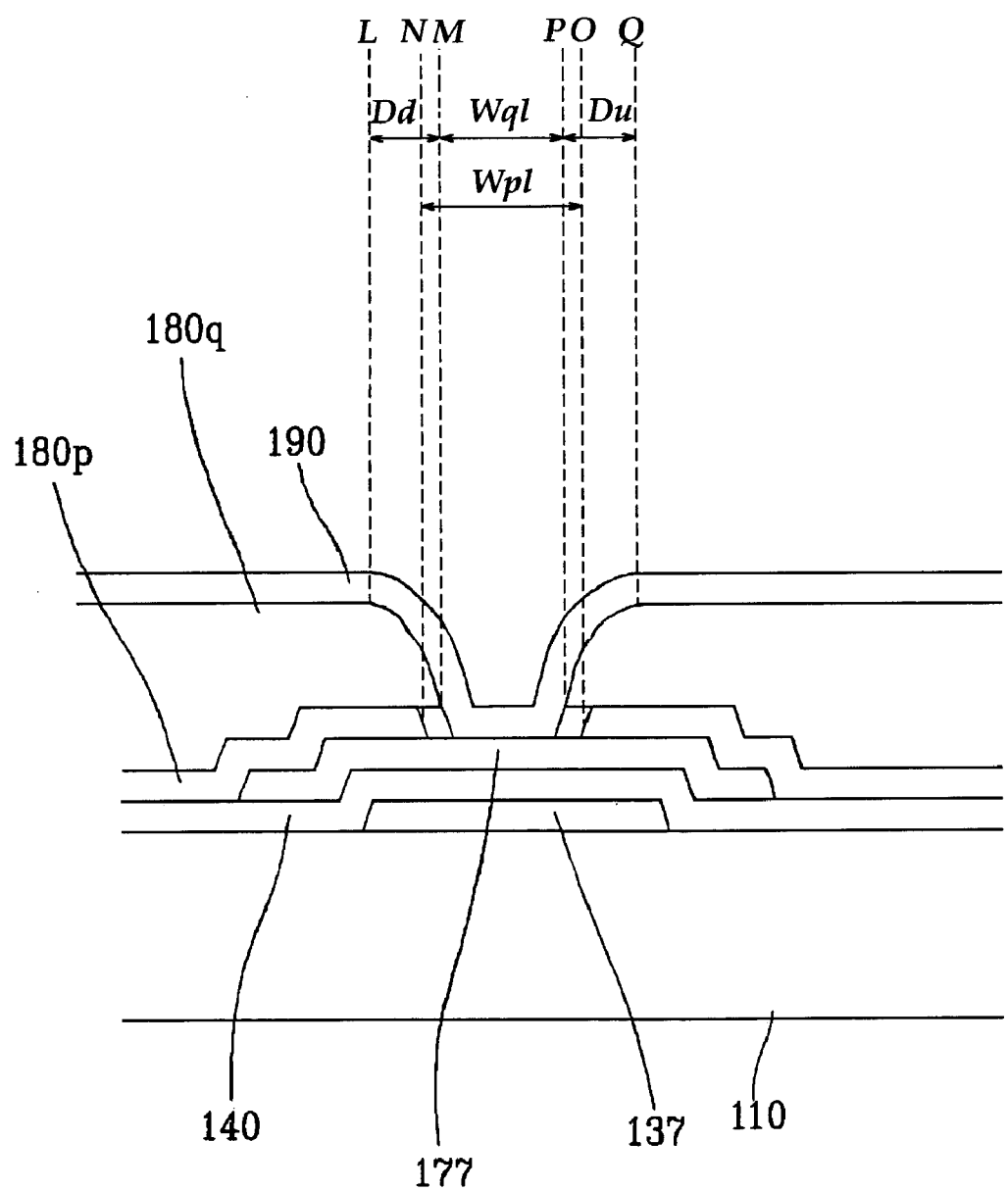
Figure 5C:
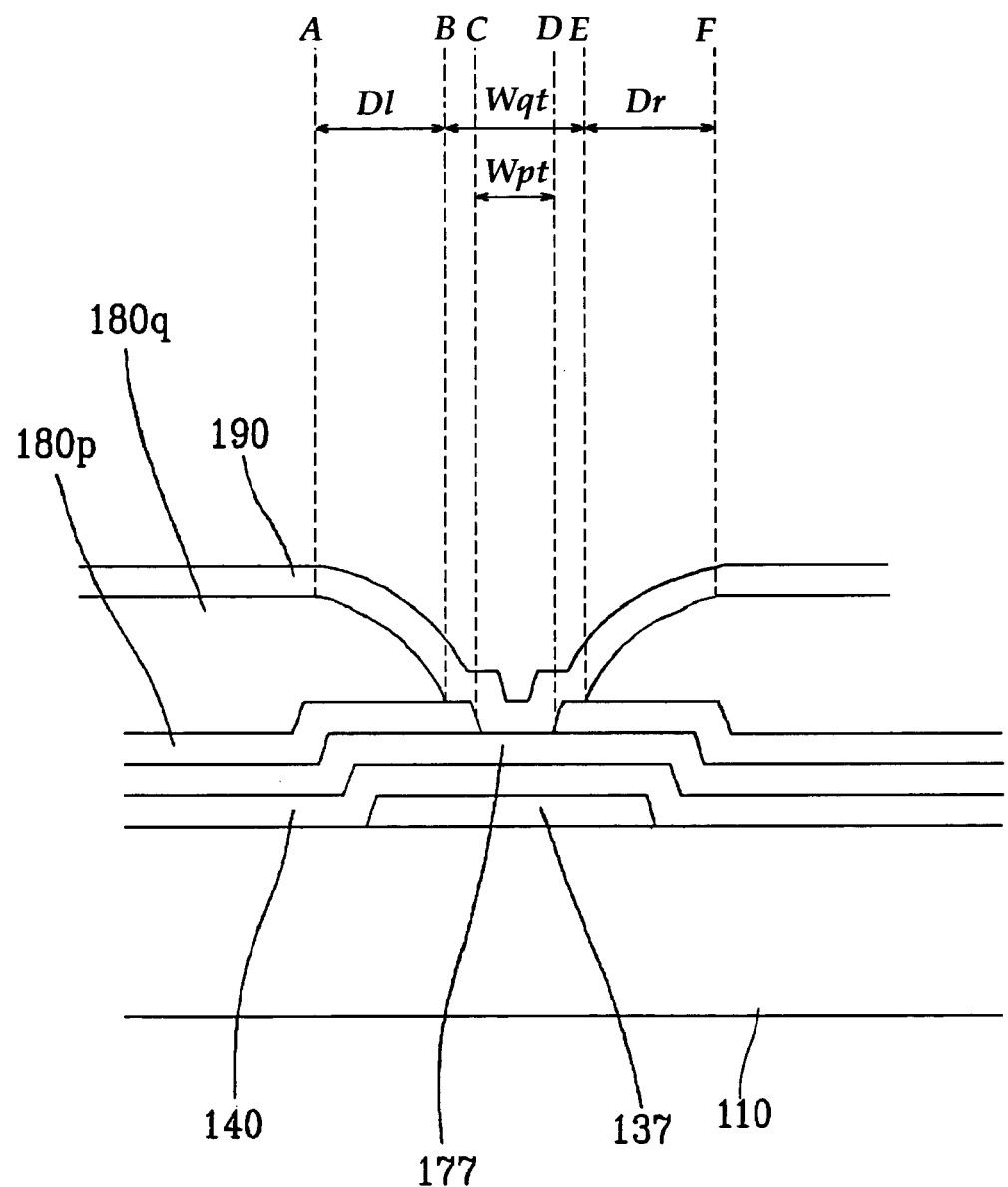

Referring to FIGS. 5A–5C, the upper and the lower edges of the lower layer boundary 187p are disposed outside of the bottom boundary 187q, while the left and the right edges of the lower layer boundary 187p are disposed within the bottom boundary 187q. The distances Du and Dd between the upper and the lower edges of the bottom and the top boundaries 187q and 187r are shorter than the other distances Dl and Dr and the contact hole 187 can be disposed within the expansion much safely to reduce the light leakage. In this case, the size of the expansion 177 can be also reduced to increase the aperture ratio. To obtain a safer connection between the pixel electrode 190 and the expansion 177, the longitudinal width Wql of the contact hole 187 may be increased with or without decreasing the transverse width Wqt.

Figure 6A:
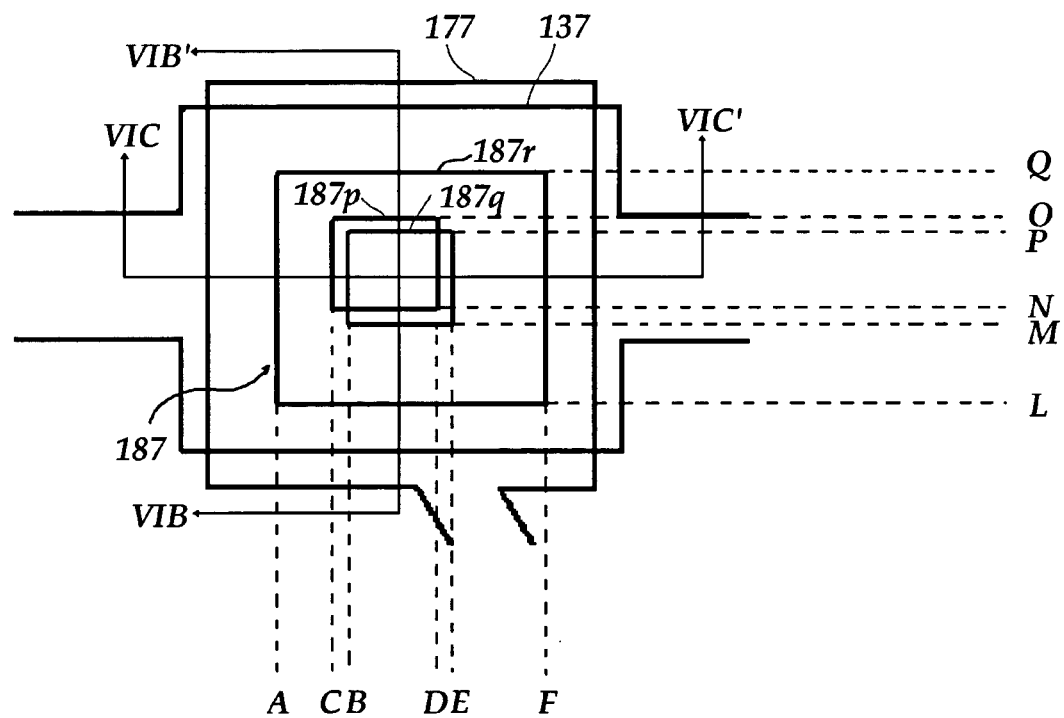
Figure 6B:
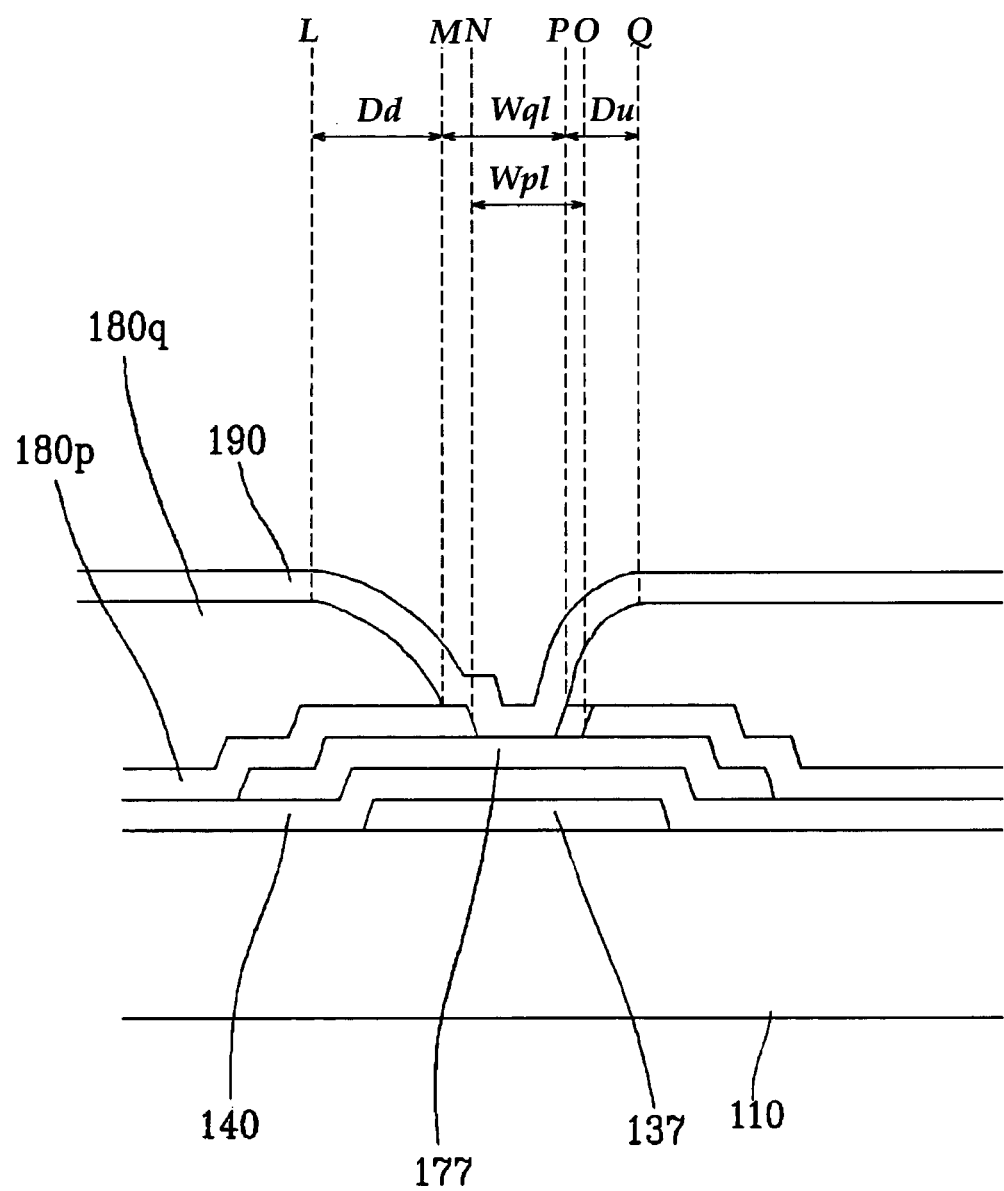
Figure 6C:
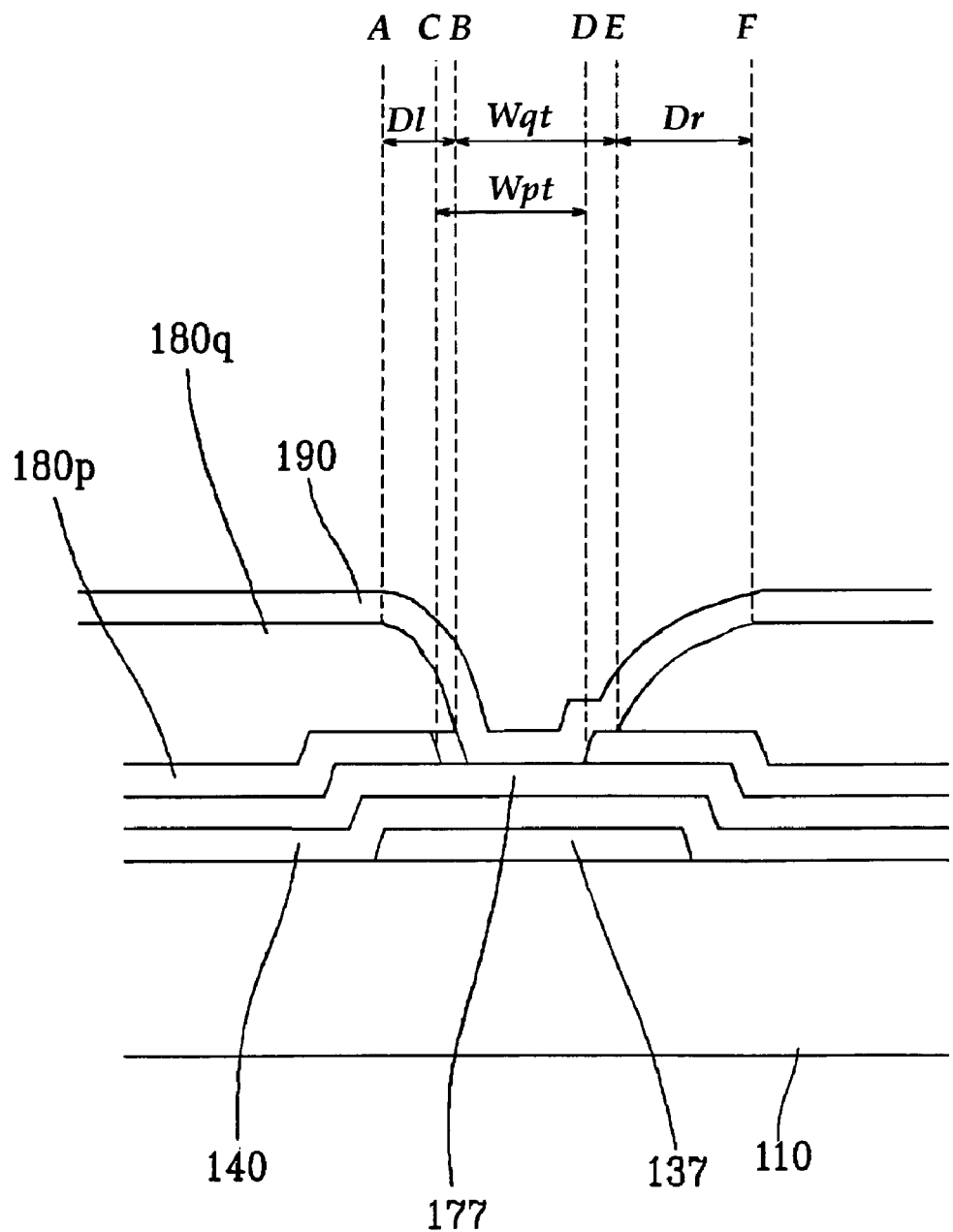

Referring to FIGS. 6A–6C, the upper and the left edges of the lower layer boundary 187p are disposed outside of the bottom boundary 187q, while the lower and the right edges of the lower layer boundary 187p are disposed within the bottom boundary 187q. The distances Du and Dl between the upper and the left edges of the bottom and the top boundaries 187q and 187r are shorter than the other distances Dd and Dr to decrease the light leakage.

Figure 7A:
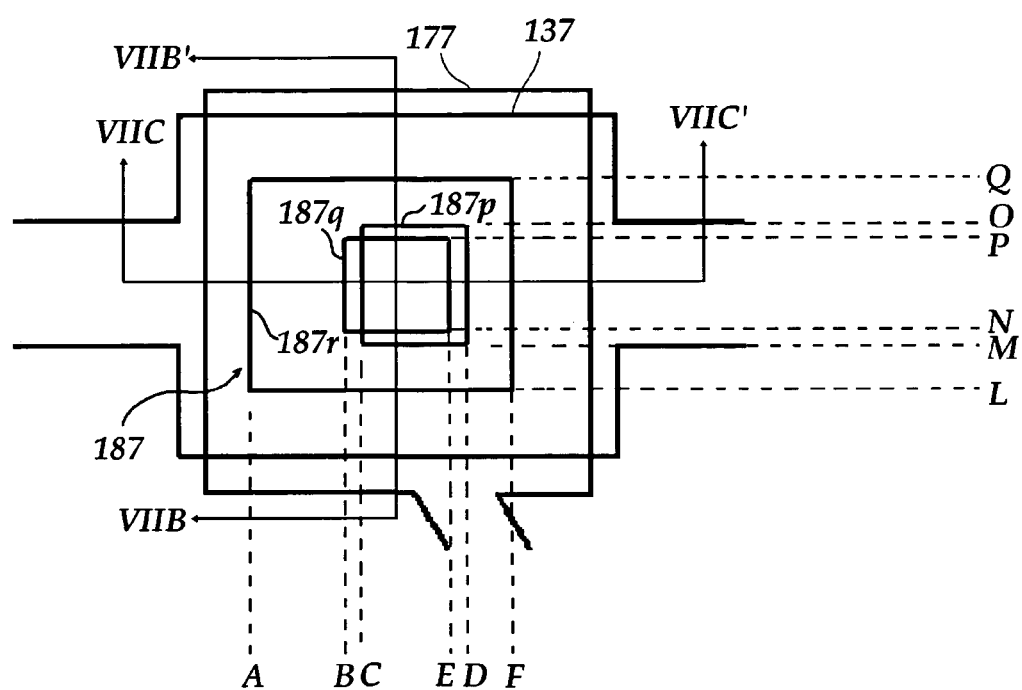
Figure 7B:
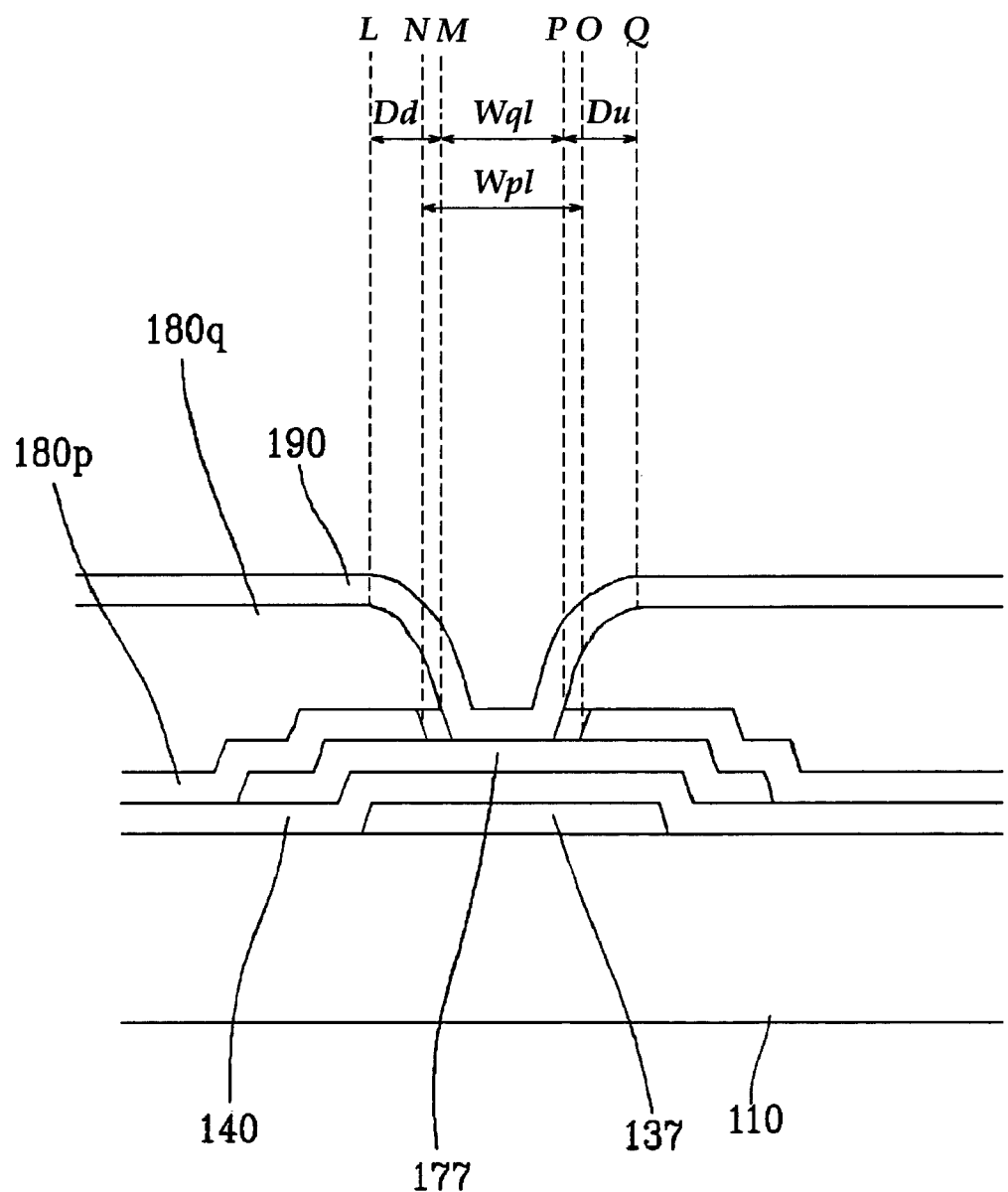
Figure 7C:
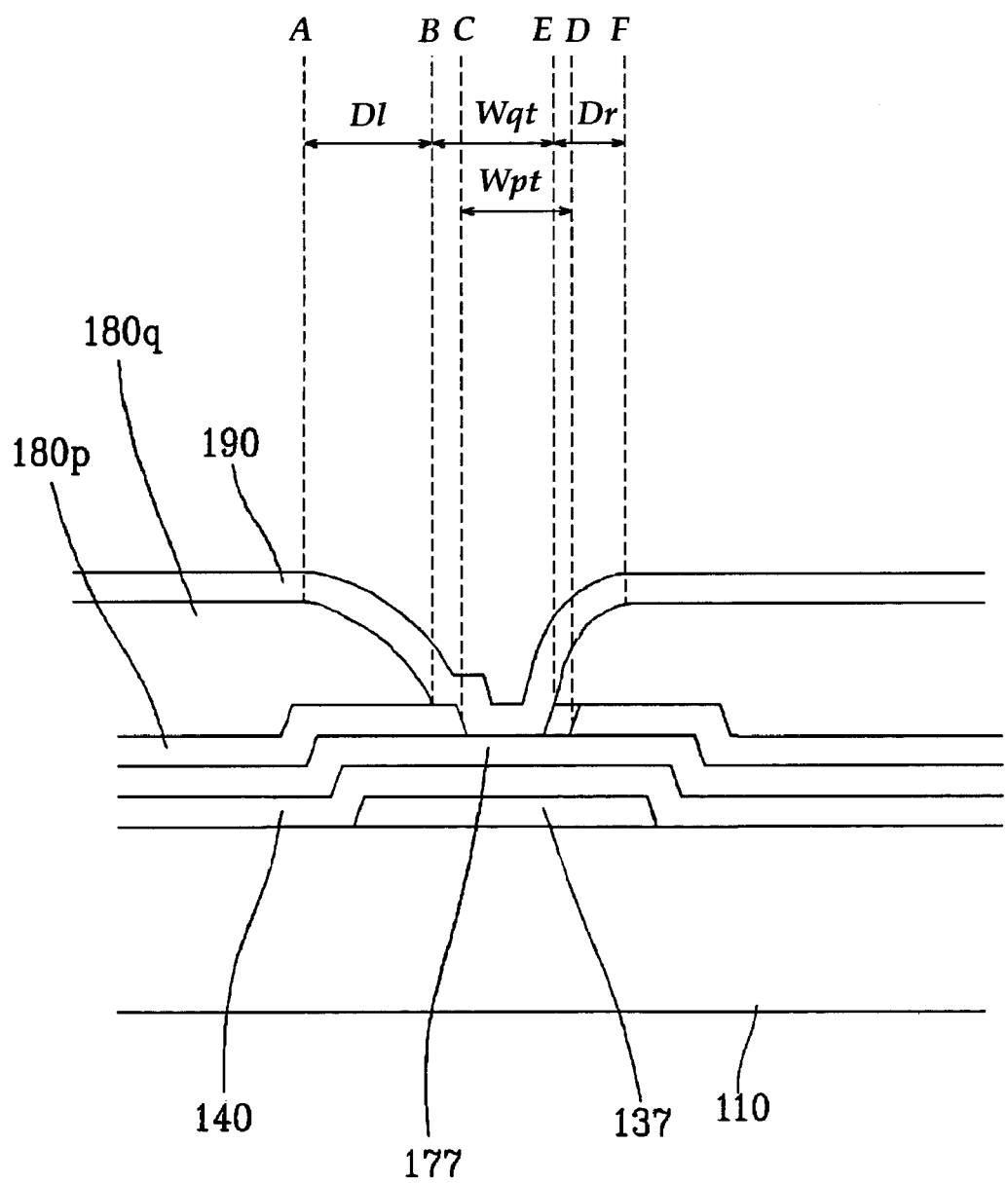

Referring to FIGS. 7A–7C, the left edge of the lower layer boundary 187p is disposed within the bottom boundary 187q, while the other edges of the lower layer boundary 187p are disposed out of the bottom boundary 187q. The distances Du, Dd and Dr between the upper and the lower edges of the bottom and the top boundaries 187q and 187r are shorter than the other distances Dl and the contact hole 187 can be disposed within the expansion 177.

A method of manufacturing the TFT array panel shown in FIGS. 1 and 2 according to an embodiment of the present invention will be now described in detail with reference to FIGS. 8–17 as well as FIGS. 1 and 2.

FIGS. 8, 10, 12 and 14 are layout views of the TFT array panel shown in FIGS. 1 and 2 in intermediate steps of a manufacturing method thereof according to an embodiment of the present invention, and FIGS. 9, 11, 13 and 15 are sectional views of the TFT array panel shown in FIGS. 8, 10, 12, and 14 taken along the lines IX–IX', XI–XI', XIII–XIII' and XV–XV', respectively.

Figure 8:
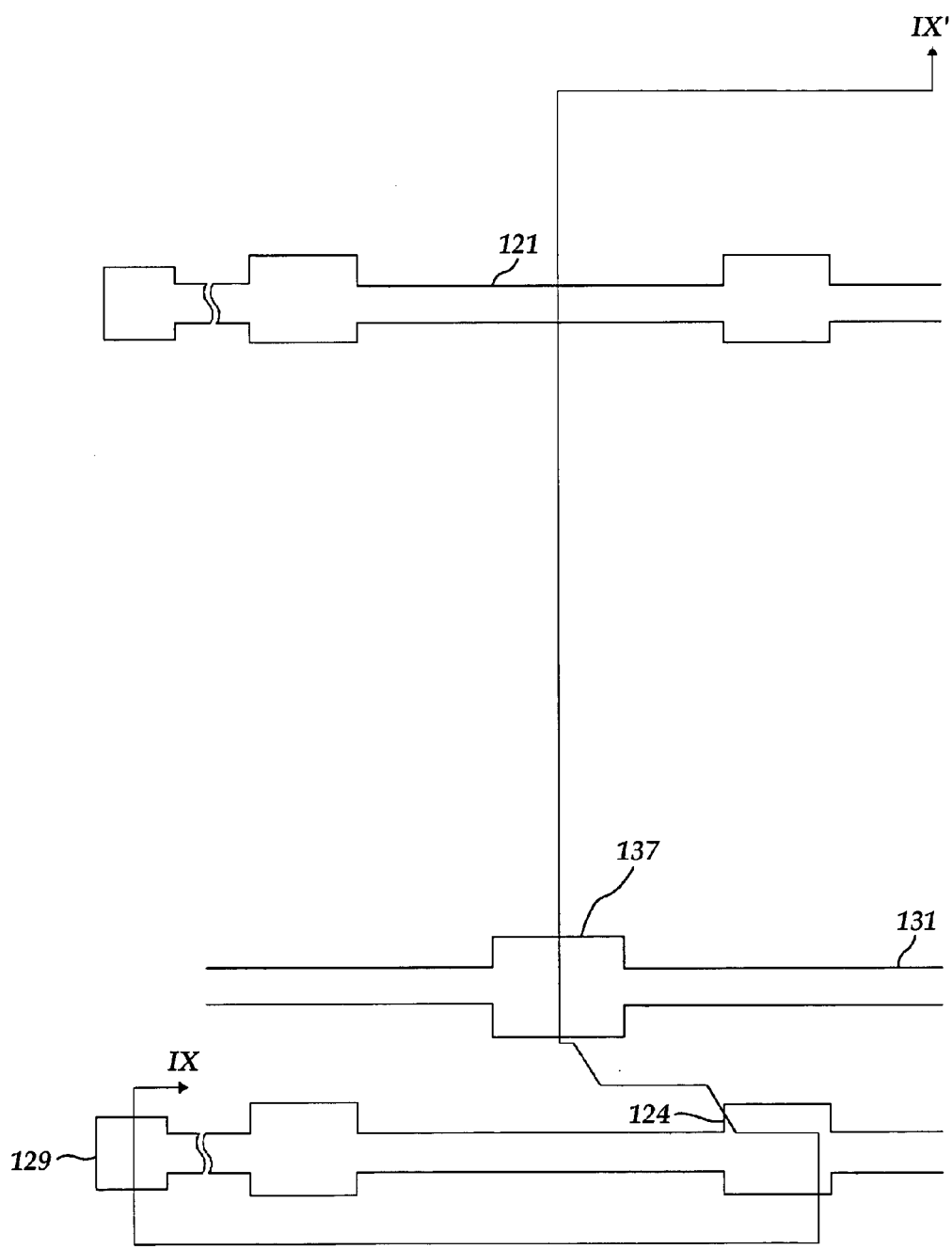
FIGS. 8, 10, 12 and 14 are layout views of the TFT array panel shown in FIGS. 1 and 2 in intermediate steps of a manufacturing method thereof according to an embodiment of the present invention.
Figure 9:
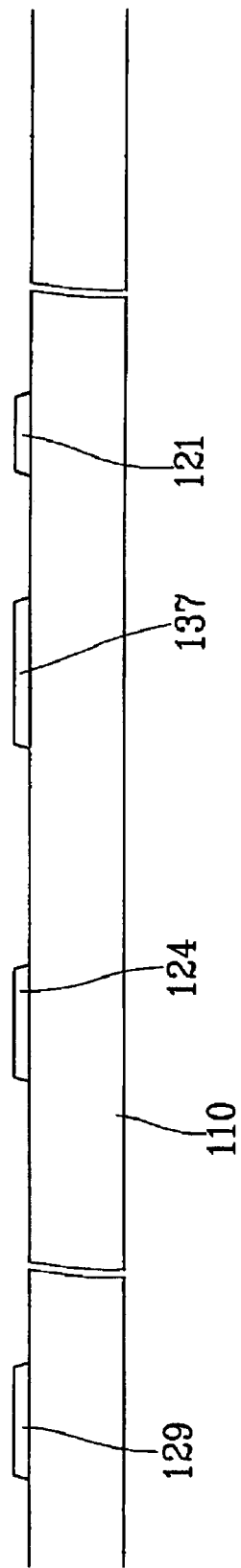
FIGS. 9, 11, 13 and 15 are sectional views of the TFT array panel shown in FIGS. 8, 10, 12, and 14 taken along the lines IX–IX', XI–XI', XIII–XIII' and XV–XV', respectively.

Referring to FIGS. 8 and 9, conductive film(s) preferably made of Cr, Mo, Al, Ag, and alloys thereof is sputtered on an insulating substrate 110 such as transparent glass. The conductive film is patterned by photo-etching with dry etch or wet etch to form a plurality of gate lines 121 including a plurality of gate electrodes 124 and a plurality of storage electrode lines 131 including a plurality of expansions 137. The edge profiles of the gate lines 121 and the storage electrode lines 131 are tapered for good attachment of overlying layers.

Figure 10:
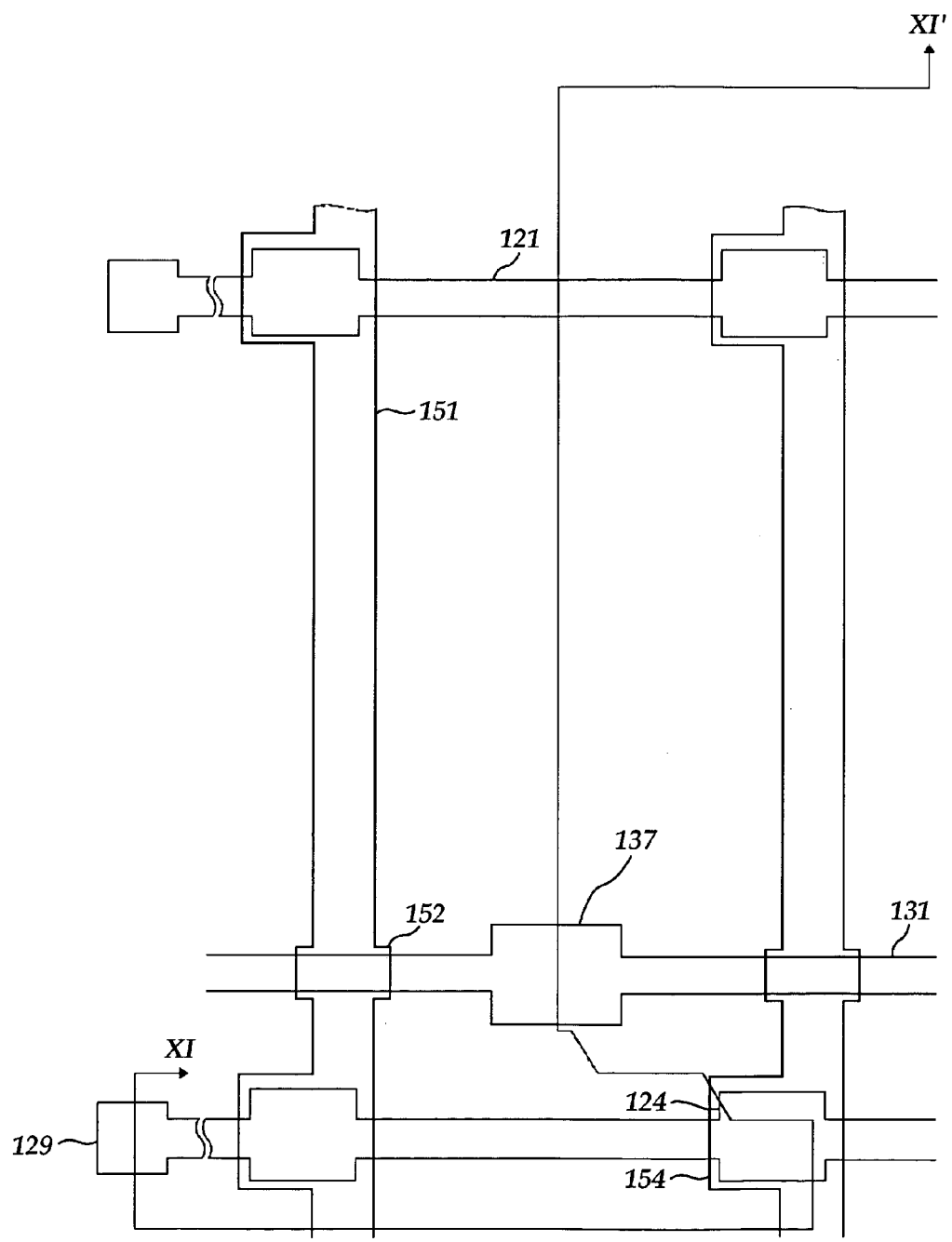
Figure 11:
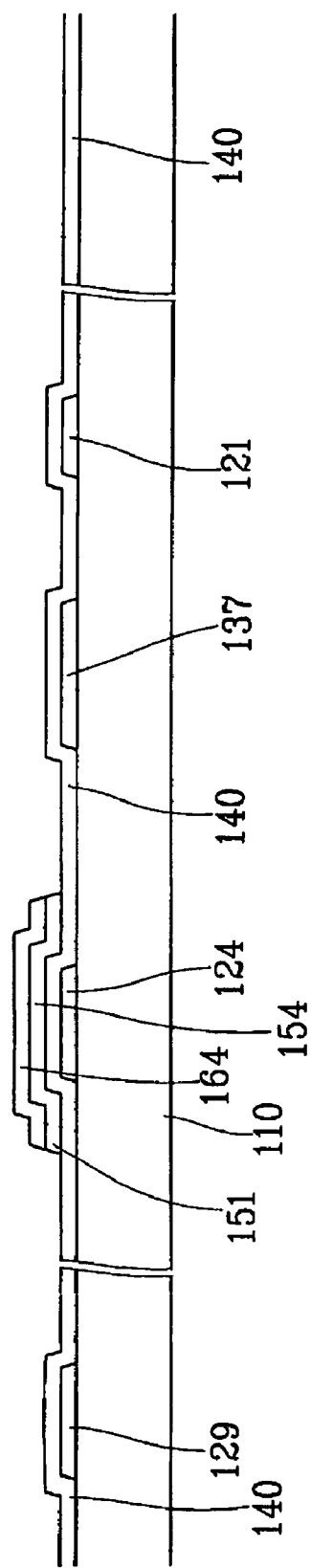

Referring to FIGS. 10 and 11, after sequential deposition of a gate insulating layer 140 preferably made of silicon nitride or silicon oxide, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

Figure 12:
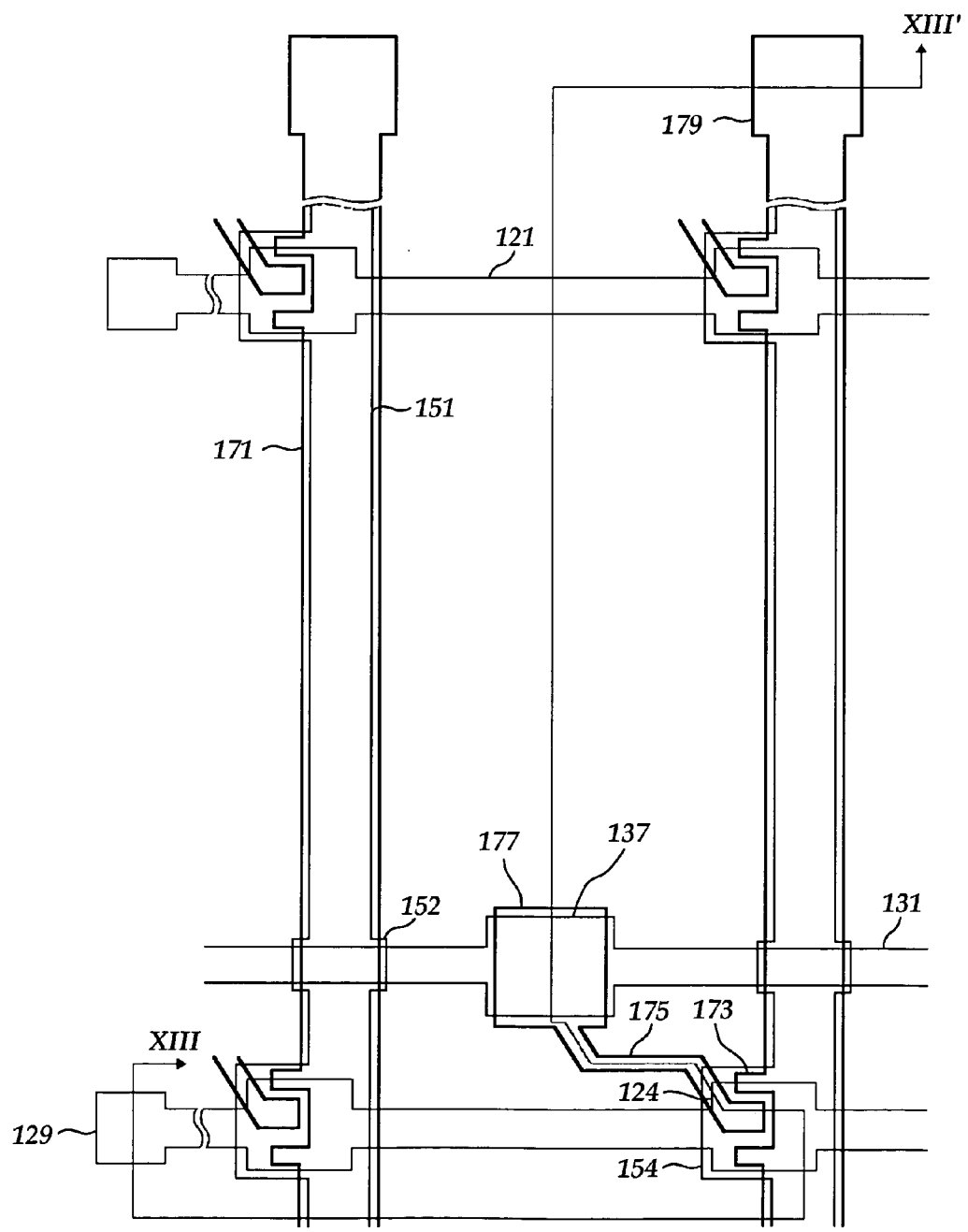
Figure 13:
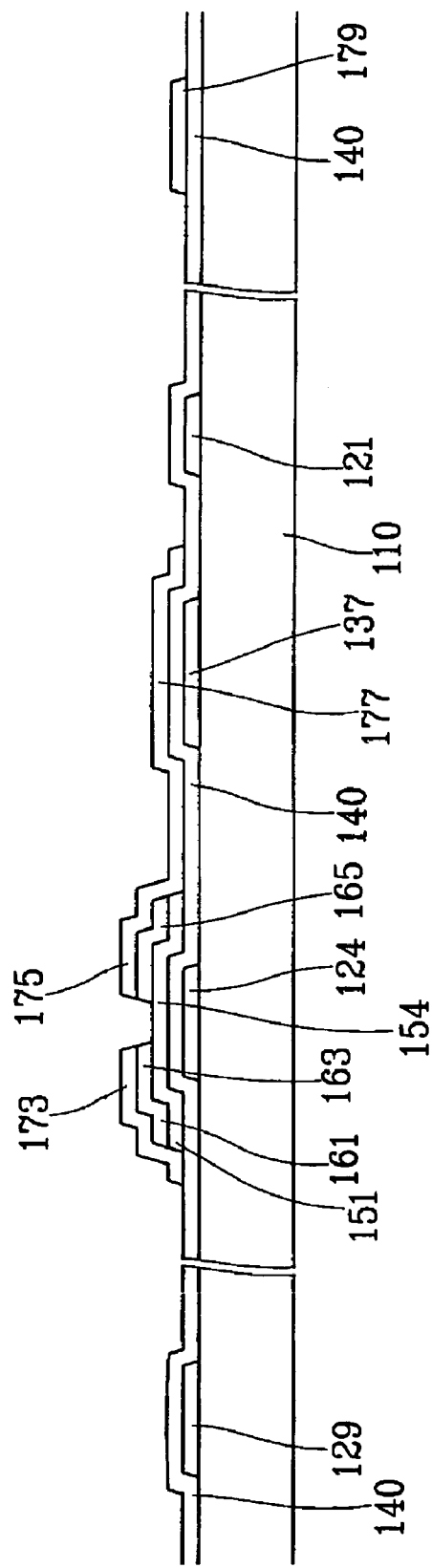

Referring to FIGS. 12 and 13, a conductive layer is sputtered and photo-etched to form a plurality of data lines 171 including a plurality of source electrodes 173 and a plurality of drain electrodes 175. Thereafter, portions of the extrinsic semiconductor stripes 164, which are not covered with the data lines 171 and the drain electrodes 175, are removed by etch to complete a plurality of ohmic contact stripes 161 including a plurality of projections 163 and a plurality of ohmic contact islands 165 and to expose portions of the intrinsic semiconductor stripes 151.

Figure 14:
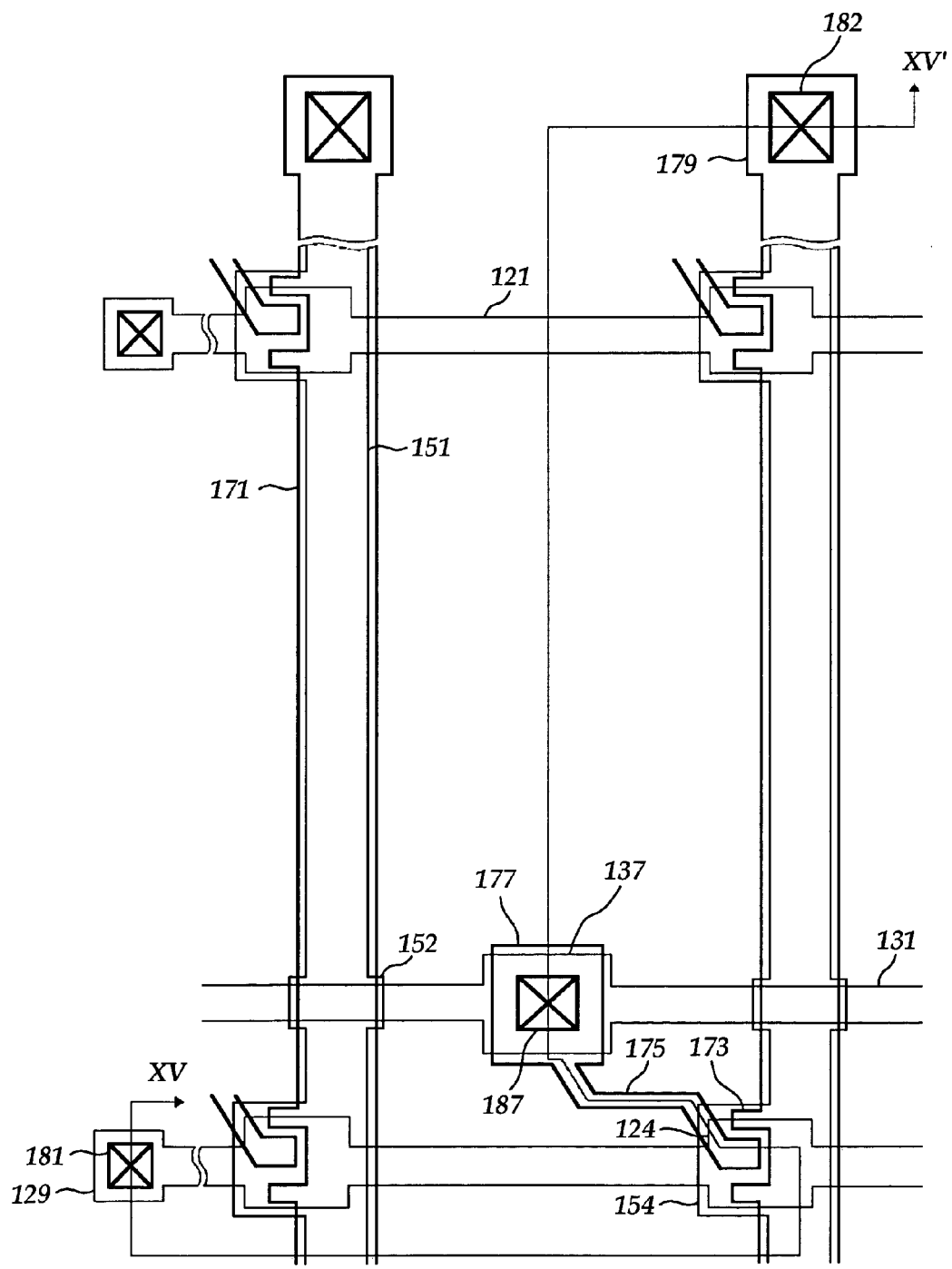
Figure 15:
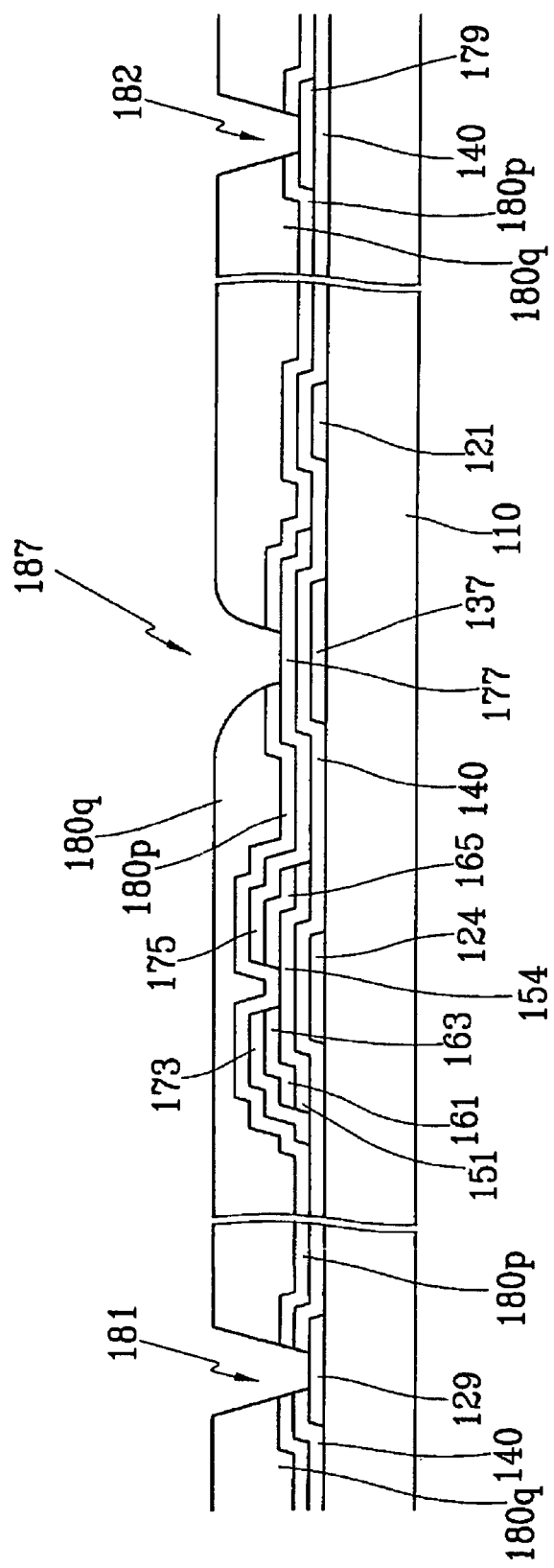

Referring to FIGS. 14 and 15, a lower passivation layer 180p preferably made of silicon nitride or silicon oxide and an upper passivation layer 180q preferably made of photosensitive organic insulator are deposited and etched along with the gate insulating layer 140 to form a plurality of contact holes 181, 182 and 187 exposing the end portions 129 of the gate lines 121, the end portions 179 of the data lines 171, and the expansions of the drain electrodes 175.

Figure 16:
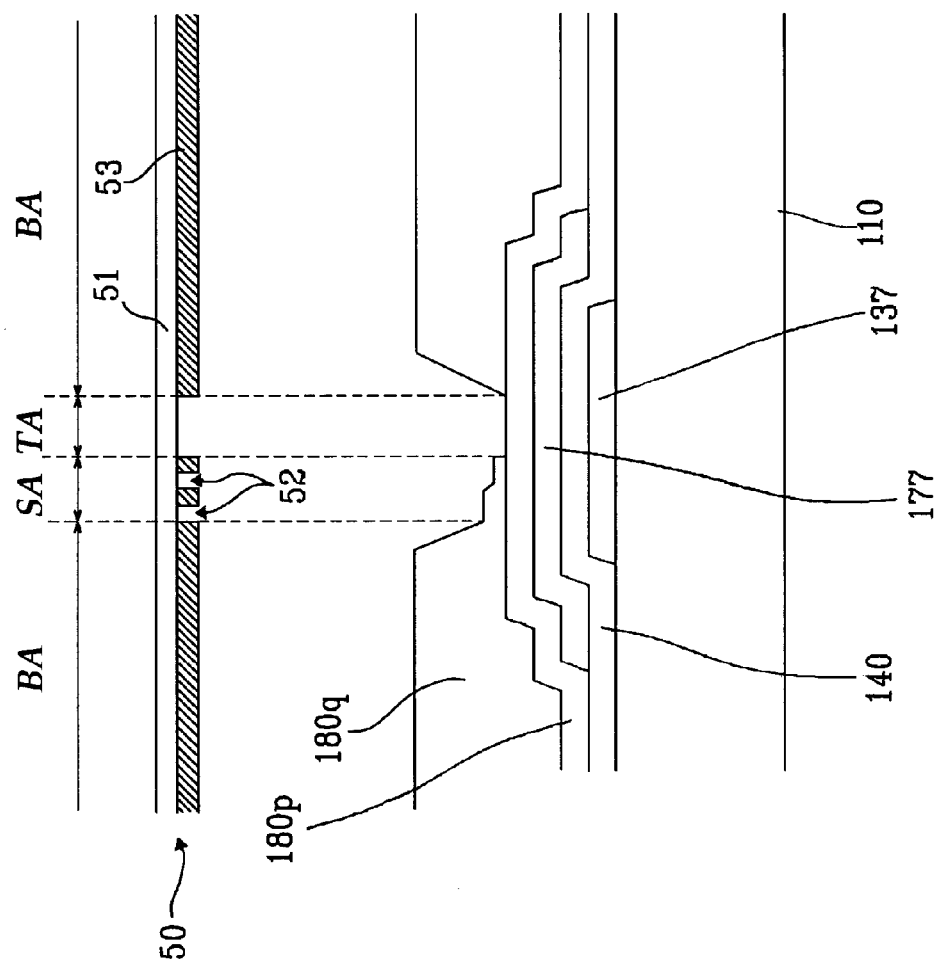
FIGS. 16 and 17 are sectional views of the contact holes in a manufacturing method of the TFT array panel shown in FIGS. 1 and 2.

In detail, a photo mask 50 having a plurality of light transmitting areas TA, a plurality of slit areas SA, and a plurality of light blocking areas BA is aligned with the substrate 110 as shown in FIG. 16, which shows a portion of the photo mask 50 facing the contact hole 187. The photo mask 50 includes a transparent substrate 51 and a plurality of opaque members 53. In the slit areas SA, the opaque members 53 have width smaller than a predetermined width and the distance between the opaque members 53 is smaller than a predetermined distance. In other words, slits 52 between the opaque members 53 has a width smaller than the predetermined distance and the distance between the slits 52 is smaller than the predetermined width. The light transmitting areas TA are defined as the areas that have no opaque member 53 within the predetermined distance, and the light blocking areas BA are defined as the areas occupied by a light blocking member 53 over a distance larger than the predetermined width.

The upper passivation layer 180q is exposed to light through the photo mask 50 and developed to have a shape shown in FIG. 16, which shows that a portion of the upper passivation layer 180q facing the light transmitting area TA is removed to exposed the lower passivation layer 180p and a portion facing the light blocking area BA is remained, while a portion facing the slit area SA have a reduced thickness.

Figure 17:
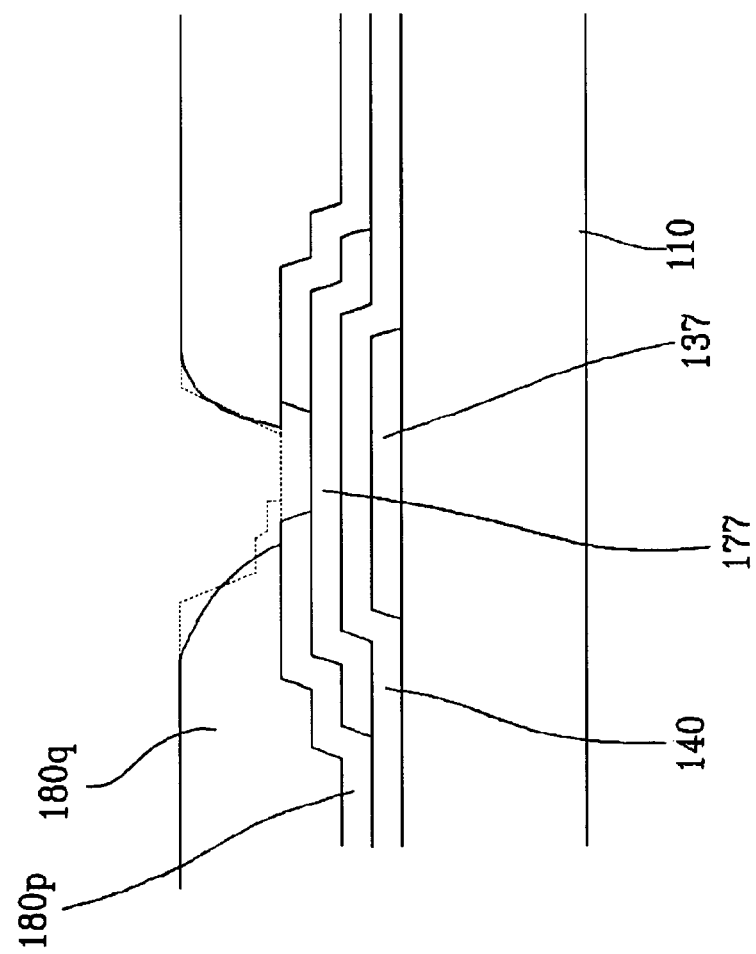

Thereafter, the upper passivation layer 180q is cured and the exposed portion of the lower passivation layer 180q is removed by dry etch as shown in FIG. 17. The curing causes reflow of the upper passivation layer 180q and the etch of the lower passivation layer 180p consumes the upper passivation layer 180q such that the contact hole 187 has a rounded and increased sidewalls. The sidewall(s) facing the slit area SA has a relatively slow slope and a large width, while other sidewall(s) have relatively steep slope and small width. In addition, the steep sidewall(s) make an undercut that a portion of the lower passivation layer 180p under the upper passivation layer 180q is removed. Although the undercut at the steep sidewall(s) may cause the disconnection of an overlying layer, the slow sidewall(s) ensures the connections between the expansion 177 of the drain electrode 175 and the overlying layer.

The contact holes 187 may have various shapes shown in FIGS. 3A–7C using various photo masks shown in FIGS. 18–25.

Figure 18:
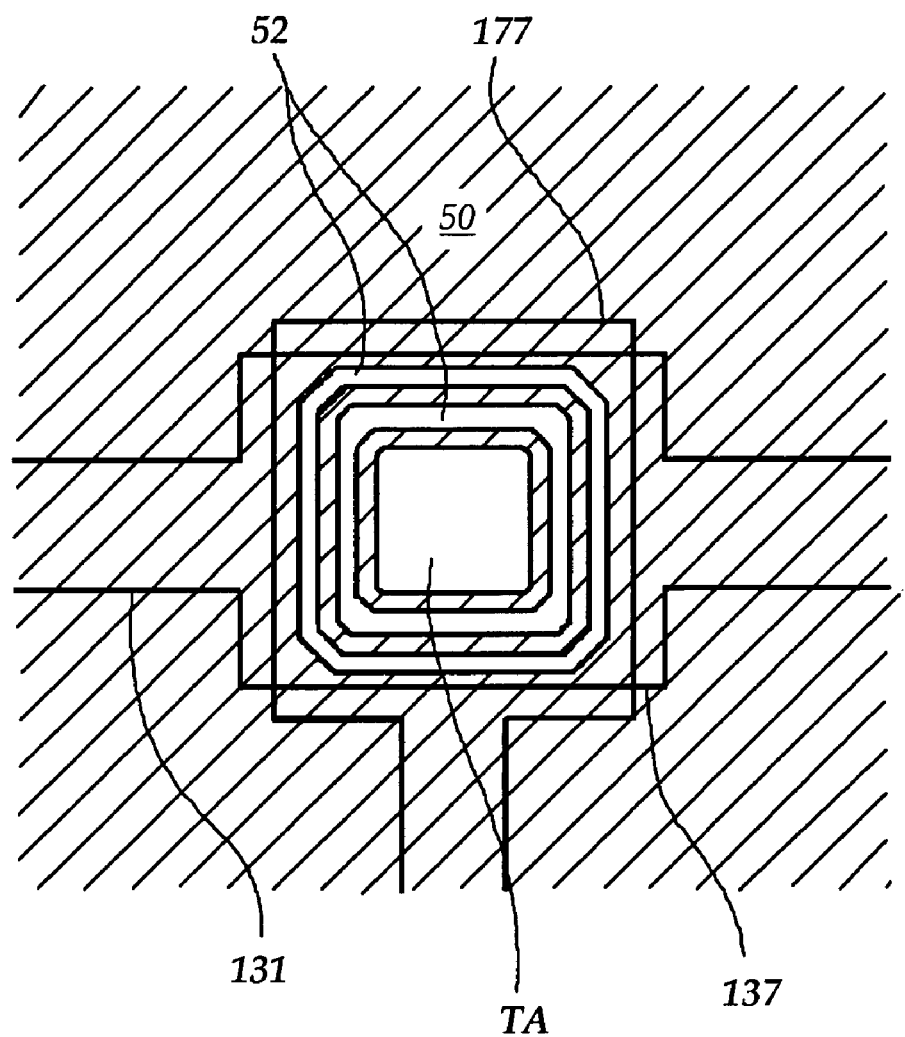
FIGS. 18–25 illustrate various photo masks for forming the contact holes shown in FIGS. 3A–7C.

FIG. 18 shows a photo mask 50 having slits 52 surrounding all edges of the light transmitting area TA for forming the contact hole 187 shown in FIGS. 3A–3C.

Figure 19:
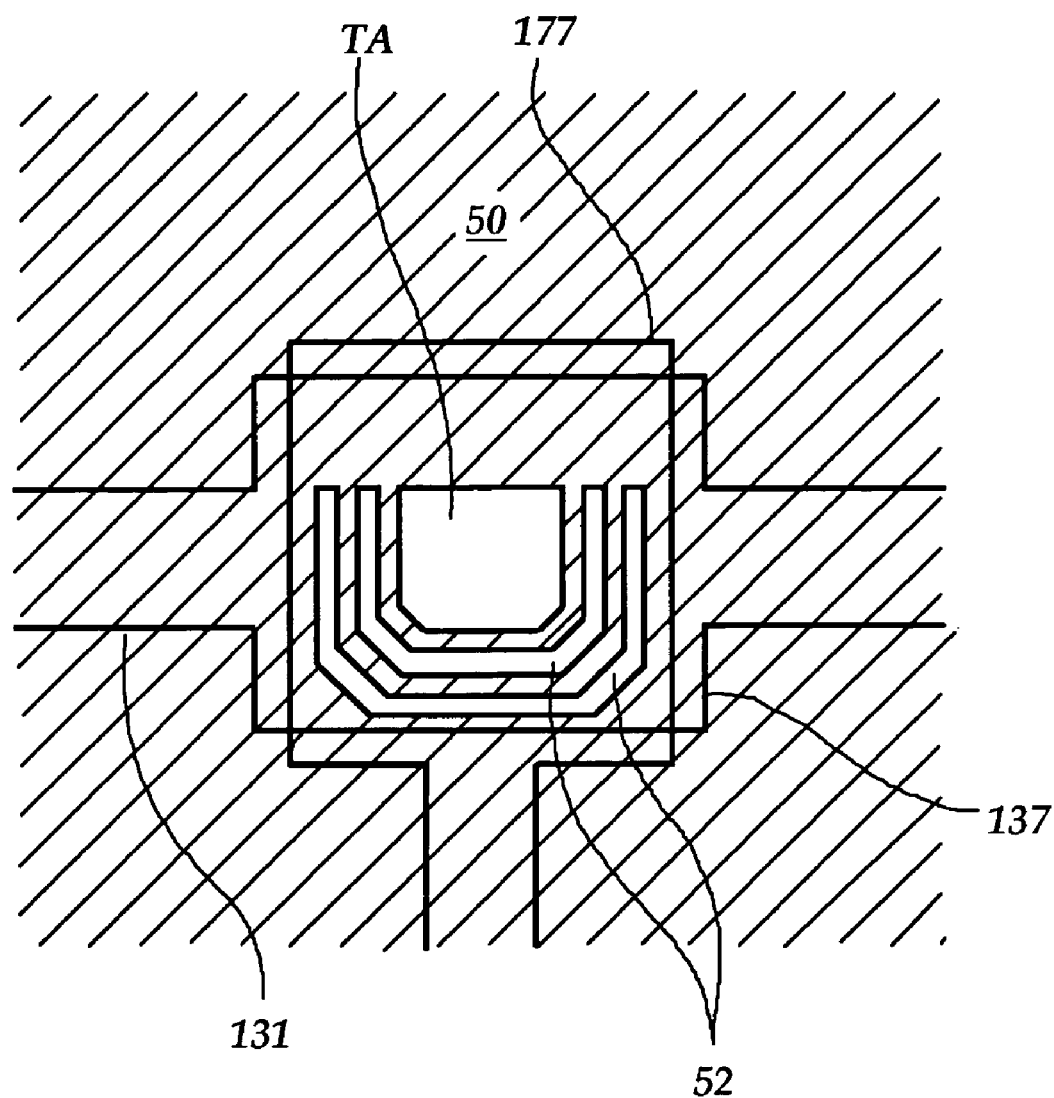
Figure 20:
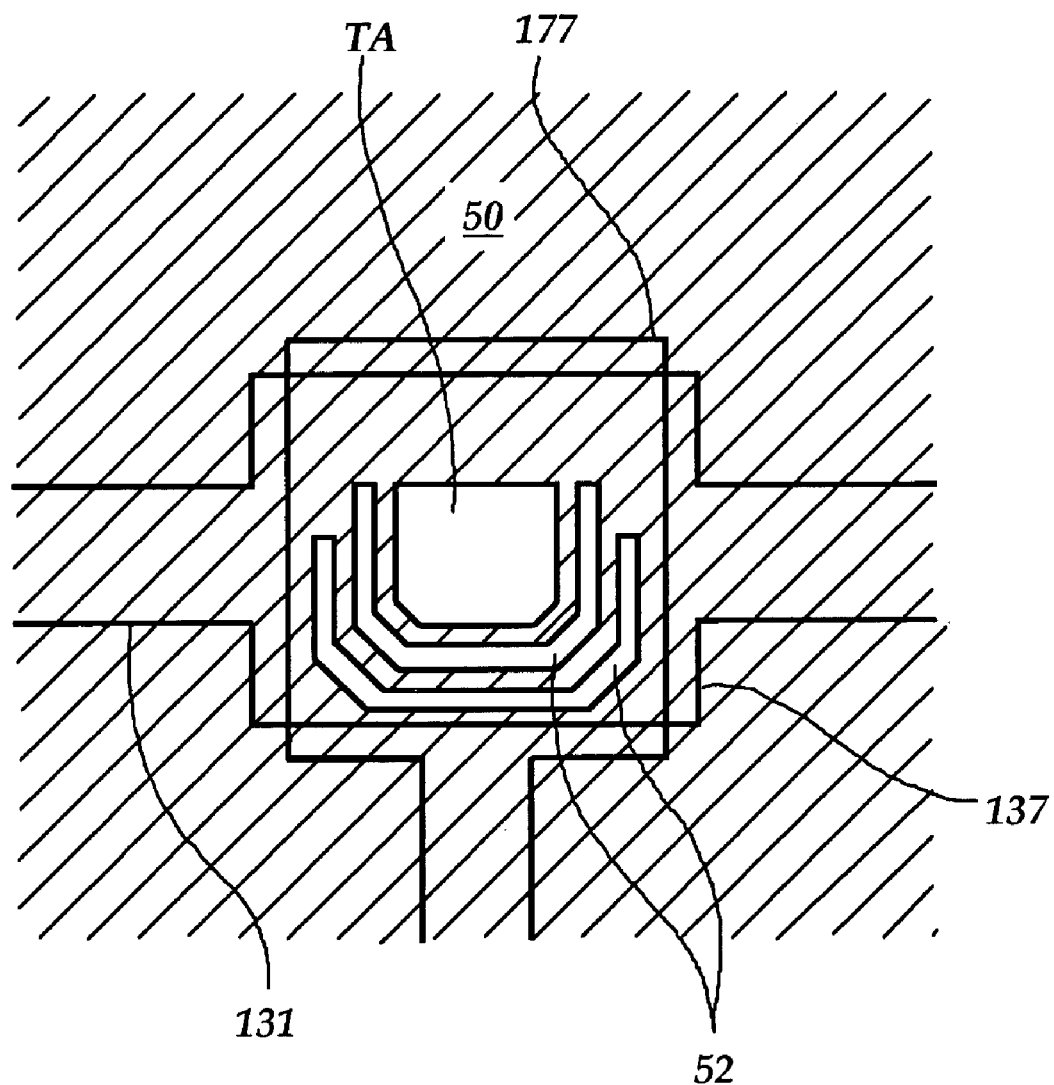

Photo masks 50 shown in FIGS. 19 and 20, which have slits 52 surrounding three edges of the light transmitting area TA, can be used for forming the contact hole 187 shown in FIGS. 4A–4C, and the photo mask 50 shown in FIG. 20 has a long inner slit and a short outer slit may make the upper corners of the contact holes 187 chamfered or rounded to further decrease the size of the contact hole 187.

Figure 21:
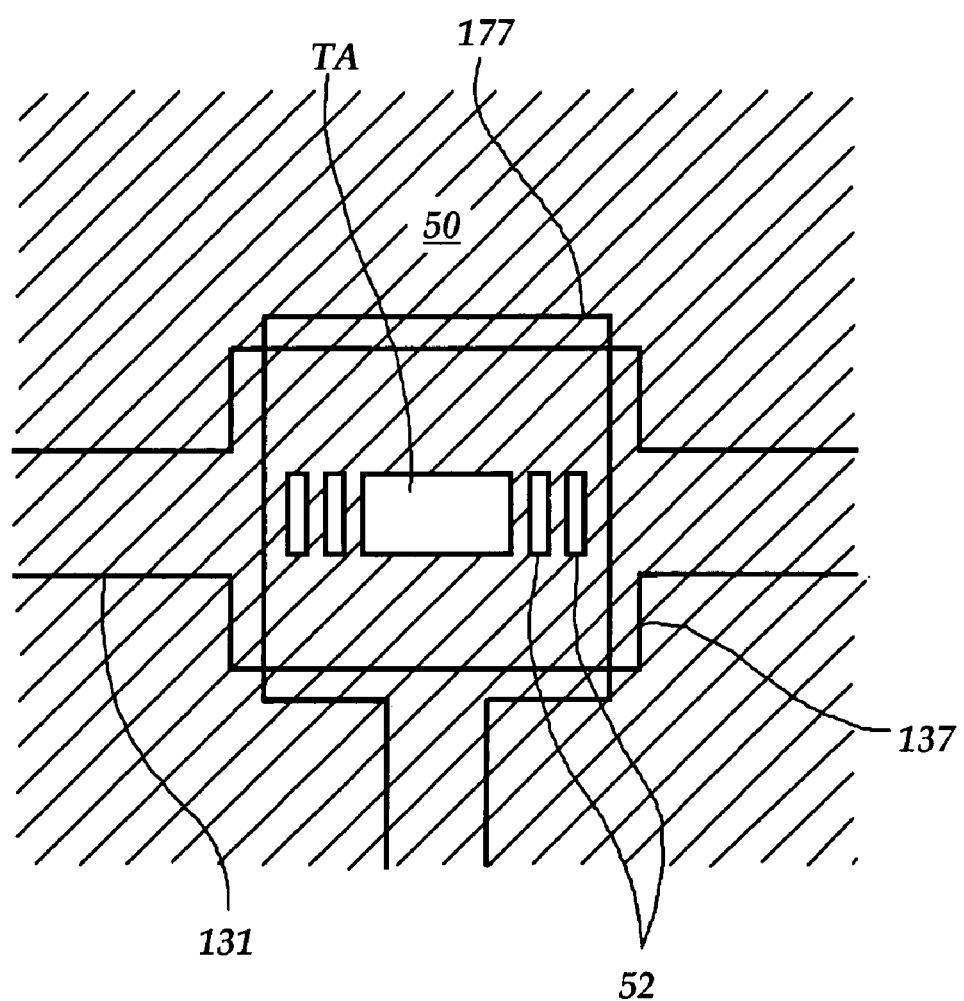
Figure 22:
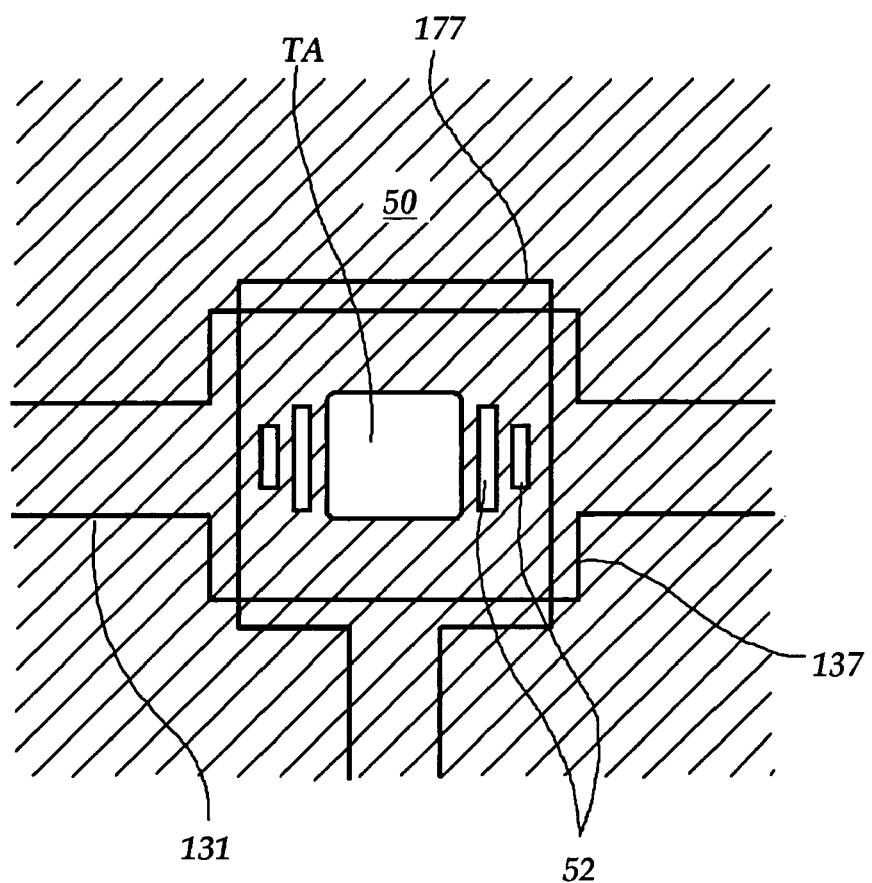
Figure 23:
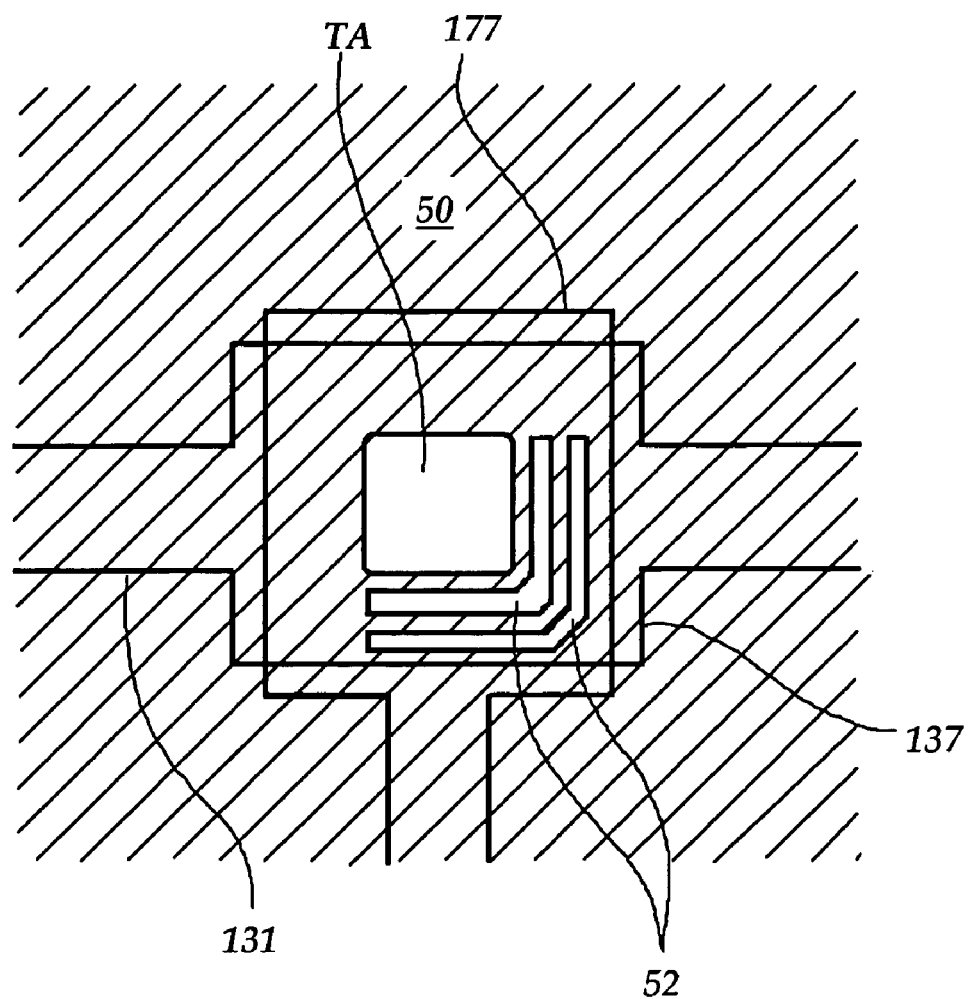

Photo masks 50 shown in FIGS. 21–23 have slits 52 surrounding two three edges of the light transmitting area TA. The slits 52 of the photo masks 50 shown in FIGS. 21 and 22 are disposed opposite each other with respect to the light transmitting area TA, while those shown in FIG. 23 surround adjacent two edges of the light transmitting area TA. The long inner slit and the short outer slit shown in FIG. 22 make the corners of the contact hole 187 rounded or chamfered.

Figure 24:
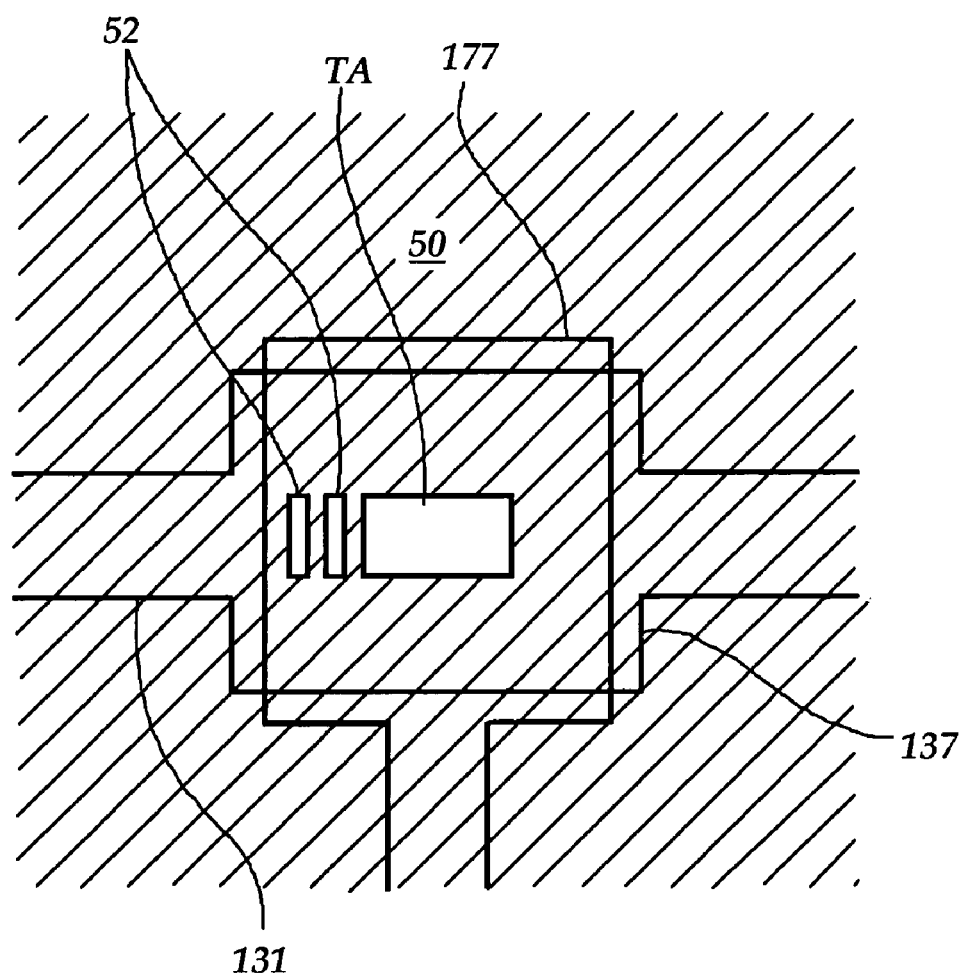
Figure 25:
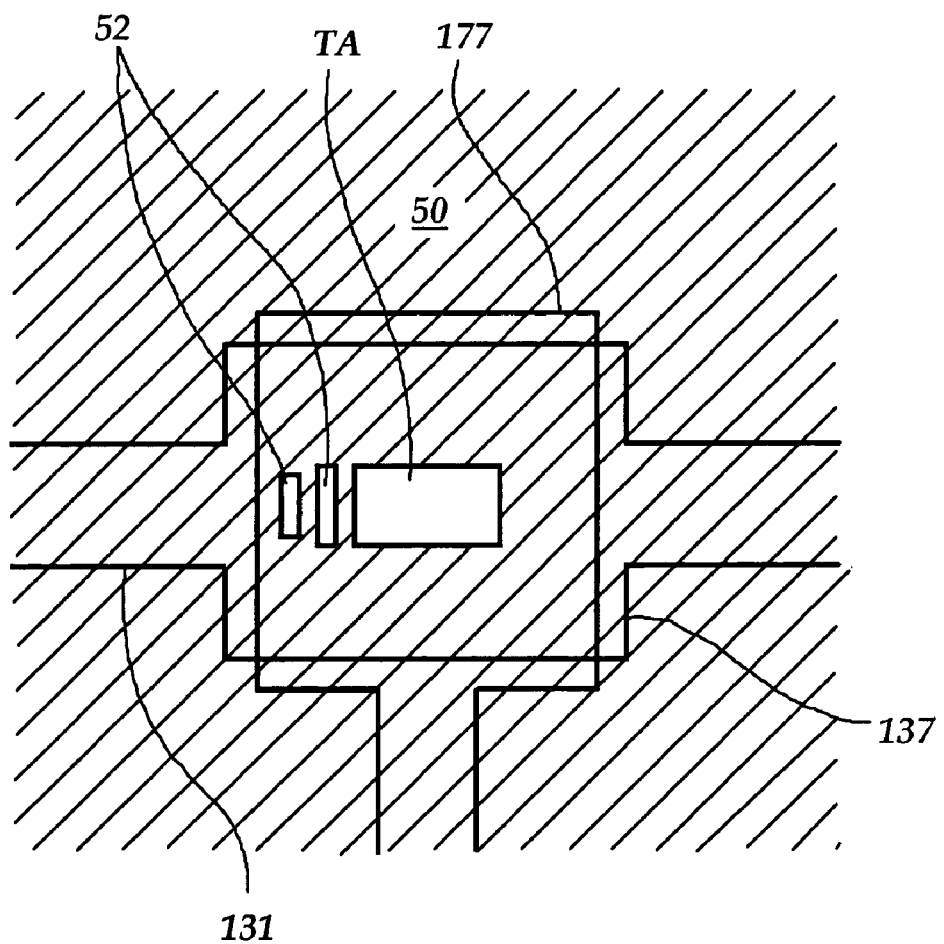

Photo masks 50 shown in FIGS. 24 and 25 have slits 52 surrounding only one edge of the light transmitting area TA and the long inner slit and the short outer slit shown in FIG. 25 make the corners of the contact hole 187 rounded or chamfered.

The other contact holes 181 and 182 may also be formed to have stepped profiles by using the slit areas SA.

Finally, as shown in FIGS. 1 and 2, a plurality of pixel electrodes 190 and a plurality of contact assistants 81 and 82 are formed on the upper passivation layer 180q by sputtering and photo-etching an ITO or IZO layer.

An LCD according to another embodiment of the present invention will be described in detail with reference to FIGS. 26 and 27.

Figure 26:
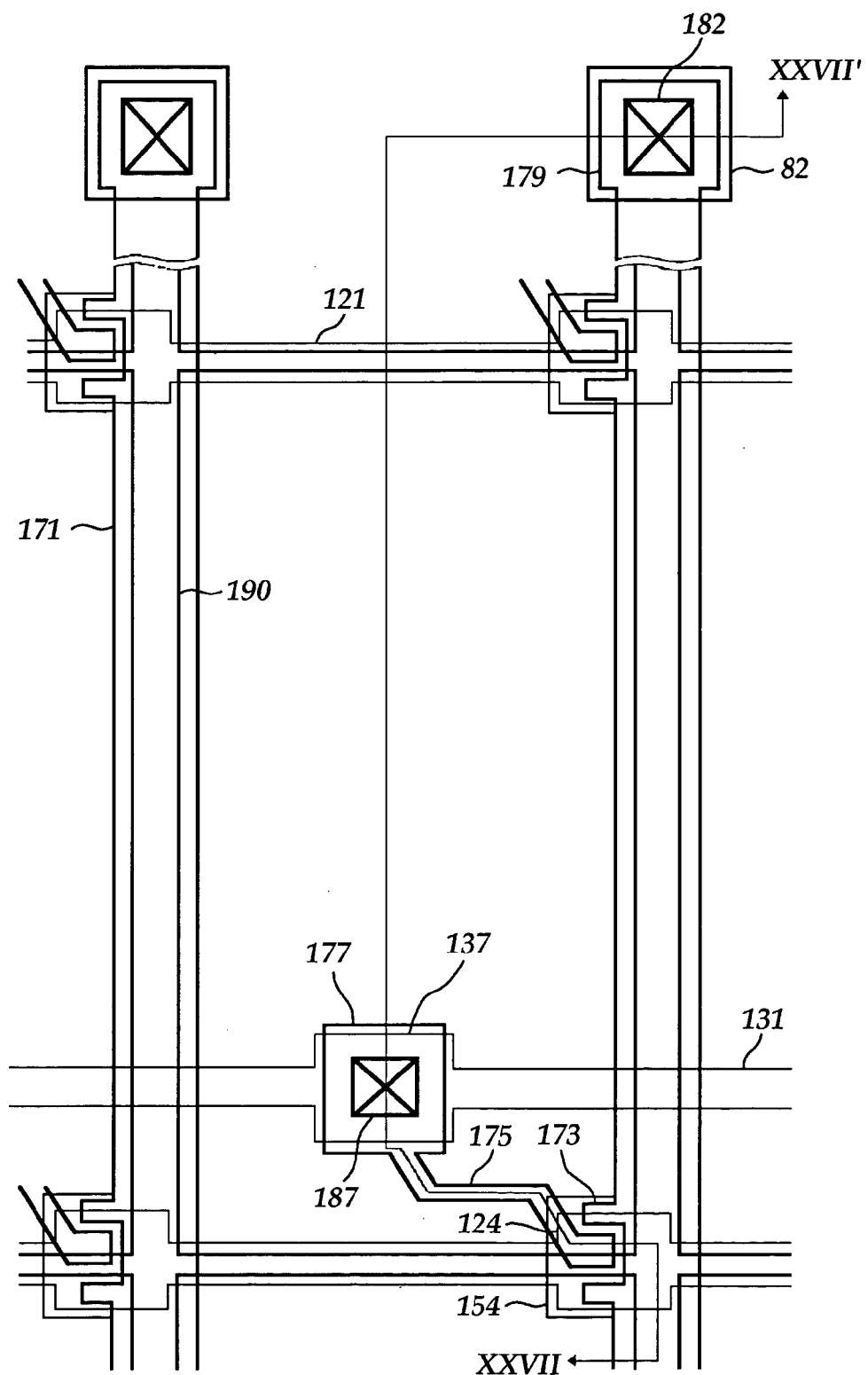
FIG. 26 is a layout view of a TFT array panel for an LCD according to another embodiment of the present invention.
Figure 27:
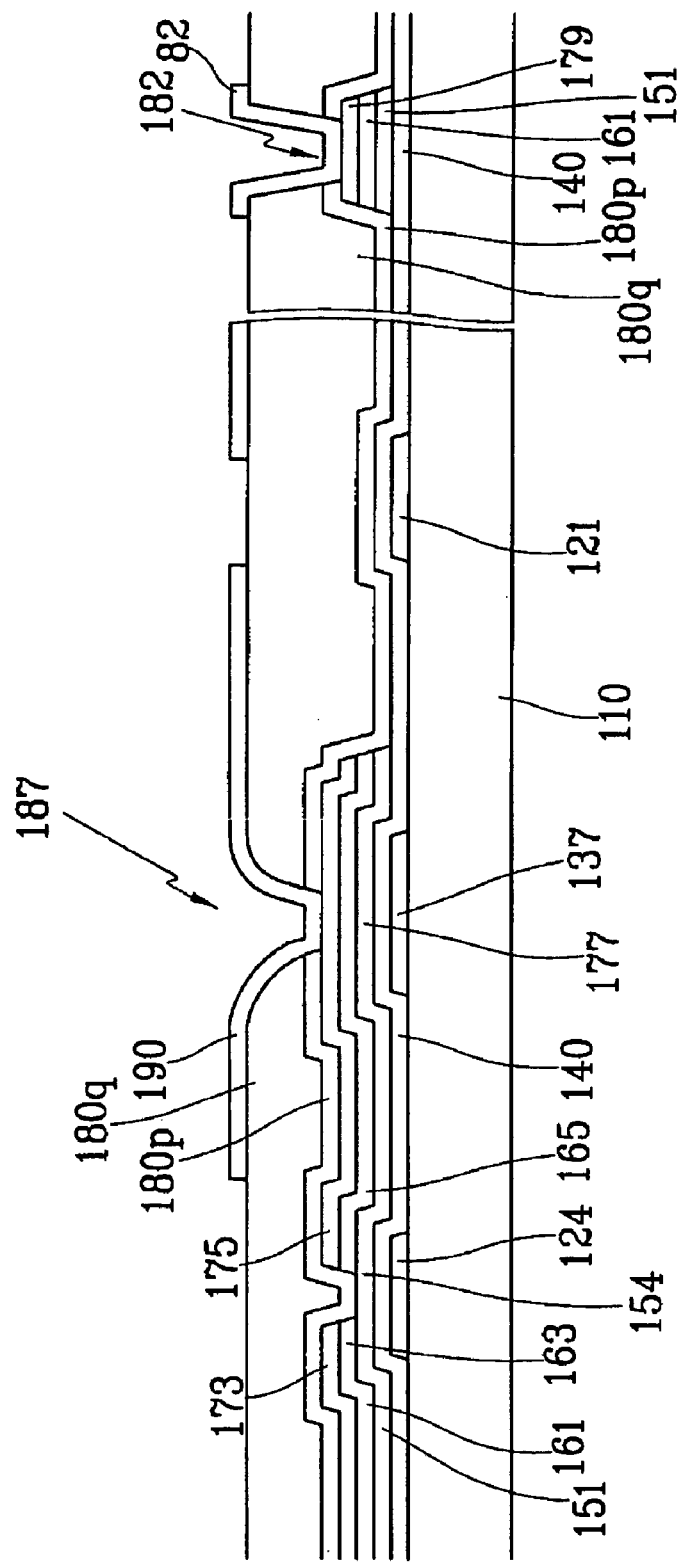
FIG. 27 is a sectional view of an LCD including the TFT array panel shown in FIG. 26 taken along the line XXVII–XXVII'.

FIG. 26 is a layout view of a TFT array panel for an LCD according to another embodiment of the present invention, and FIG. 27 is a sectional view of an LCD including the TFT array panel shown in FIG. 26 taken along the line XXVI-I–XXVII'.

Referring to FIGS. 26 and 27, a TFT array panel according to this embodiment has a layered structure almost the same as those shown in FIGS. 1 and 2. In detail, a plurality of gate lines 121 including a plurality of gate electrodes 124 and a plurality of storage electrode lines 131 including a plurality of expansions 137 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 including expansions 177 are formed on the ohmic contacts 161 and 165, and lower and upper passivation layers 180p and 180q are formed thereon. A plurality of contact holes 182 and 187 are provided at the passivation layers 180p and 180q, and a plurality of pixel electrodes 190 and a plurality of contact assistants 82 are formed on the upper passivation layer 180q.

Different from the TFT array panel shown in FIGS. 1 and 2, the semiconductor stripes 151 have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

In addition, there is no contact hole exposing the gate lines 121 and no contact assistants thereon. The gate lines 121 may be directly connected to a gate driving circuit integrated on the substrate 110 along with the signal lines 121 and 171 and the electrodes 124, 173 and 175. However, there may be provided a plurality of contact holes (not shown) at the passivation layers 180p and 180q, and a plurality of connection members (not shown) may be provided on the upper passivation layer 180q for connection with other elements of the gate driving circuit.

A manufacturing method of the TFT array panel according to an embodiment simultaneously forms the data lines 171, the drain electrodes 175, the semiconductors 151, and the ohmic contacts 161 and 165 using one photolithography process.

A photoresist pattern for the photolithography process has position-dependent thickness, and in particular, it has first and second portions with decreased thickness. The first portions are located on wire areas that will be occupied by the data lines 171 and the drain electrodes 175 and the second portions are located on channel areas of TFTs.

The position-dependent thickness of the photoresist is obtained by several techniques, for example, by providing translucent areas on the exposure mask 300 as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

As a result, the manufacturing process is simplified by omitting a photolithography step.

Many of the above-described features of the TFT array panel for an LCD shown in FIGS. 1 and 2 may be appropriate to the TFT array panel shown in FIGS. 26 and 27.

An LCD according to another embodiment of the present invention will be described in detail with reference to FIGS. 28 and 29.

Figure 28:
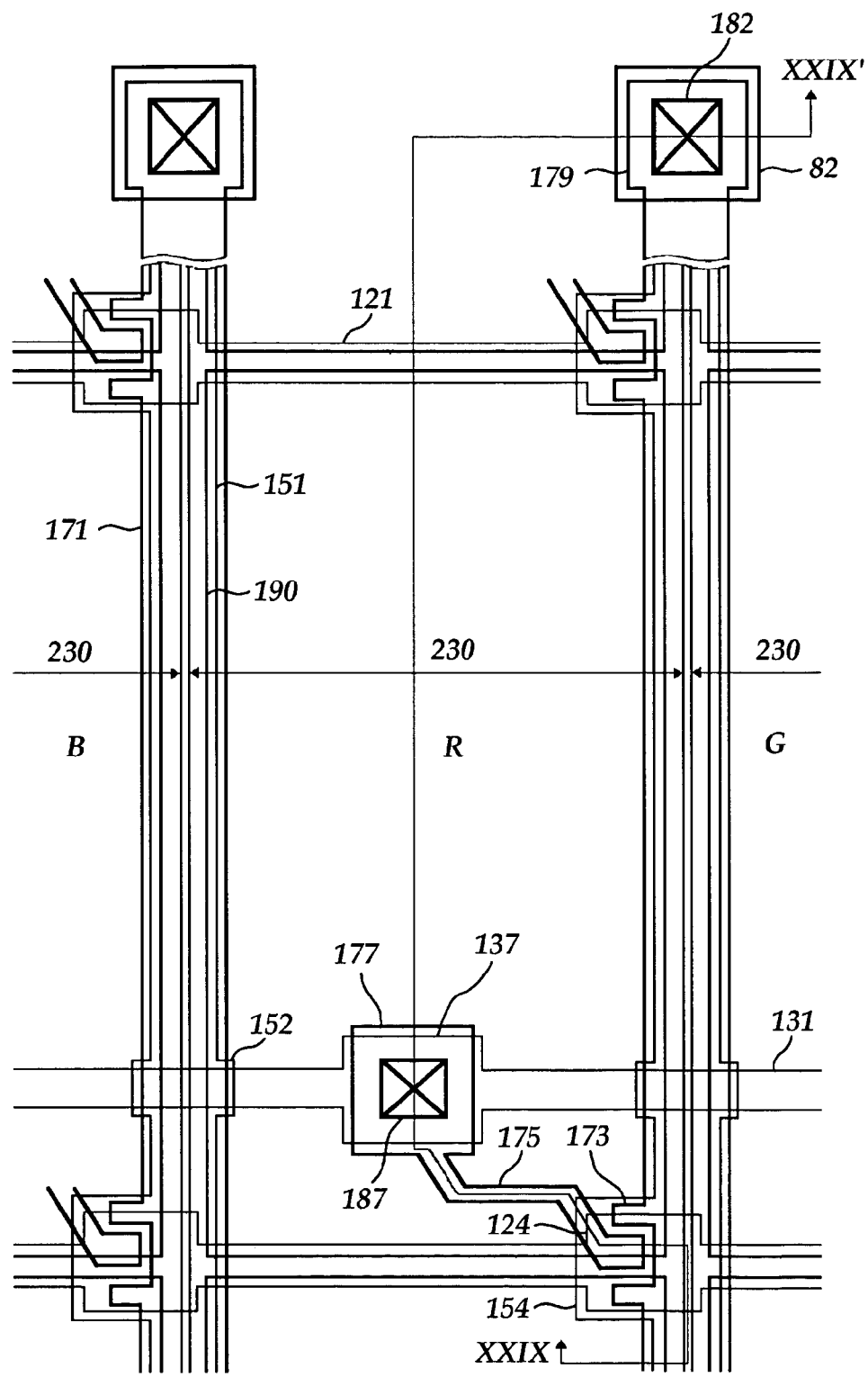
FIG. 28 is a layout view of a TFT array panel for an LCD according to another embodiment of the present invention.
Figure 29:
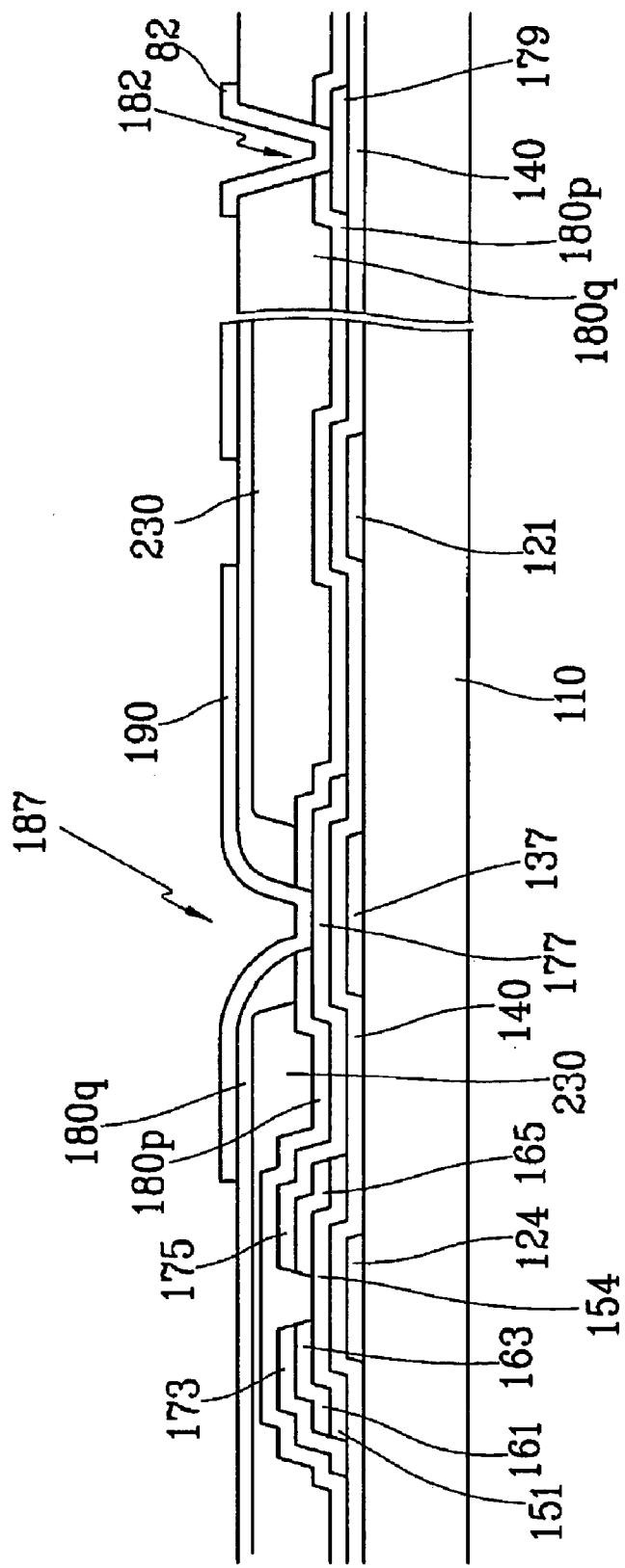
FIG. 29 is a sectional view of an LCD including the TFT array panel shown in FIG. 28 taken along the line XXIX–XXIX'.

FIG. 28 is a layout view of a TFT array panel for an LCD according to another embodiment of the present invention, and FIG. 29 is a sectional view of an LCD including the TFT array panel shown in FIG. 28 taken along the line XXIX–XXIX'.

Referring to FIGS. 28 and 29, a TFT array panel according to this embodiment has a layered structure almost the same as those shown in FIGS. 1 and 2. In detail, a plurality of gate lines 121 including a plurality of gate electrodes 124 and a plurality of storage electrode lines 131 including a plurality of expansions 137 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 including expansions 177 are formed on the ohmic contacts 161 and 165, and lower and upper passivation layers 180p and 180q are formed thereon. A plurality of contact holes 182 and 187 are provided at the passivation layers 180p and 180q, and a plurality of pixel electrodes 190 and a plurality of contact assistants 82 are formed on the upper passivation layer 180q.

Different from the TFT array panel shown in FIGS. 1 and 2, a plurality of color filters 230 preferably representing red (R), green (G), and blue (B) colors are formed between the lower passivation layer 180p and the upper passivation layer 180q. Each of the color filters 230 are disposed substantially between adjacent two the data lines 171 and extends in a longitudinal direction. The color filters 230 are not disposed on a peripheral area that is provided with the expansions 179 of the data lines 171, and the color filters 230 are not disposed or have openings at the contact holes 187. Edges of adjacent color filter stripes R, G and B are spaced apart from each other, but they may overlap each other.

In addition, there is no contact hole exposing the gate lines 121 and no contact assistants thereon.

Many of the above-described features of the TFT array panel for an LCD shown in FIGS. 1 and 2 may be appropriate to the TFT array panel shown in FIGS. 28 and 29.

An LCD according to another embodiment of the present invention will be described in detail with reference to FIGS. 30 and 31.

Figure 30:
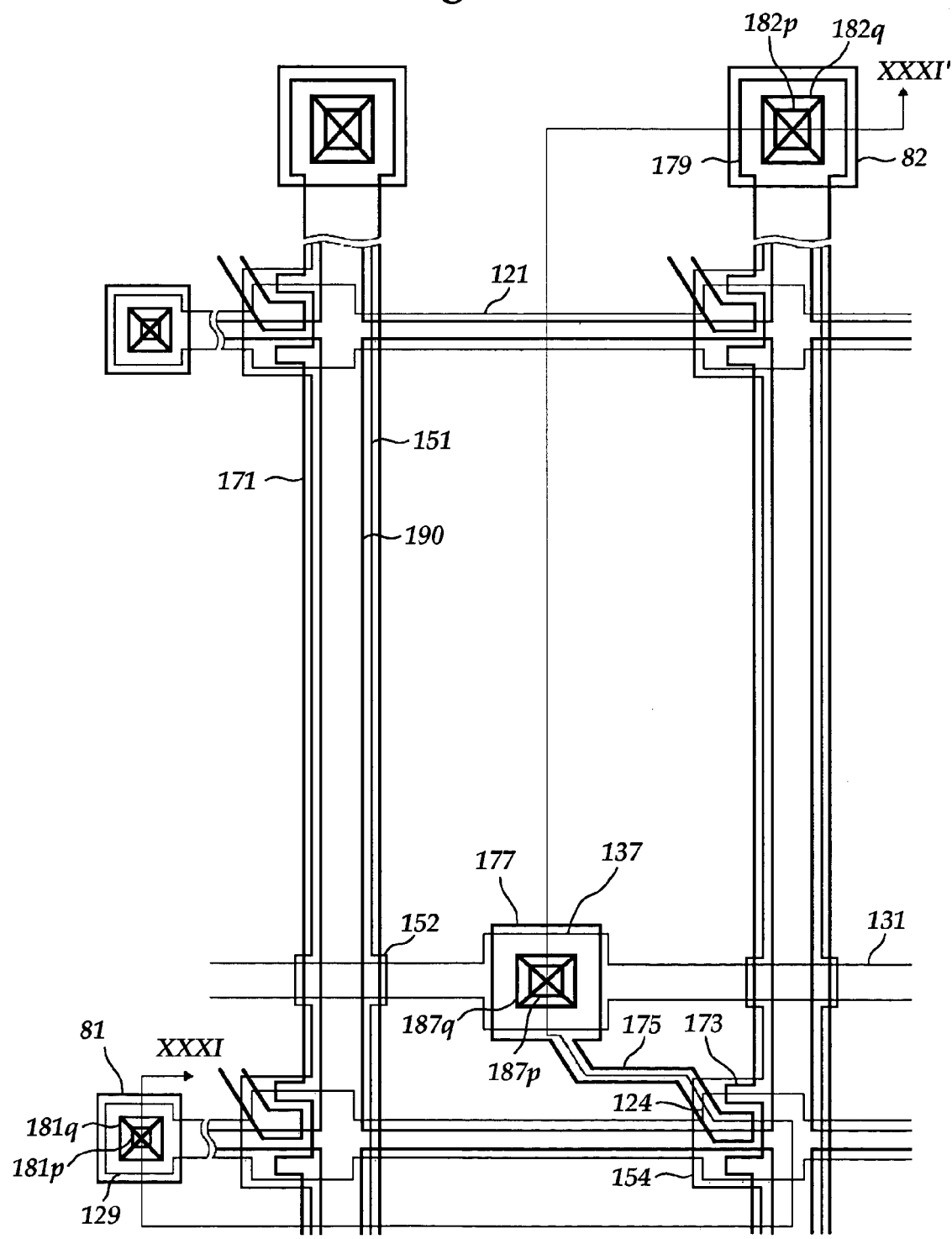
FIG. 30 is a layout view of a TFT array panel for an LCD according to another embodiment of the present invention.
Figure 31:
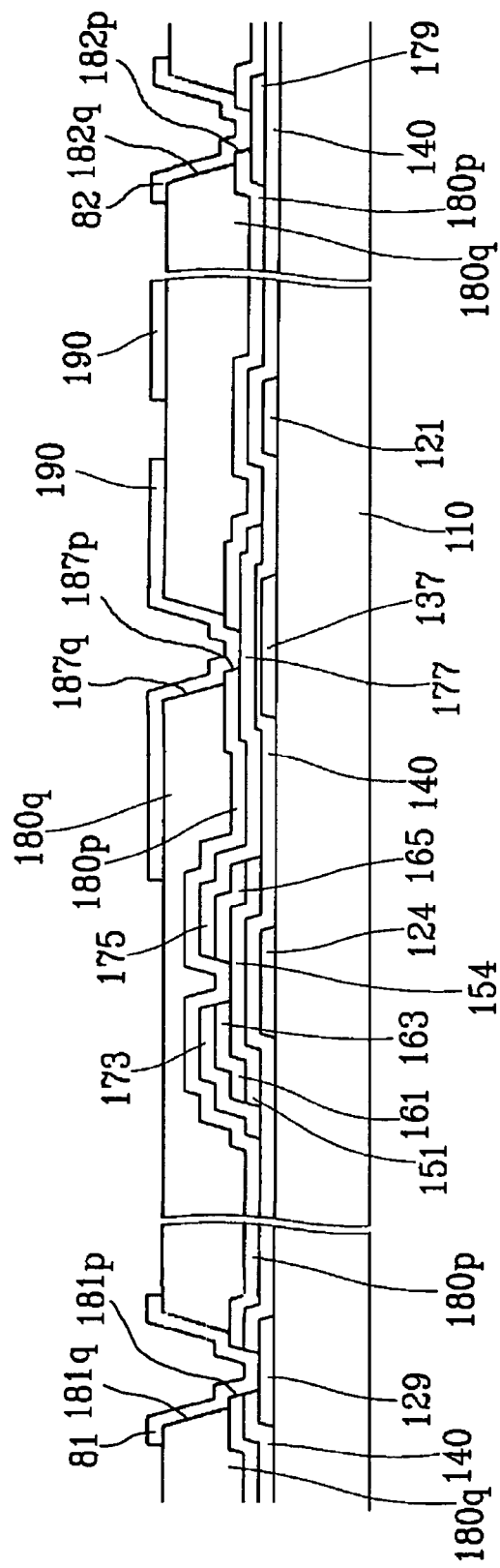
FIG. 31 is a sectional view of an LCD including the TFT array panel shown in FIG. 30 taken along the line XXXI–XXXI'.

FIG. 30 is a layout view of a TFT array panel for an LCD according to another embodiment of the present invention, and FIG. 31 is a sectional view of an LCD including the TFT array panel shown in FIG. 30 taken along the line XXXI–XXXI'.

Referring to FIGS. 30 and 31, a TFT array panel according to this embodiment has a layered structure almost the same as those shown in FIGS. 1 and 2. In detail, a plurality of gate lines 121 including a plurality of gate electrodes 124 and a plurality of storage electrode lines 131 including a plurality of expansions 137 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 including expansions 177 are formed on the ohmic contacts 161 and 165, and lower and upper passivation layers 180p and 180q are formed thereon. A plurality of contact holes 181p, 181q, 182p, 182q, 187p and 187q are provided at the passivation layers 180p and 180q and the gate insulating layer 140, and a plurality of pixel electrodes 190 and a plurality of contact assistants 81 and 82 are formed on the upper passivation layer 180q.

It is noted that the contact holes at the lower passivation layer 180p and the upper passivation layer 180q are differently illustrated and indicated by different reference numerals in the figures for showing the stepped profiles of the contact holes.

Different from the TFT array panel shown in FIGS. 1 and 2, portions of the gate insulating layer 140 disposed between the expansions 137 of the storage electrode lines 131 and the expansions 177 of the drain electrodes 175 have thickness smaller than other portions of the gate insulating layer 140 as shown in FIG. 31. Accordingly, the distance between the expansions 137 and 177 is decreased such that the storage capacitance therebetween is increased without scarifying the aperture ratio. In addition, the aperture ratio can be increased by further thinning the gate insulating layer 140 and by decreasing the sizes of the expansions 137 and 177.

Many of the above-described features of the TFT array panel for an LCD shown in FIGS. 1 and 2 may be appropriate to the TFT array panel shown in FIGS. 30 and 31.

A method of manufacturing the TFT array panel shown in FIGS. 30 and 31 according to an embodiment of the present invention will be now described in detail with reference to FIGS. 32–39 as well as FIGS. 30 and 31.

FIGS. 32, 34, 36 and 38 are layout views of the TFT array panel shown in FIGS. 30 and 31 in intermediate steps of a manufacturing method thereof according to an embodiment of the present invention, and FIGS. 33, 35, 37 and 39 are sectional views of the TFT array panel shown in FIGS. 32, 34, 36 and 38 taken along the lines XXXIII–XXXIII', XXXV–XXXV', XXXVII–XXXVII', and XXXIX–XXXIX', respectively.

Figure 32:
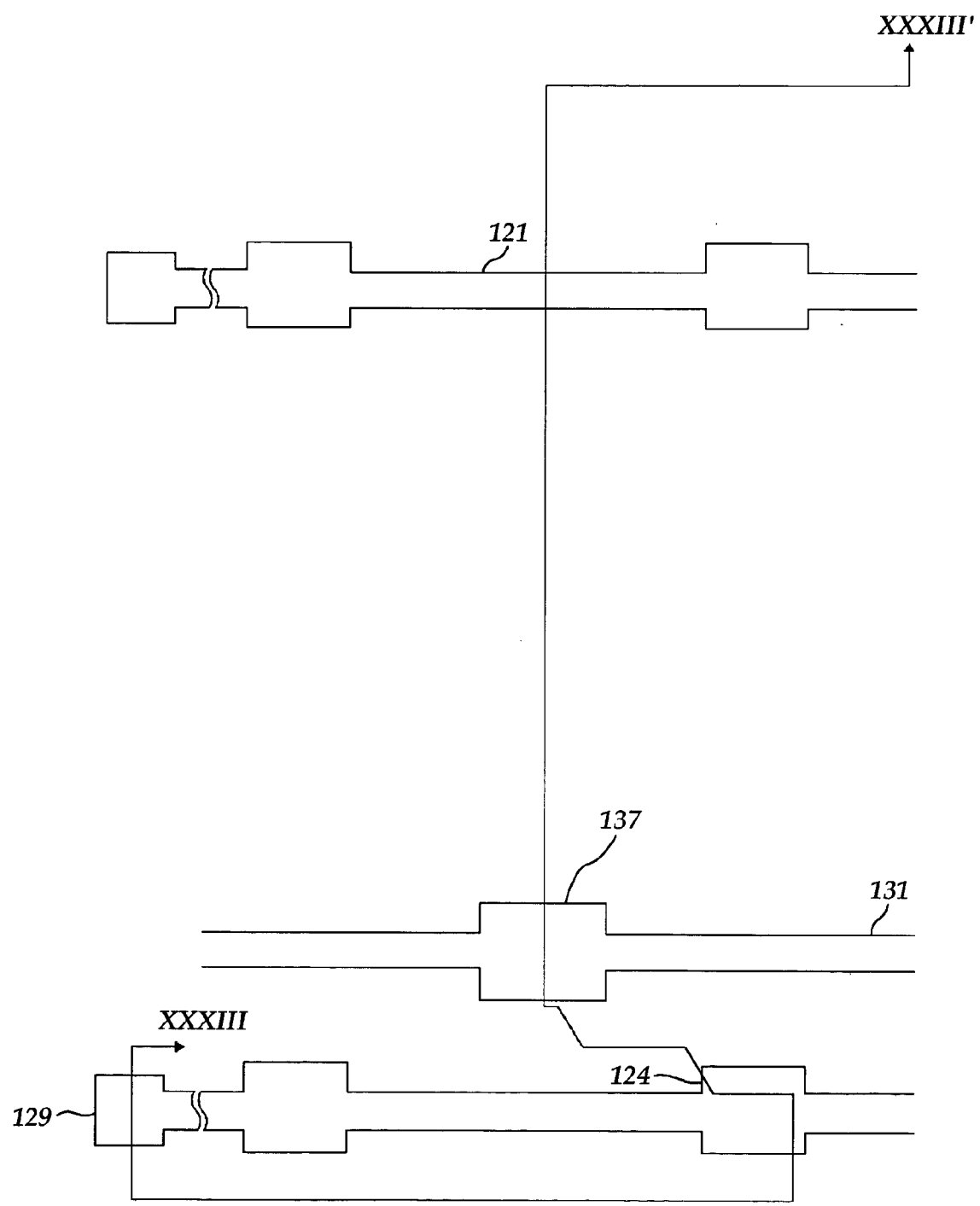
FIGS. 32, 34, 36 and 38 are layout views of the TFT array panel shown in FIGS. 30 and 31 in intermediate steps of a manufacturing method thereof according to an embodiment of the present invention.
Figure 33:
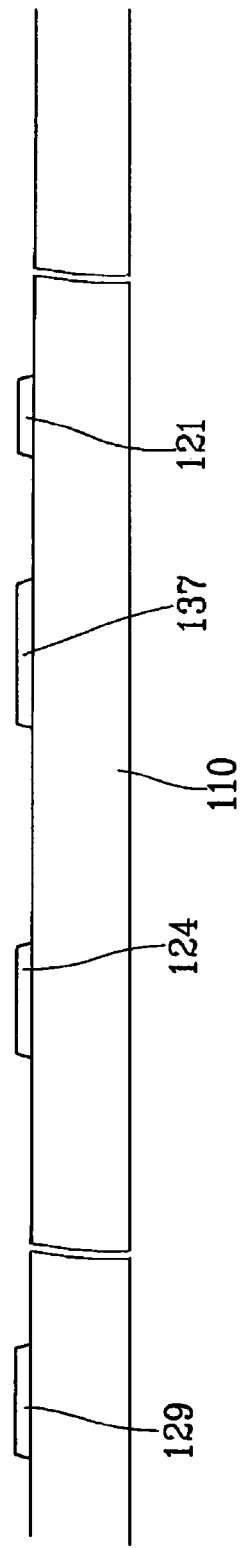
FIGS. 33, 35, 37 and 39 are sectional views of the TFT array panel shown in FIGS. 32, 34, 36 and 38 taken along the lines XXXIII–XXXIII', XXXV–XXXV', XXXVII–XXXVII', and XXXIX–XXXIX', respectively.

Referring to FIGS. 32 and 33, conductive film(s) preferably made of Cr, Mo, Al, Ag, and alloys thereof is sputtered on an insulating substrate 110 such as transparent glass. The conductive film is patterned by photo-etching with dry etch or wet etch to form a plurality of gate lines 121 including a plurality of gate electrodes 124 and a plurality of storage electrode lines 131 including a plurality of expansions 137. The edge profiles of the gate lines 121 and the storage electrode lines 131 are tapered for good attachment of overlying layers.

Figure 34:
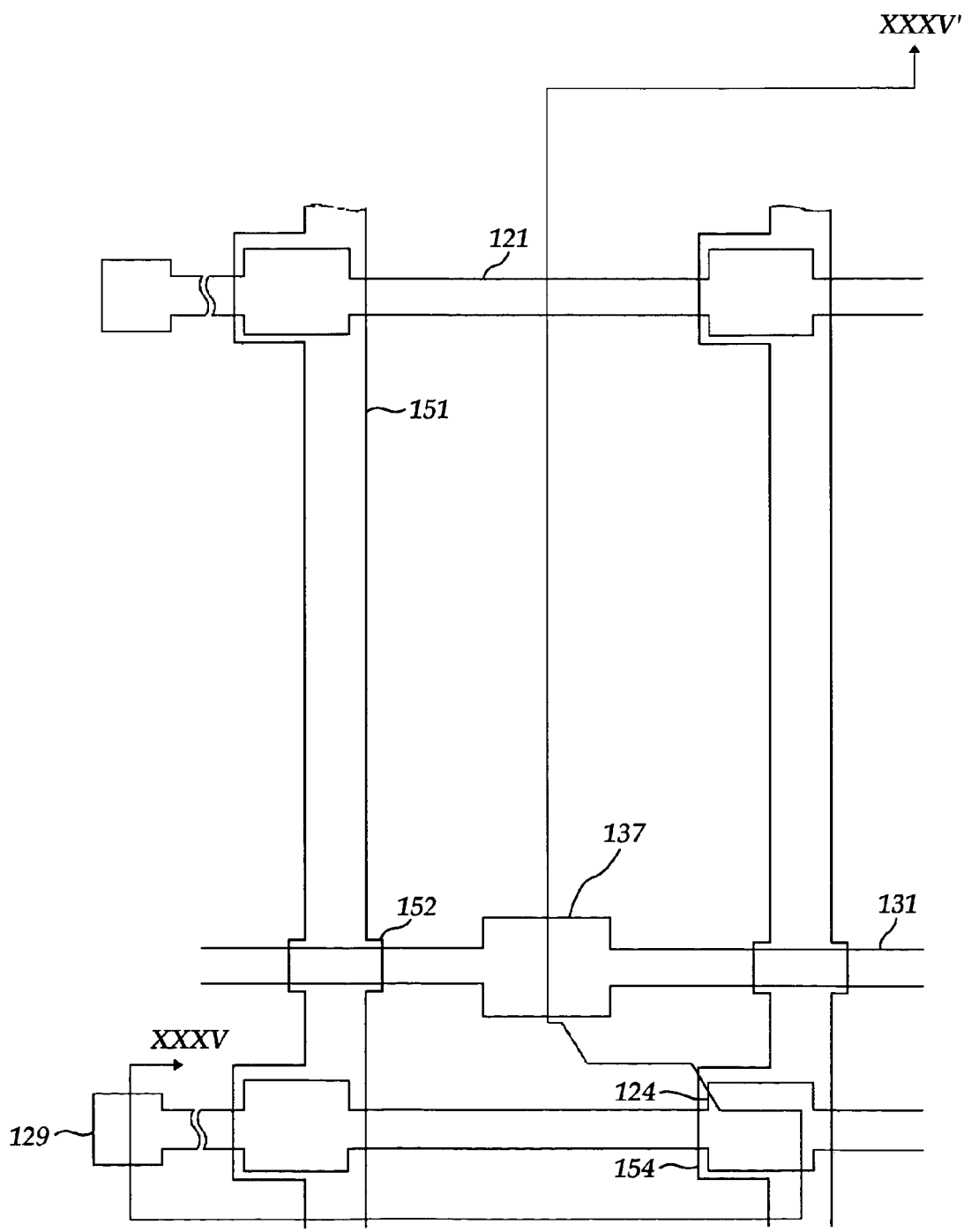
Figure 35:
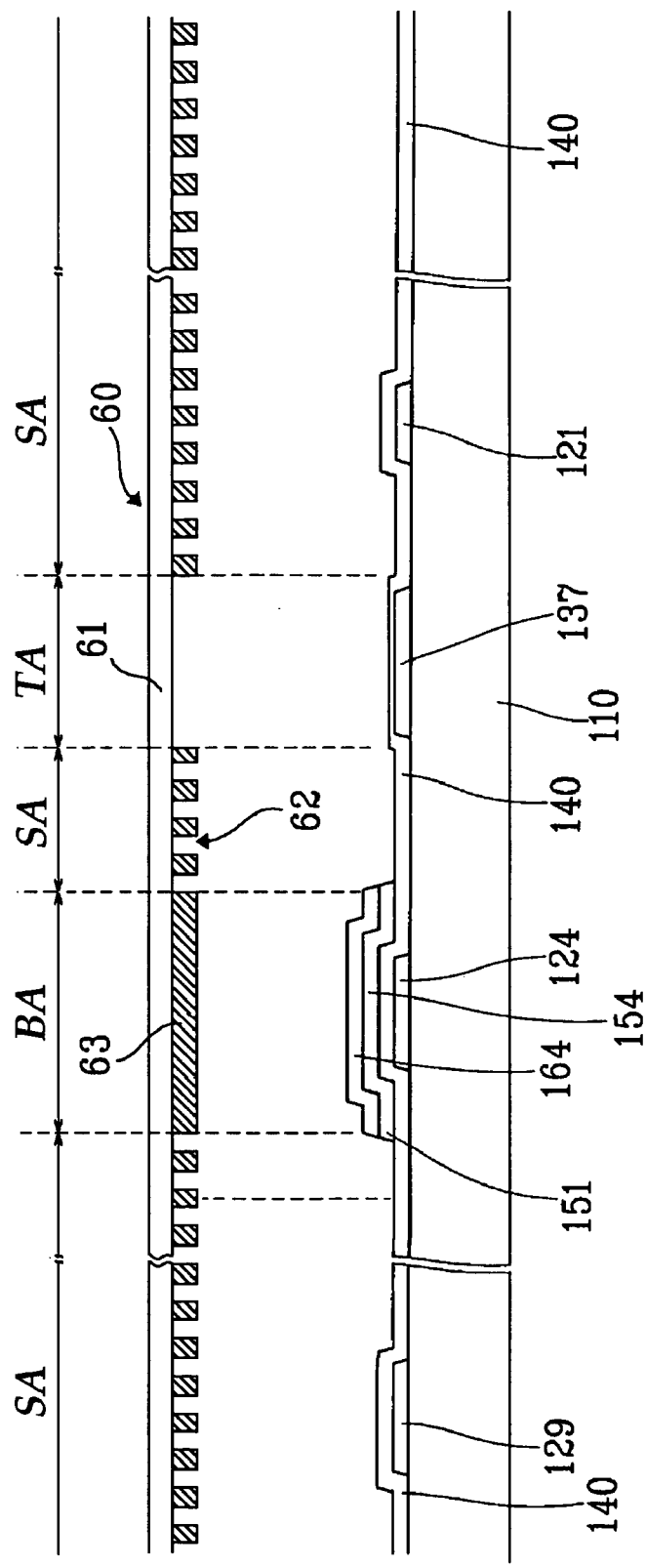

Referring to FIGS. 34 and 35, after sequential deposition of a gate insulating layer 140 preferably made of silicon nitride or silicon oxide, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

In detail, the gate insulating layer 140, the intrinsic a-Si layer, and the extrinsic a-Si layer are deposited and a photoresist (not shown) is coated on the extrinsic a-Si layer. A photo mask 60 having a plurality of light transmitting areas TA, a plurality of slit areas SA, and a plurality of light blocking areas BA is aligned with the substrate 110 as shown in FIG. 35. The photo mask 60 includes a transparent substrate 61 and a plurality of opaque members 63, and the slit area SA has a plurality of slits 62. The light transmitting areas TA face the expansions 137 of the storage electrode lines 131, the light blocking areas BA face the semiconductor stripes 151 and 164, and the slit areas SA face the remaining areas of the TFT array panel. The photoresist is exposed to light thorough the photo mask 60 and developed to have a position dependent thickness. In particular, portions of the photoresist facing the slit areas SA have a thickness smaller than portions facing the light blocking areas BA. Appropriate etches can make the portions of the gate insulating layer on the expansions 137 to have a thickness smaller than other portions.

Figure 36:
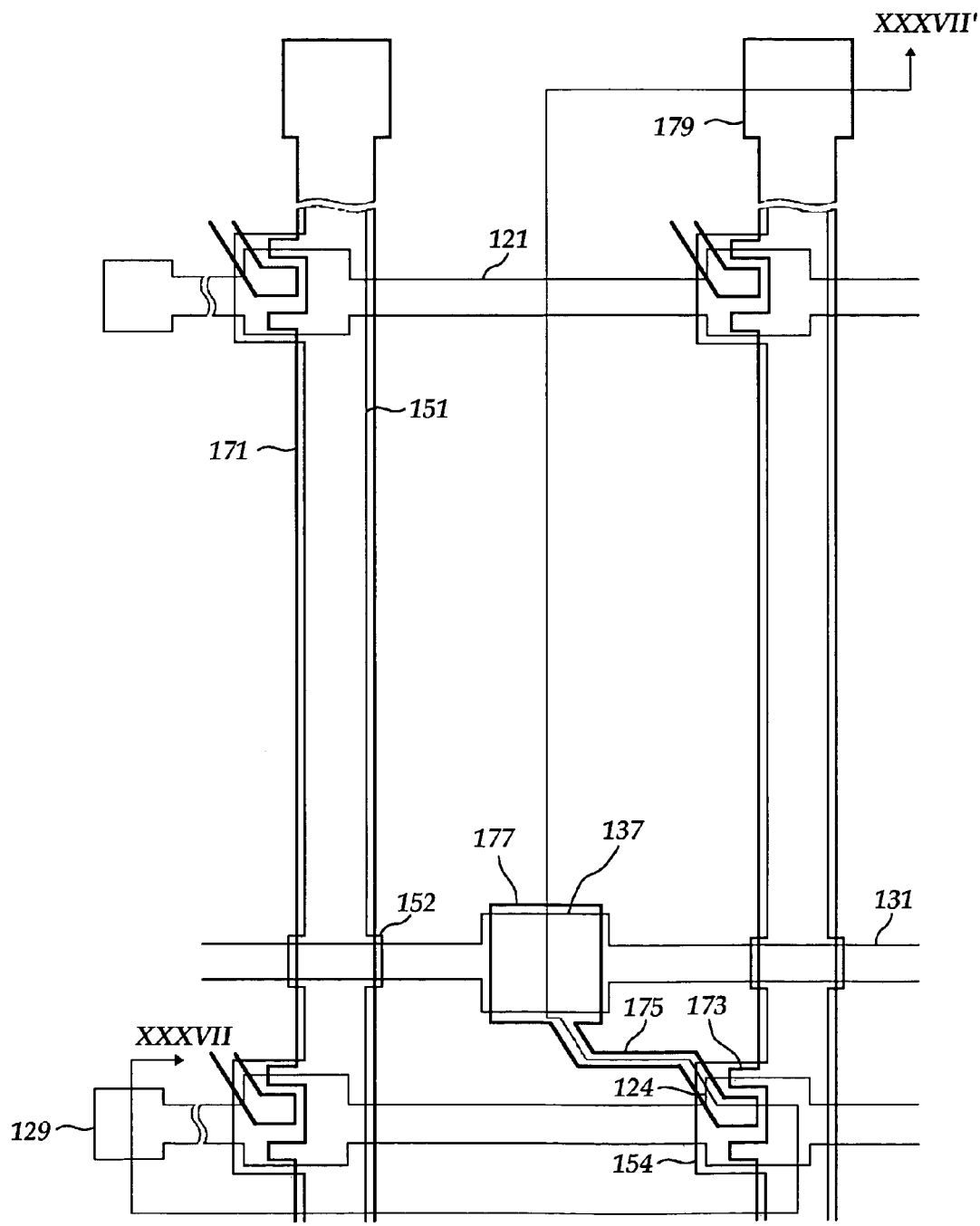
Figure 37:
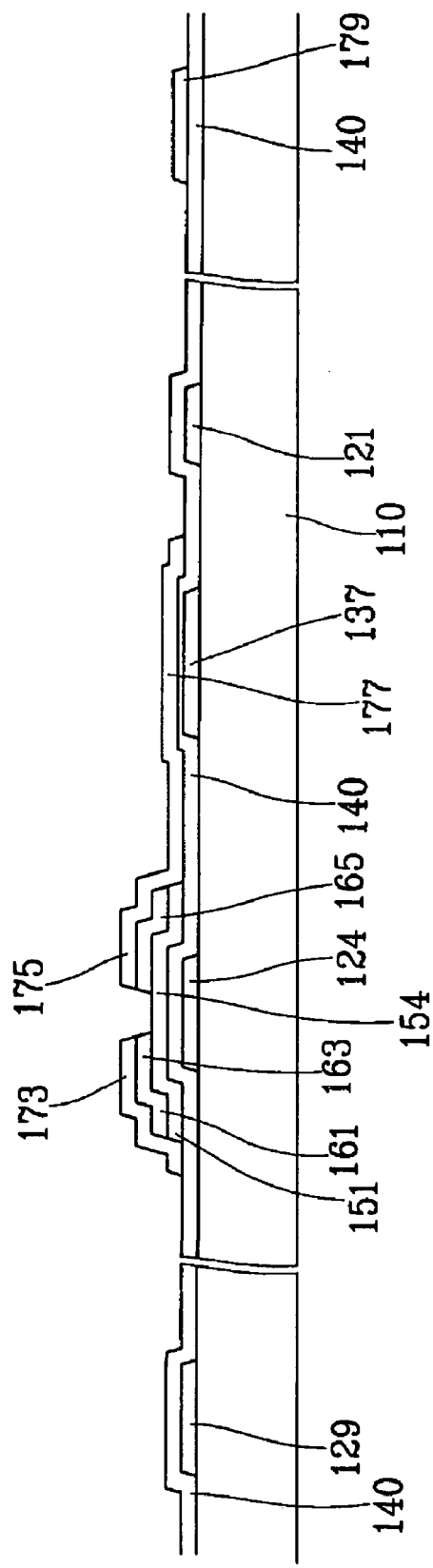

Referring to FIGS. 36 and 37, a conductive layer is sputtered and photo-etched to form a plurality of data lines 171 including a plurality of source electrodes 173 and a plurality of drain electrodes 175. Thereafter, portions of the extrinsic semiconductor stripes 164, which are not covered with the data lines 171 and the drain electrodes 175, are removed by etch to complete a plurality of ohmic contact stripes 161 including a plurality of projections 163 and a plurality of ohmic contact islands 165 and to expose portions of the intrinsic semiconductor stripes 151.

Figure 38:
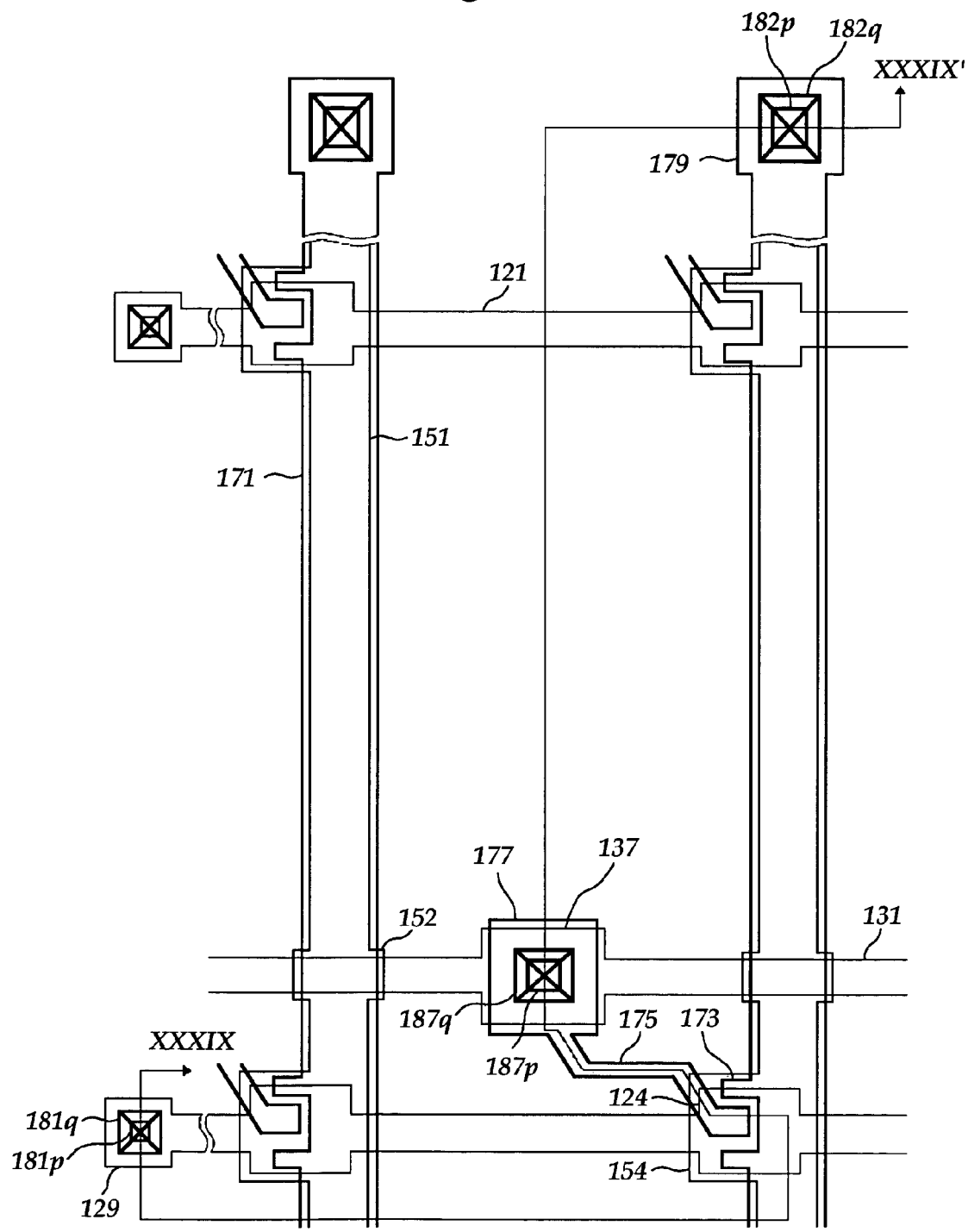
Figure 39:
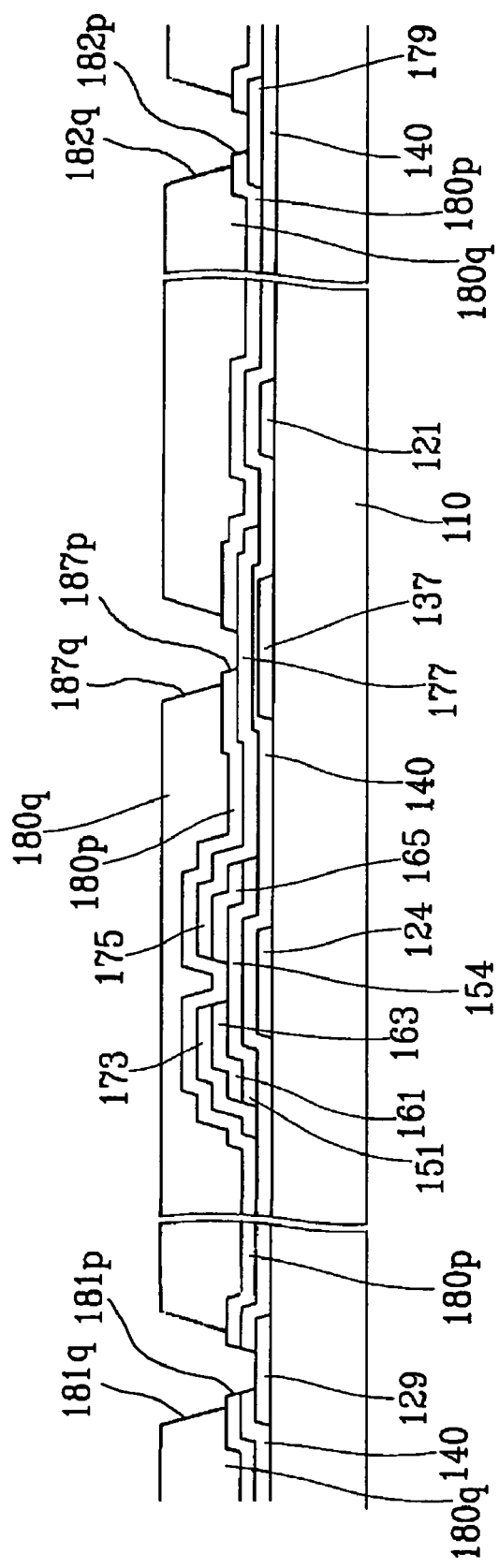

Referring to FIGS. 38 and 39, a lower passivation layer 180p preferably made of silicon nitride or silicon oxide and an upper passivation layer 180q preferably made of photosensitive organic insulator are deposited and etched along with the gate insulating layer 140 to form a plurality of contact holes 181p, 181q, 182p, 182q, 187p and 187q exposing the end portions 129 of the gate lines 121, the end portions 179 of the data lines 171, and the expansions of the drain electrodes 175. The stepped profiles of the contact holes can be made by the steps described above with reference to FIGS. 16 and 17.

Finally, as shown in FIGS. 30 and 31, a plurality of pixel electrodes 190 and a plurality of contact assistants 81 and 82 are formed on the upper passivation layer 180q by sputtering and photo-etching an ITO or IZO layer.

An LCD according to another embodiment of the present invention will be described in detail with reference to FIGS. 40 and 41.

Figure 40:
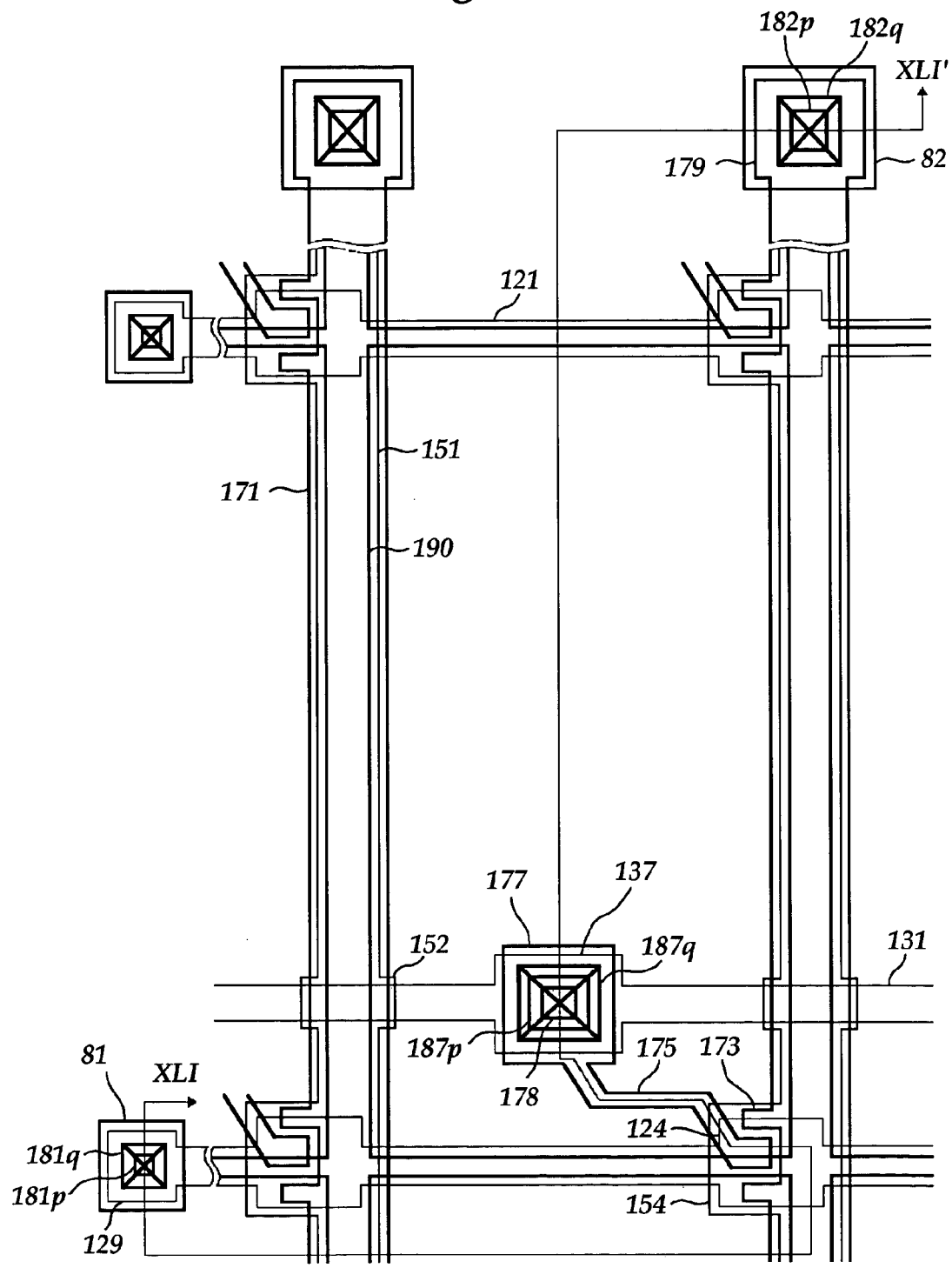
FIG. 40 is a layout view of a TFT array panel for an LCD according to another embodiment of the present invention.
Figure 41:
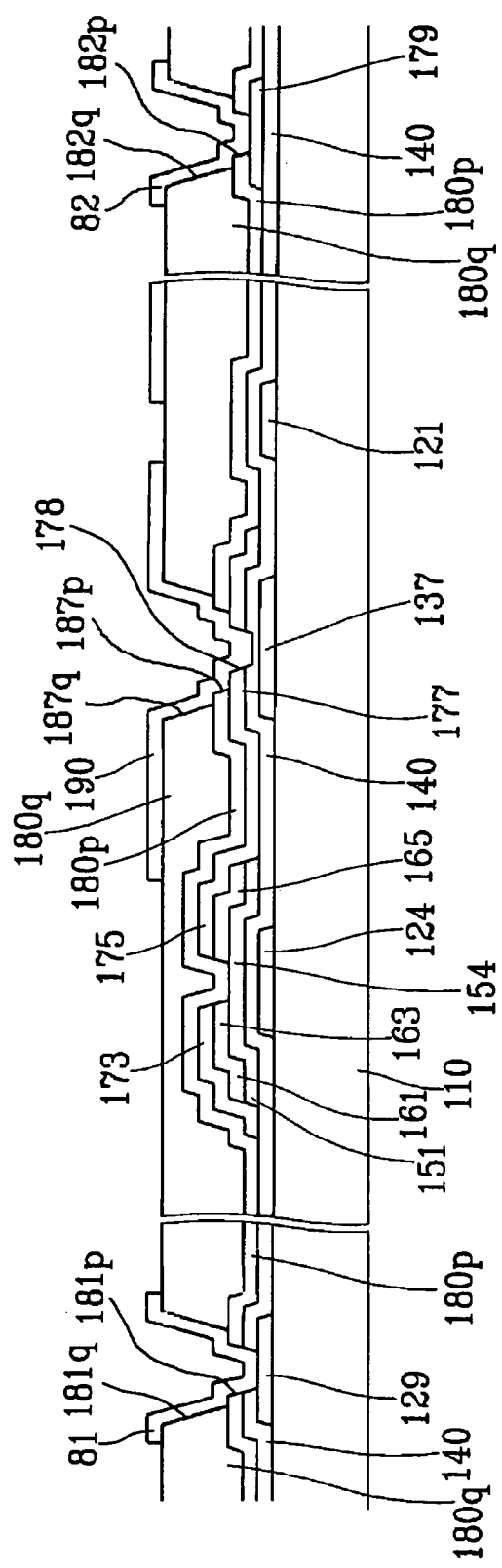
FIG. 41 is a sectional view of an LCD including the TFT array panel shown in FIG. 40 taken along the line XLI–XLI'.

FIG. 40 is a layout view of a TFT array panel for an LCD according to another embodiment of the present invention, and FIG. 41 is a sectional view of an LCD including the TFT array panel shown in FIG. 40 taken along the line XLI–XLI'.

Referring to FIGS. 40 and 41, a TFT array panel according to this embodiment has a layered structure almost the same as those shown in FIGS. 30 and 31. In detail, a plurality of gate lines 121 including a plurality of gate electrodes 124 and a plurality of storage electrode lines 131 including a plurality of expansions 137 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 including expansions 177 are formed on the ohmic contacts 161 and 165, and lower and upper passivation layers 180p and 180q are formed thereon. A plurality of contact holes 181p, 181q, 182p, 182q, 187p and 187q are provided at the passivation layers 180p and 180q and the gate insulating layer 140, and a plurality of pixel electrodes 190 and a plurality of contact assistants 81 and 82 are formed on the upper passivation layer 180q.

Different from the TFT array panel shown in FIGS. 30 and 31, the expansions 177 of the drain electrodes 175 have openings 178 have openings 178 exposing portions of the gate insulating layer 140, and the exposed portions of the gate insulating layer 140 have thickness smaller than other portions of the gate insulating layer 140 as shown in FIG. 41. Accordingly, the distance between the expansions 137 and the pixel electrodes 190 is decreased such that the storage capacitance therebetween is increased without scarifying the aperture ratio. In addition, the aperture ratio can be increased by further thinning the gate insulating layer 140 and by decreasing the sizes of the expansions 137 and 177.

Many of the above-described features of the TFT array panel for an LCD shown in FIGS. 1 and 2 may be appropriate to the TFT array panel shown in FIGS. 40 and 41.

A method of manufacturing the TFT array panel shown in FIGS. 40 and 41 according to an embodiment of the present invention will be now described in detail with reference to FIGS. 42–49 as well as FIGS. 40 and 41.

FIGS. 42, 44, 46 and 48 are layout views of the TFT array panel shown in FIGS. 40 and 41 in intermediate steps of a manufacturing method thereof according to an embodiment of the present invention, and FIGS. 43, 45, 47 and 49 are sectional views of the TFT array panel shown in FIGS. 42, 44, 46 and 48 taken along the lines XLIII–XLIII', XLV–XLV', XLVII–XLVII', and XLIX–XLIX', respectively.

Figure 42:
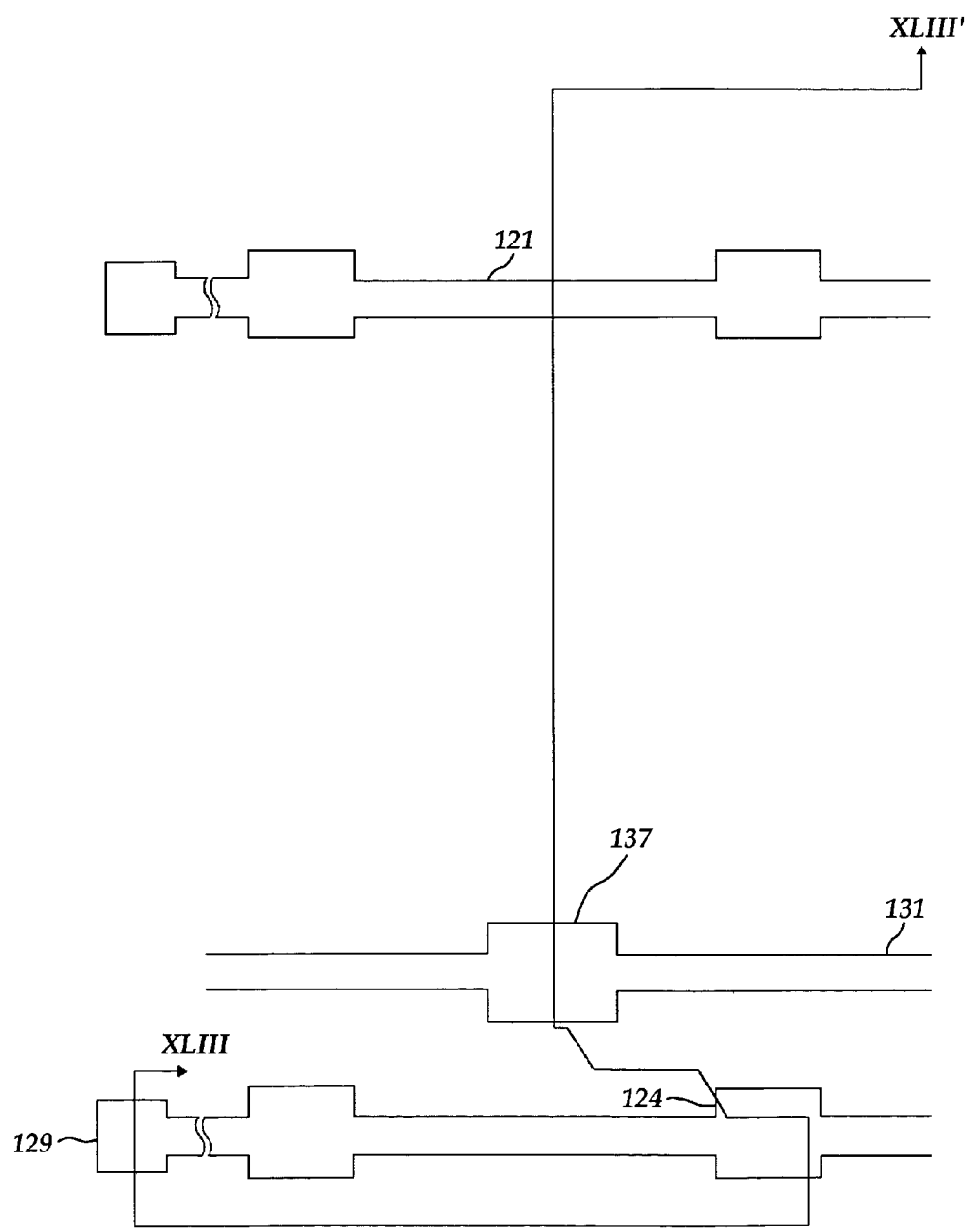
FIGS. 42, 44, 46 and 48 are layout views of the TFT array panel shown in FIGS. 40 and 41 in intermediate steps of a manufacturing method thereof according to an embodiment of the present invention.
Figure 43:
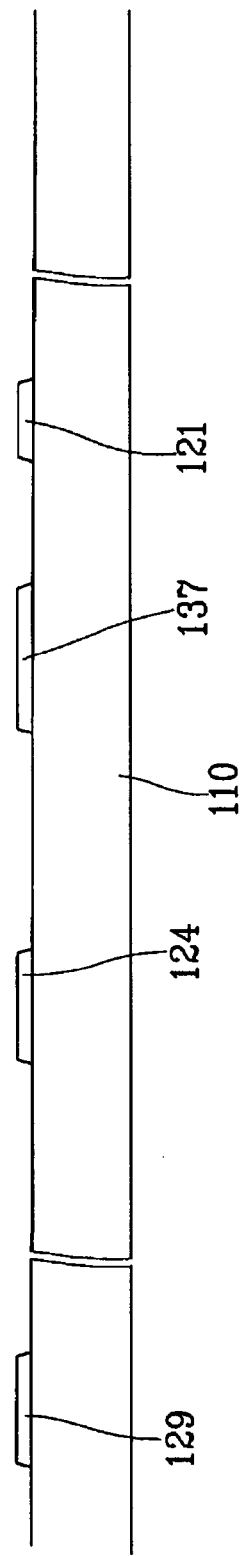
FIGS. 43, 45, 47 and 49 are sectional views of the TFT array panel shown in FIGS. 42, 44, 46 and 48 taken along the lines XLIII–XLIII', XLV–XLV', XLVII–XLVII', and XLIX–XLIX', respectively.

Referring to FIGS. 42 and 43, conductive film(s) preferably made of Cr, Mo, Al, Ag, and alloys thereof is sputtered on an insulating substrate 110 such as transparent glass. The conductive film is patterned by photo-etching with dry etch or wet etch to form a plurality of gate lines 121 including a plurality of gate electrodes 124 and a plurality of storage electrode lines 131 including a plurality of expansions 137. The edge profiles of the gate lines 121 and the storage electrode lines 131 are tapered for good attachment of overlying layers.

Figure 44:
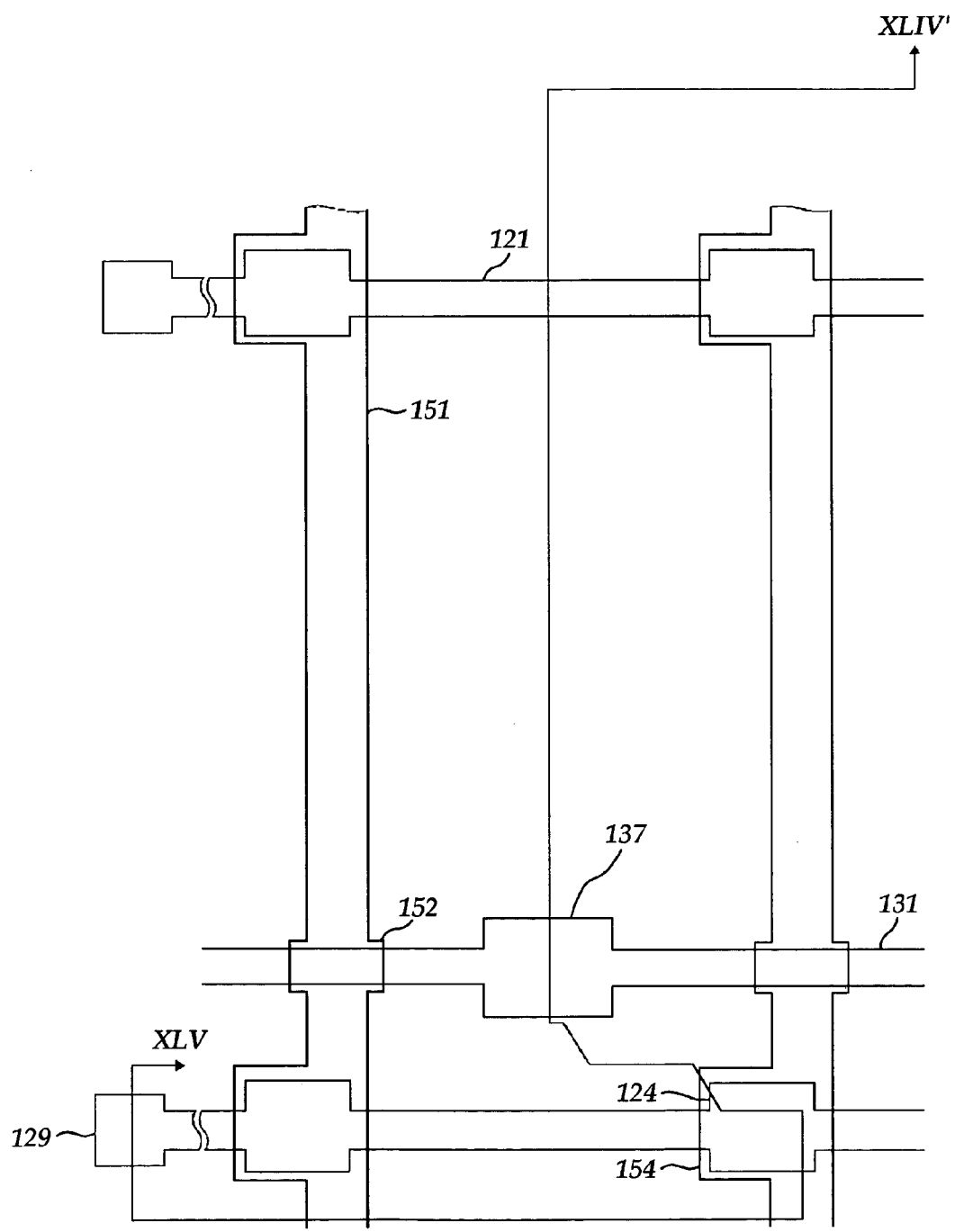
Figure 45:
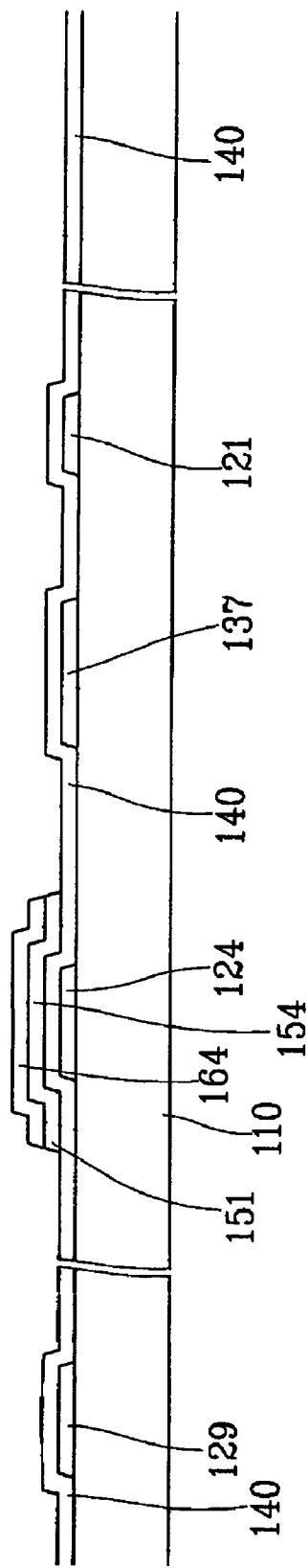

Referring to FIGS. 44 and 45, after sequential deposition of a gate insulating layer 140 preferably made of silicon nitride or silicon oxide, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

Figure 46:
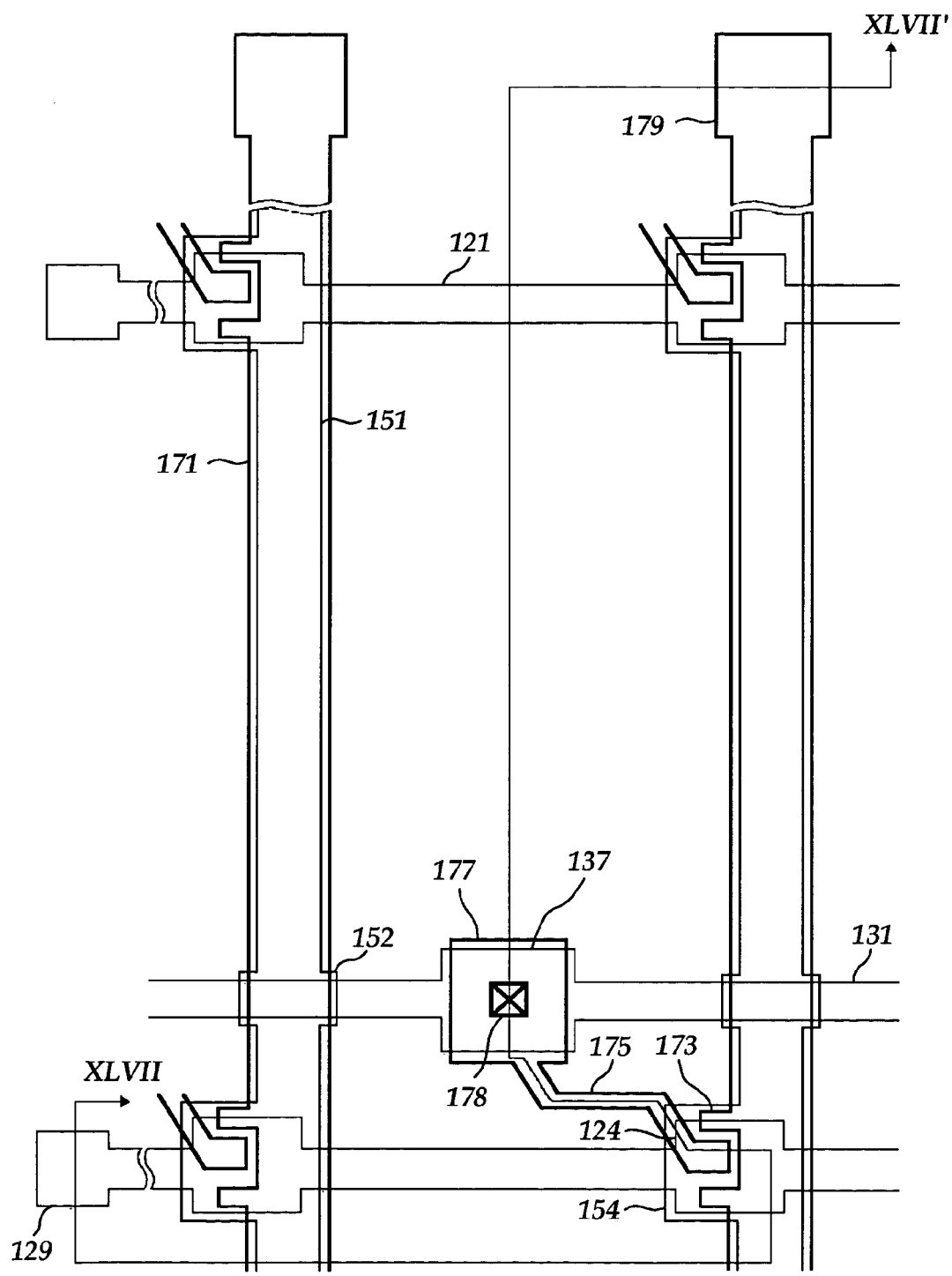
Figure 47:
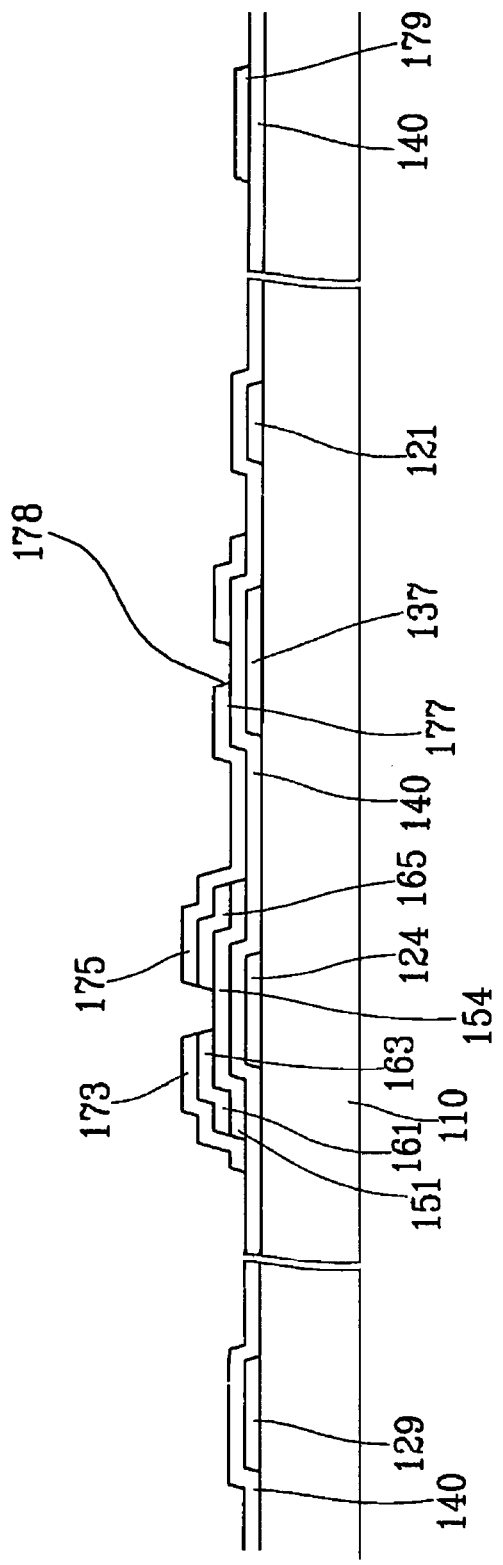

Referring to FIGS. 46 and 47, a conductive layer is sputtered and photo-etched to form a plurality of data lines 171 including a plurality of source electrodes 173 and a plurality of drain electrodes 175 including expansions 177. The expansions 177 have openings 178 to expose the gate insulating layer. Thereafter, portions of the extrinsic semiconductor stripes 164, which are not covered with the data lines 171 and the drain electrodes 175, are removed by etch to complete a plurality of ohmic contact stripes 161 including a plurality of projections 163 and a plurality of ohmic contact islands 165 and to expose portions of the intrinsic semiconductor stripes 151.

Figure 48:
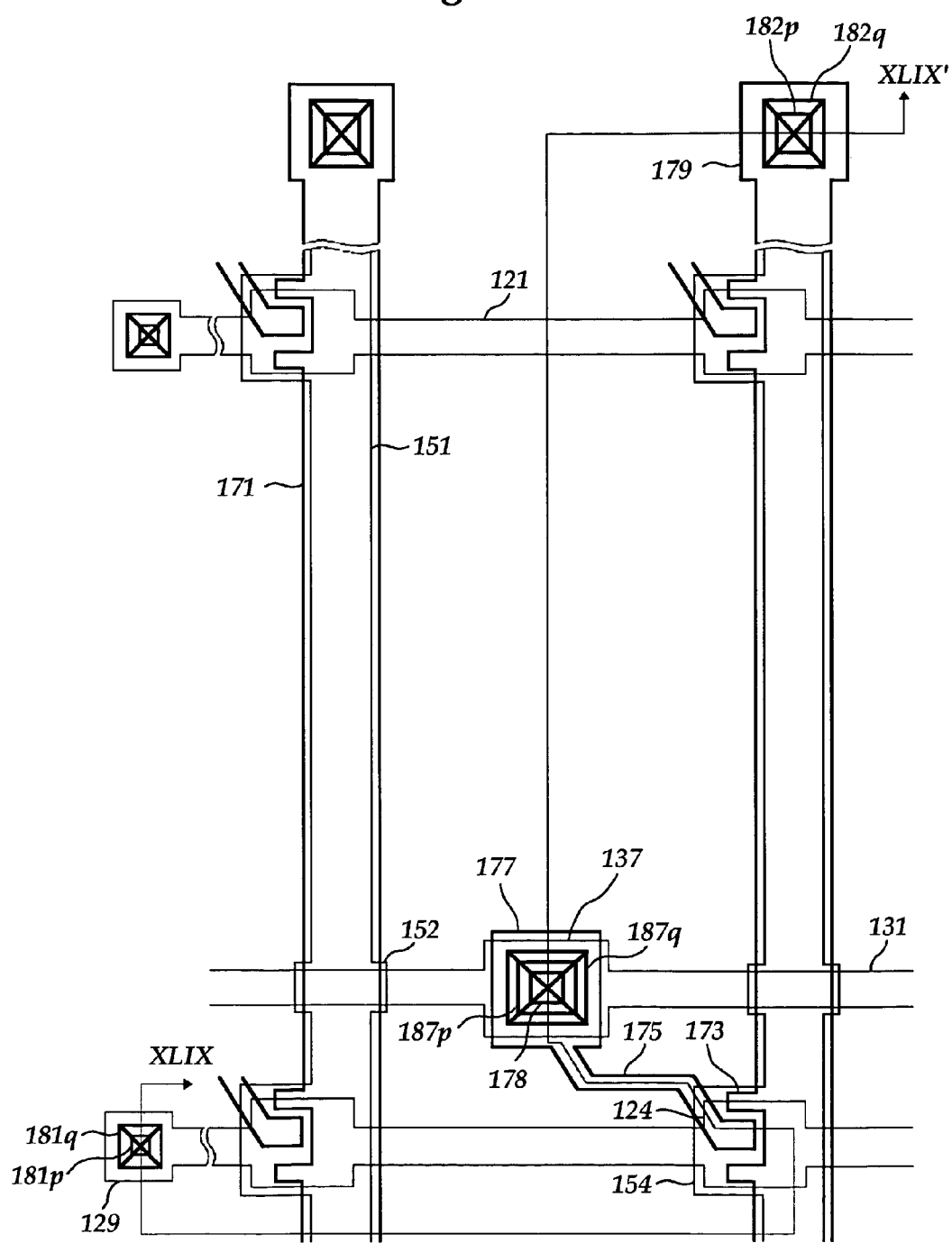
Figure 49:
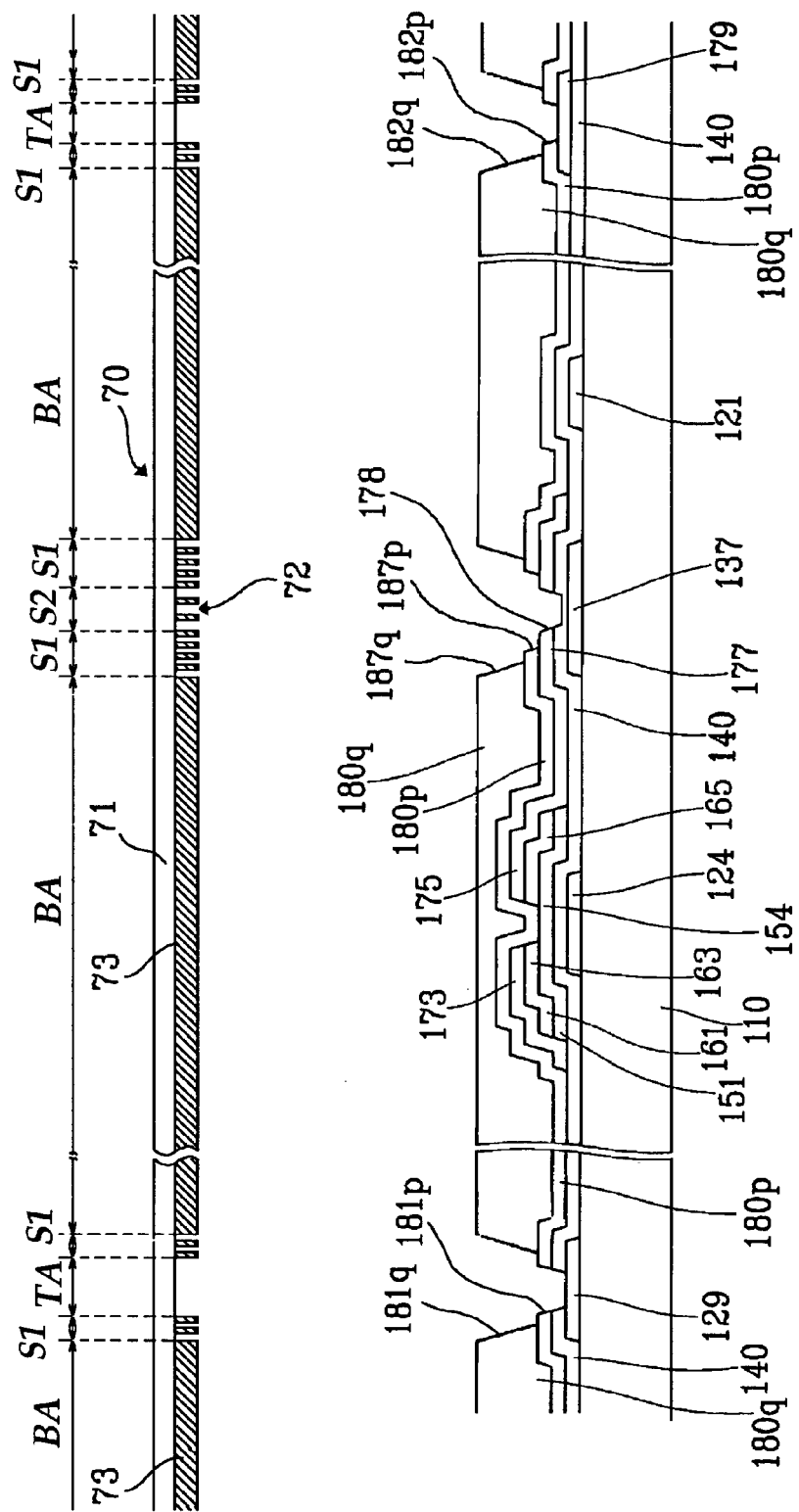

Referring to FIGS. 48 and 49, a lower passivation layer 180p preferably made of silicon nitride or silicon oxide and an upper passivation layer 180q preferably made of photosensitive organic insulator are deposited and etched along with the gate insulating layer 140 to form a plurality of contact holes 181p, 181q, 182p, 182q, 187p and 187q exposing the end portions 129 of the gate lines 121, the end portions 179 of the data lines 171, and the expansions of the drain electrodes 175.

In detail, the passivation layers 180p and 180q are deposited and a photoresist (not shown) is coated on the upper passivation layer 180q. A photo mask 70 having a plurality of light transmitting areas TA, a plurality of first and second slit areas S1 and S2, and a plurality of light blocking areas BA is aligned with the substrate 110 as shown in FIG. 49. The photo mask 70 includes a transparent substrate 71 and a plurality of opaque members 73, and the first and the second slit areas S1 and S2 have a plurality of slits 72. The first and the second slit areas S1 and S2 have different slit arrangements to give different light transmittances. For example, the distance between the slits 72 in the second slit area S2 is shorter than that in the first slit area S1, or the slits 72 in the second slit area S2 is wider than those in the first slit area S1 such that the second slit areas S2 give high light transmittance. The light transmitting areas TA face the contact holes 181p and 181q, the second slit areas S2 face the contact holes 187p, and the first slit areas S1 surrounds the light transmitting areas and the second slit areas S2, and the light blocking areas BA face the remaining areas of the TFT array panel. The photoresist is exposed to light thorough the photo mask 60 and developed to have a position-dependent thickness. That is, the portions of the photoresist facing the second slit areas S2, those facing the first slit areas S1, and those facing the light blocking areas BA have increasing thickness. Appropriate etches can make the exposed portions of the gate insulating layer 140 through the openings 178 to have a thickness smaller than other portions.

Finally, as shown in FIGS. 40 and 41, a plurality of pixel electrodes 190 and a plurality of contact assistants 81 and 82 are formed on the upper passivation layer 180q by sputtering and photo-etching an ITO or IZO layer.

The contact structures shown in FIGS. 30–49 can also be applied to the TFT array panels shown in FIGS. 26–29.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
   a gate line formed on a substrate;
   a gate insulating layer formed on the gate line;
   a semiconductor layer formed on the gate insulating layer;
   a data line formed at least on the semiconductor layer;
   a drain electrode formed at least on the semiconductor layer and spaced apart from the data line;
   a first passivation layer formed on the data line and the drain electrode and having a first contact hole exposing the drain electrode at least in part;
   a second passivation layer formed on the first passivation layer and having a second contact hole that is disposed on the first contact hole and has a first bottom edge placed outside the first contact hole and a second bottom edge placed inside the first contact hole; and
   a pixel electrode formed on the second passivation layer and connected to the drain electrode through the first and the second contact holes.

2. The thin film transistor array panel of claim 1, wherein the second contact hole has an inclined sidewall to have top edges wider than the bottom edges.

3. The thin film transistor array panel of claim 1, wherein the second passivation layer comprises organic material.

4. The thin film transistor array panel of claim 1, wherein the drain electrode comprises an expansion and a connection connected to the expansion, and the second bottom edge of the second contact hole is disposed opposite the connection.

5. The thin film transistor array panel of claim 4, further comprising a storage electrode line overlapping the drain electrode.

6. The thin film transistor array panel of claim 5, wherein the storage electrode line comprises an expansion overlapping the expansion of the drain electrode.

7. The thin film transistor array panel of claim 6, wherein the storage electrode line extends in a direction crossing the first bottom edge of the second contact hole.

8. The thin film transistor array panel of claim 1, wherein the second contact hole further has a third bottom edge placed inside the first contact hole.

9. The thin film transistor array panel of claim 8, wherein the second and the third bottom edges are located adjacent to each other.

10. The thin film transistor array panel of claim 8, wherein the second and the third bottom edges are located opposite each other.

11. The thin film transistor array panel of claim 8, wherein the second contact hole further has a fourth bottom edge placed inside the first contact hole.

12. The thin film transistor array panel of claim 1, wherein the second contact hole has a rounded or chamfered corner.

13. The thin film transistor array panel of claim 1, wherein the semiconductor layer has substantially the same planar shape as the data line and the drain electrode except for a portion disposed between the data line and the drain electrode.

14. The thin film transistor array panel of claim 1, further comprising a color filter disposed between the first passivation layer and the second passivation layer.

15. The thin film transistor array panel of claim 14, wherein the color filter has no portion of the second contact hole.

16. A thin film transistor array panel comprising:
a gate line formed on a substrate;
a gate insulating layer formed on the gate line;
a semiconductor layer formed on the gate insulating layer;
a data line formed at least on the semiconductor layer;
a drain electrode formed at least on the semiconductor layer and spaced apart from the data line;
a first passivation layer formed on the data line and the drain electrode and having a first contact hole exposing the drain electrode at least in part;
a second passivation layer formed on the first passivation layer and having a second contact hole that is disposed on the first contact hole and has a first sidewall having a first slope and a second sidewall having a second slope slop steeper than the first slope; and
a pixel electrode formed on the second passivation layer and connected to the drain electrode through the first and the second contact holes.

17. The thin film transistor array panel of claim 16, wherein the second passivation layer comprises organic material.

18. The thin film transistor array panel of claim 16, wherein the drain electrode comprises an expansion and a connection connected to the expansion, and the second sidewall of the second contact hole is disposed opposite the connection.

19. The thin film transistor array panel of claim 16, wherein the first passivation layer is undercut at the second sidewall of the second contact hole.

20. A thin film transistor array panel comprising:
a gate line formed on a substrate;
a gate insulating layer formed on the gate line;
a semiconductor layer formed on the gate insulating layer;
a data line formed at least on the semiconductor layer;
a drain electrode formed at least on the semiconductor layer and spaced apart from the data line;
a first passivation layer formed on the data line and the drain electrode and having a first contact hole exposing the drain electrode at least in part;
a second passivation layer formed on the first passivation layer and having a second contact hole that is disposed on the first contact hole and has a first sidewall having a stepped profile and a second sidewall having an undercut; and
a pixel electrode formed on the second passivation layer and connected to the drain electrode through the first and the second contact holes.

21. A thin film transistor array panel comprising:
a gate line formed on a substrate;
a storage electrode formed on the substrate;
a gate insulating layer including a first portion disposed on the gate line and a second portion formed on the storage electrode and having a thickness smaller than the first portion;
a semiconductor layer formed on the gate insulating layer;
a data line formed at least on the semiconductor layer;
a drain electrode formed at least on the semiconductor layer and spaced apart from the data line;
first and second passivation layers sequentially formed on the data line and the drain electrode; and
a pixel electrode formed on the second passivation layer, connected to the drain electrode, and overlapping the storage electrode.

22. The thin film transistor array panel of claim 21, wherein the drain electrode overlaps the storage electrode.

23. The thin film transistor array panel of claim 22, wherein the drain electrode includes an expansion overlapping the storage electrode.

24. The thin film transistor array panel of claim 21, wherein the first and the second passivation layers have a contact hole exposing the drain electrode and the pixel electrode is connected to the drain electrode through the contact hole.

25. The thin film transistor array panel of claim 22, wherein the contact hole has a stepped sidewall.

26. The thin film transistor array panel of claim 22, wherein the drain electrode overlaps the storage electrode and the contact hole is disposed on the storage electrode.

27. The thin film transistor array panel of claim 26, wherein the drain electrode has an opening exposing the second portion of the gate insulating layer and the pixel electrode contacts the second portion of the gate insulating layer through the opening.

28. The thin film transistor array panel of claim 21, wherein the first passivation layer comprises inorganic insulator and the second passivation layer comprises organic insulator.

* * * * *